United States Patent
Nakamura et al.

(10) Patent No.: US 9,450,133 B2
(45) Date of Patent: Sep. 20, 2016

(54) PHOTOSENSOR AND DISPLAY DEVICE

(75) Inventors: Yasuo Nakamura, Machida (JP); Yoshifumi Tanada, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 553 days.

(21) Appl. No.: 12/624,666

(22) Filed: Nov. 24, 2009

(65) Prior Publication Data

US 2010/0134735 A1 Jun. 3, 2010

(30) Foreign Application Priority Data

Nov. 28, 2008 (JP) ................................ 2008-303487

(51) Int. Cl.
  *G02F 1/133* (2006.01)
  *H01L 31/105* (2006.01)
  *H01L 27/12* (2006.01)
  *H01L 27/32* (2006.01)

(52) U.S. Cl.
  CPC . *H01L 31/1055* (2013.01); *G02F 2001/13312* (2013.01); *H01L 27/1225* (2013.01); *H01L 27/323* (2013.01); *H01L 27/3234* (2013.01)

(58) Field of Classification Search
  CPC ................. G02F 1/13318; G02F 2001/13312
  See application file for complete search history.

(56) References Cited

U.S. PATENT DOCUMENTS

| | | |
|---|---|---|
| 5,585,951 A | 12/1996 | Noda et al. |
| 5,731,856 A | 3/1998 | Kim et al. |
| 5,744,864 A | 4/1998 | Cillessen et al. |
| 5,847,410 A | 12/1998 | Nakajima |
| 6,118,505 A | 9/2000 | Nagata et al. |
| 6,294,274 B1 | 9/2001 | Kawazoe et al. |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,747,638 B2 | 6/2004 | Yamazaki et al. |

(Continued)

FOREIGN PATENT DOCUMENTS

| | | |
|---|---|---|
| CN | 1319831 | 10/2001 |
| CN | 1674229 | 9/2005 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Jessica M Merlin
(74) *Attorney, Agent, or Firm* — Eric J. Robinson; Robinson Intellectual Property Law Office, P.C.

(57) ABSTRACT

Thin film transistors including an oxide semiconductor containing indium, gallium, and zinc are easily arranged in a matrix over a large substrate and have small characteristic variations. With amplifier circuits and driver circuits of display elements which include the thin film transistors including an oxide semiconductor containing indium, gallium, and zinc with small characteristic variations, intensity distribution of light received by the photodiodes arranged in a matrix is converted into electrical signals with high reproducibility and output, and the display elements arranged in a matrix can be uniformly driven.

23 Claims, 19 Drawing Sheets

(56) References Cited

U.S. PATENT DOCUMENTS

| | | | |
|---|---|---|---|
| 6,960,812 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,224,391 B2 | 5/2007 | Kimura | |
| 7,282,782 B2 | 10/2007 | Hoffman et al. | |
| 7,297,977 B2 | 11/2007 | Hoffman et al. | |
| 7,301,211 B2 | 11/2007 | Yamazaki et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,525,523 B2 | 4/2009 | Yamazaki et al. | |
| 7,626,156 B2 | 12/2009 | Tada et al. | |
| 7,674,650 B2 | 3/2010 | Akimoto et al. | |
| 7,732,819 B2 | 6/2010 | Akimoto et al. | |
| 7,745,798 B2 | 6/2010 | Takahashi | |
| 7,884,360 B2 | 2/2011 | Takechi et al. | |
| 7,998,372 B2 | 8/2011 | Yano et al. | |
| 8,053,816 B2 | 11/2011 | Arao et al. | |
| 8,158,974 B2 | 4/2012 | Yano et al. | |
| 8,415,664 B2 | 4/2013 | Arao et al. | |
| 8,420,442 B2 | 4/2013 | Takechi et al. | |
| 8,456,459 B2 | 6/2013 | Yamazaki et al. | |
| 8,779,419 B2 | 7/2014 | Yano et al. | |
| 8,889,480 B2 | 11/2014 | Takechi et al. | |
| 8,900,970 B2 | 12/2014 | Maruyama et al. | |
| 2001/0046027 A1 | 11/2001 | Tai et al. | |
| 2002/0011972 A1* | 1/2002 | Yamazaki et al. | 345/74.1 |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0215077 A1 | 9/2005 | Takeda et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0187367 A1* | 8/2006 | Abileah et al. | 349/37 |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0069209 A1* | 3/2007 | Jeong et al. | 257/57 |
| 2007/0072439 A1* | 3/2007 | Akimoto et al. | 438/795 |
| 2007/0090365 A1 | 4/2007 | Hayashi et al. | |
| 2007/0108446 A1 | 5/2007 | Akimoto | |
| 2007/0115219 A1 | 5/2007 | Inoue | |
| 2007/0146592 A1* | 6/2007 | Kimura | 349/114 |
| 2007/0152217 A1* | 7/2007 | Lai et al. | 257/59 |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0210344 A1* | 9/2007 | Arao et al. | 257/232 |
| 2007/0252928 A1 | 11/2007 | Ito et al. | |
| 2007/0268389 A1 | 11/2007 | Kimura | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0203387 A1 | 8/2008 | Kang et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296567 A1 | 12/2008 | Irving et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0076322 A1 | 3/2009 | Matsunaga et al. | |
| 2009/0114910 A1 | 5/2009 | Chang | |
| 2009/0134399 A1 | 5/2009 | Sakakura et al. | |
| 2009/0140243 A1* | 6/2009 | Kim et al. | 257/43 |
| 2009/0152506 A1 | 6/2009 | Umeda et al. | |
| 2009/0152541 A1 | 6/2009 | Maekawa et al. | |
| 2009/0186437 A1 | 7/2009 | Akimoto | |
| 2009/0186445 A1 | 7/2009 | Akimoto | |
| 2009/0189155 A1 | 7/2009 | Akimoto | |
| 2009/0189156 A1 | 7/2009 | Akimoto | |
| 2009/0237000 A1 | 9/2009 | Inoue | |
| 2009/0278122 A1 | 11/2009 | Hosono et al. | |
| 2009/0280600 A1 | 11/2009 | Hosono et al. | |
| 2010/0025678 A1 | 2/2010 | Yamazaki et al. | |
| 2010/0092800 A1 | 4/2010 | Itagaki et al. | |
| 2010/0109002 A1 | 5/2010 | Itagaki et al. | |
| 2010/0117999 A1 | 5/2010 | Matsunaga et al. | |
| 2015/0056747 A1 | 2/2015 | Takechi et al. | |

FOREIGN PATENT DOCUMENTS

| | | | |
|---|---|---|---|
| CN | 101034723 | 9/2007 | |
| EP | 0603866 A | 6/1994 | |
| EP | 1122792 A | 8/2001 | |
| EP | 1737044 A | 12/2006 | |
| EP | 2226847 A | 9/2010 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 03-231472 A | 10/1991 | |
| JP | 05-251705 A | 9/1993 | |
| JP | 06-242433 A | 9/1994 | |
| JP | 07263698 A | * 10/1995 | H01L 29/786 |
| JP | 08-264794 | 10/1996 | |

(56) References Cited

FOREIGN PATENT DOCUMENTS

| | | |
|---|---|---|
| JP | 08-264794 A | 10/1996 |
| JP | 10-206888 A | 8/1998 |
| JP | 11-505377 | 5/1999 |
| JP | 2000-044236 A | 2/2000 |
| JP | 2000-150900 A | 5/2000 |
| JP | 2001-339640 | 12/2001 |
| JP | 2002-076356 A | 3/2002 |
| JP | 2002-289859 A | 10/2002 |
| JP | 2002-305297 A | 10/2002 |
| JP | 2003-086000 | 3/2003 |
| JP | 2003-086000 A | 3/2003 |
| JP | 2003-086808 A | 3/2003 |
| JP | 2003-167550 | 6/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2007-142195 A | 6/2007 |
| JP | 2007-150158 A | 6/2007 |
| JP | 2007-163467 A | 6/2007 |
| JP | 2007-250983 A | 9/2007 |
| JP | 2007-318105 A | 12/2007 |
| JP | 2008-042088 A | 2/2008 |
| JP | 4112184 | 7/2008 |
| JP | 2008-276212 A | 11/2008 |
| JP | 2009-071057 | 4/2009 |
| JP | 2009-089351 | 4/2009 |
| WO | WO-2004/114391 | 12/2004 |
| WO | WO-2007/119386 | 10/2007 |
| WO | WO-2008/117739 | 10/2008 |
| WO | WO-2008/126884 | 10/2008 |

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Dembo.H et al., "RFCPUs on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

(56) References Cited

OTHER PUBLICATIONS

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Osada.T et al., "15.2: Development of Driver-Integrated Panel using Amorphous In—Ga—Oxide TFT,", SID Digest '09 : SID International Symposium Digest of Technical Papers, May 31, 2009, pp. 184-187.
Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, pp. 899-902.
Kanno.H et al., "White Stacked Electrophosphorecent Organic Light-Emitting Device Employing $MoO_3$ as a Change-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Kurokawa.Y et al., "UHF RFCPUs on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by PEALD Grown ZnO TFT,", IMID '07 Digest, 2007, p. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H , "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "58.2 Invited Paper : SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, 2009, pp. 395-398.
Lee.H et al., "Current status of, Challenges to, and Perspective View of AM-OLED,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,$YbFe_2O_4$, and $Yb_2Fe_3O_7$ Types of Structures for Compounds in the $In_2O_3$ and $Sc_2O_3$-$A_2O_3$-BO Systems [A: Fe, Ga, or Al; B: Mg, Mn, Fe, Ni, Cu, or Zn] at Temperatures over 1000° C.,", Journal of Solid State Chemistry, 1985, vol. 65, pp. 382-384.
Kitzerow.H at al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Chinese Office Action (Application No. 200910246365.1) Dated May 6, 2013.

* cited by examiner

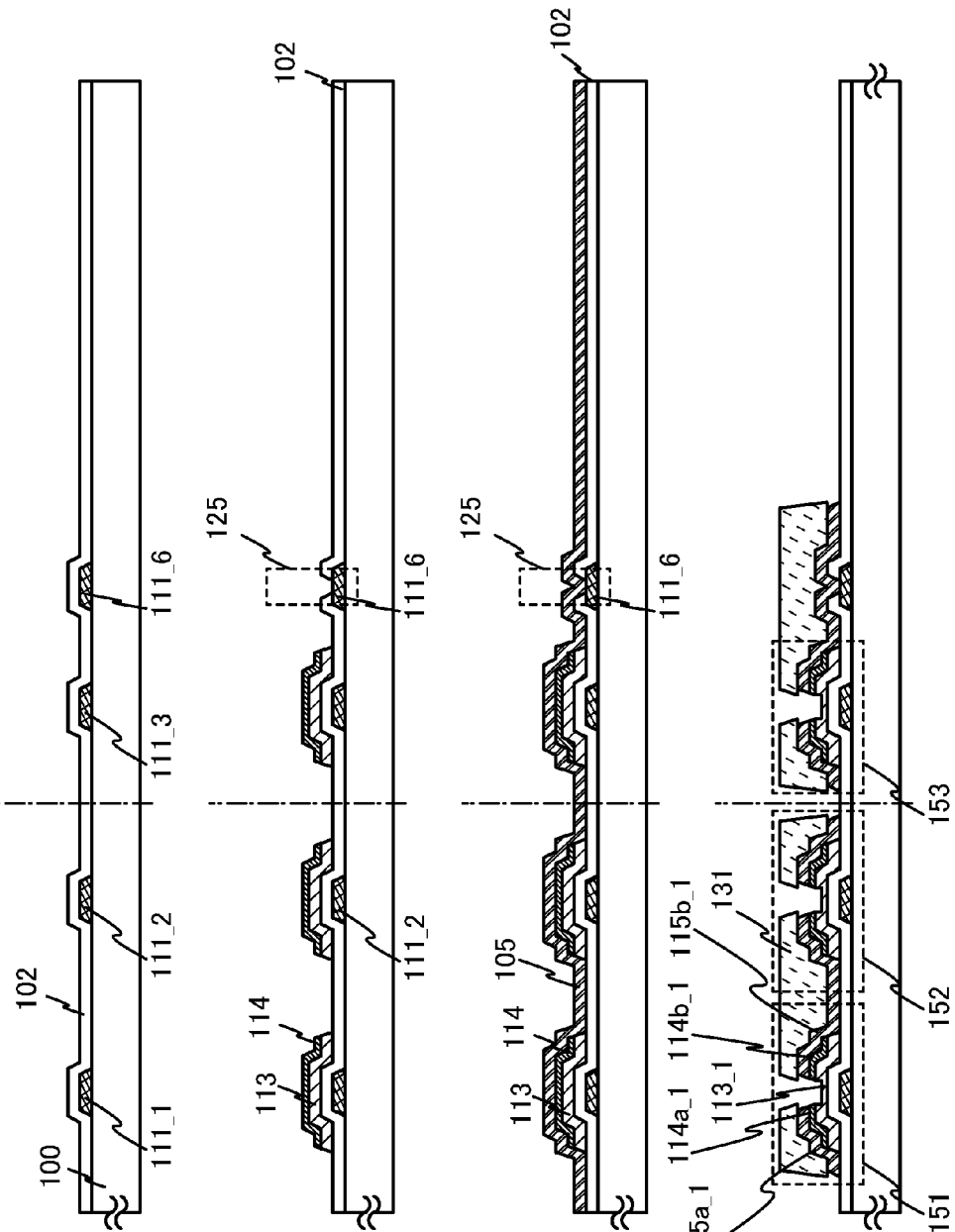

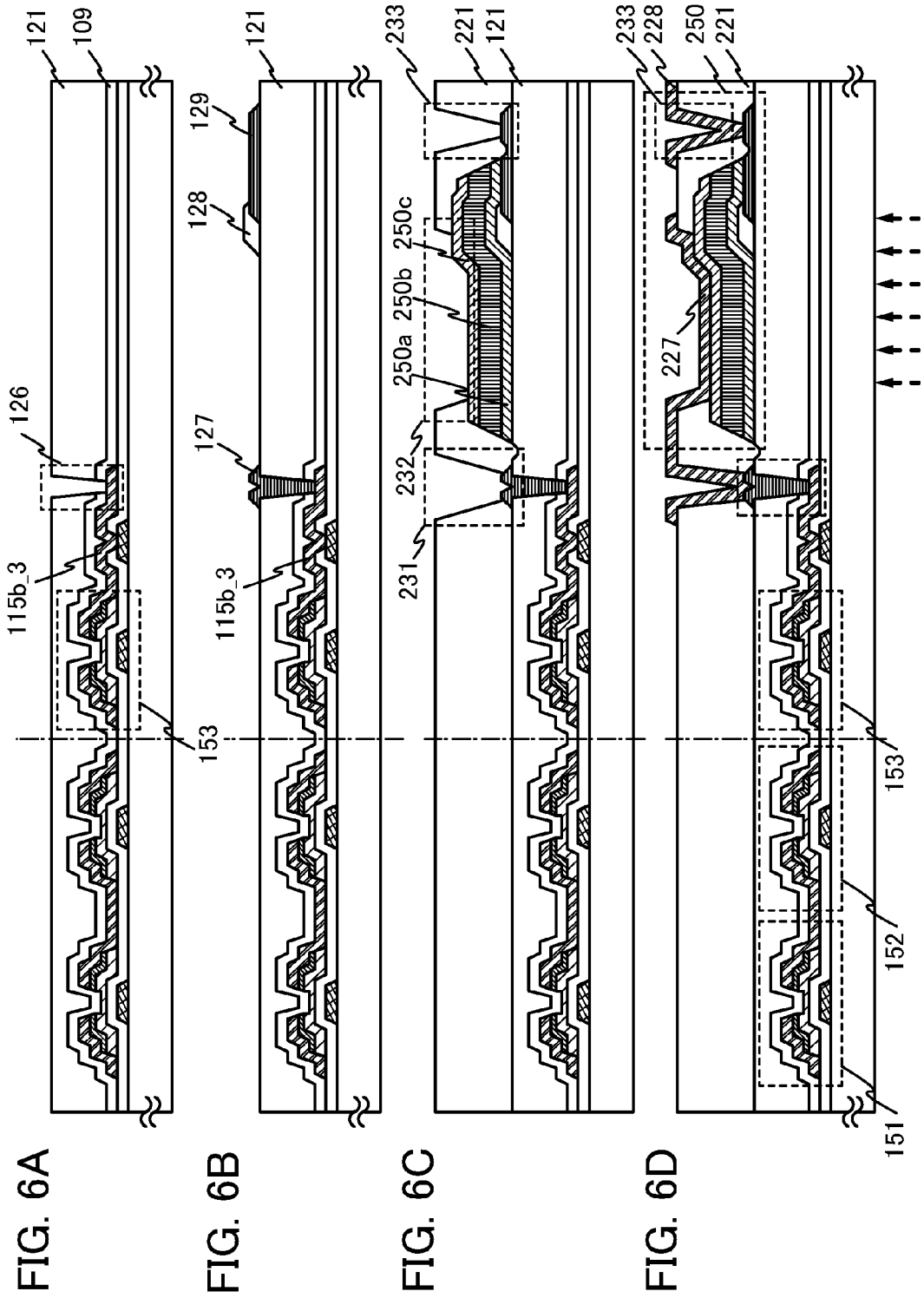

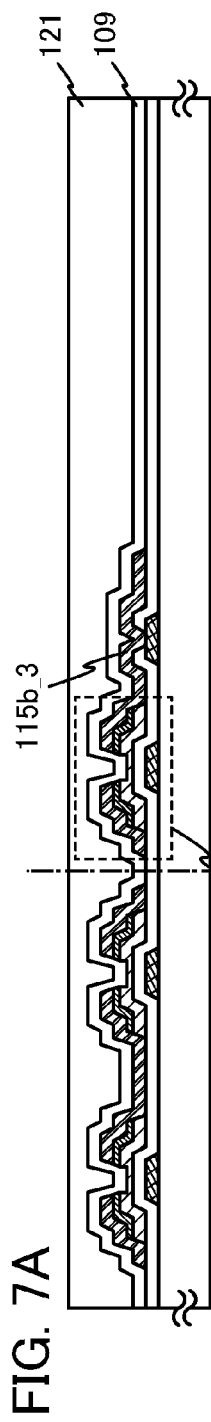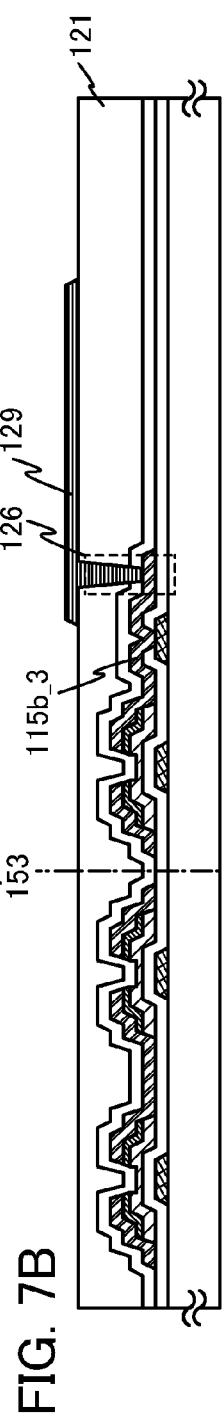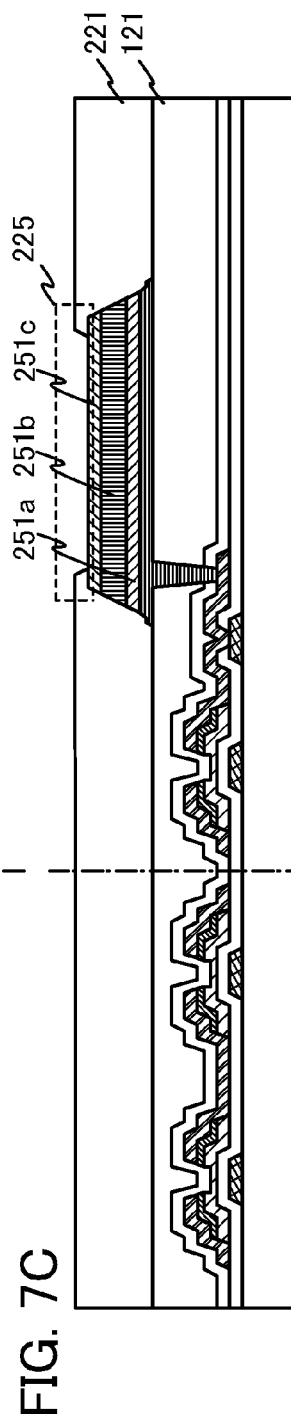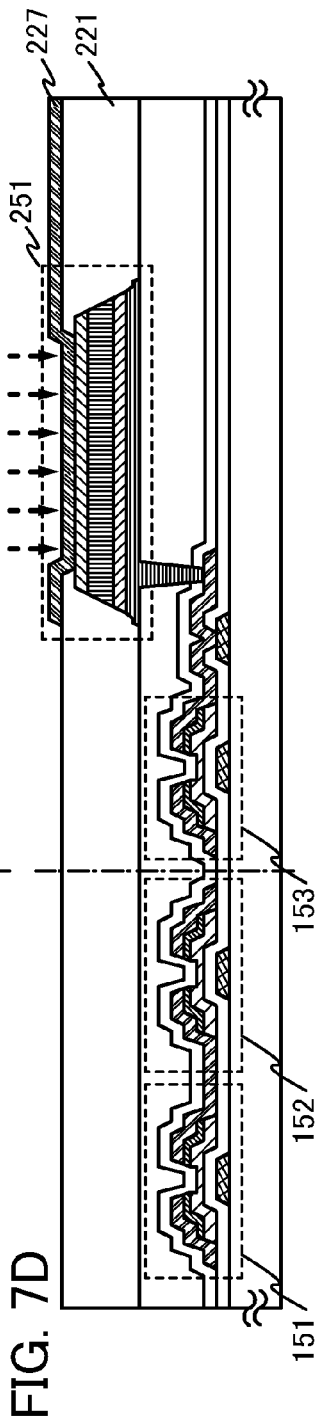

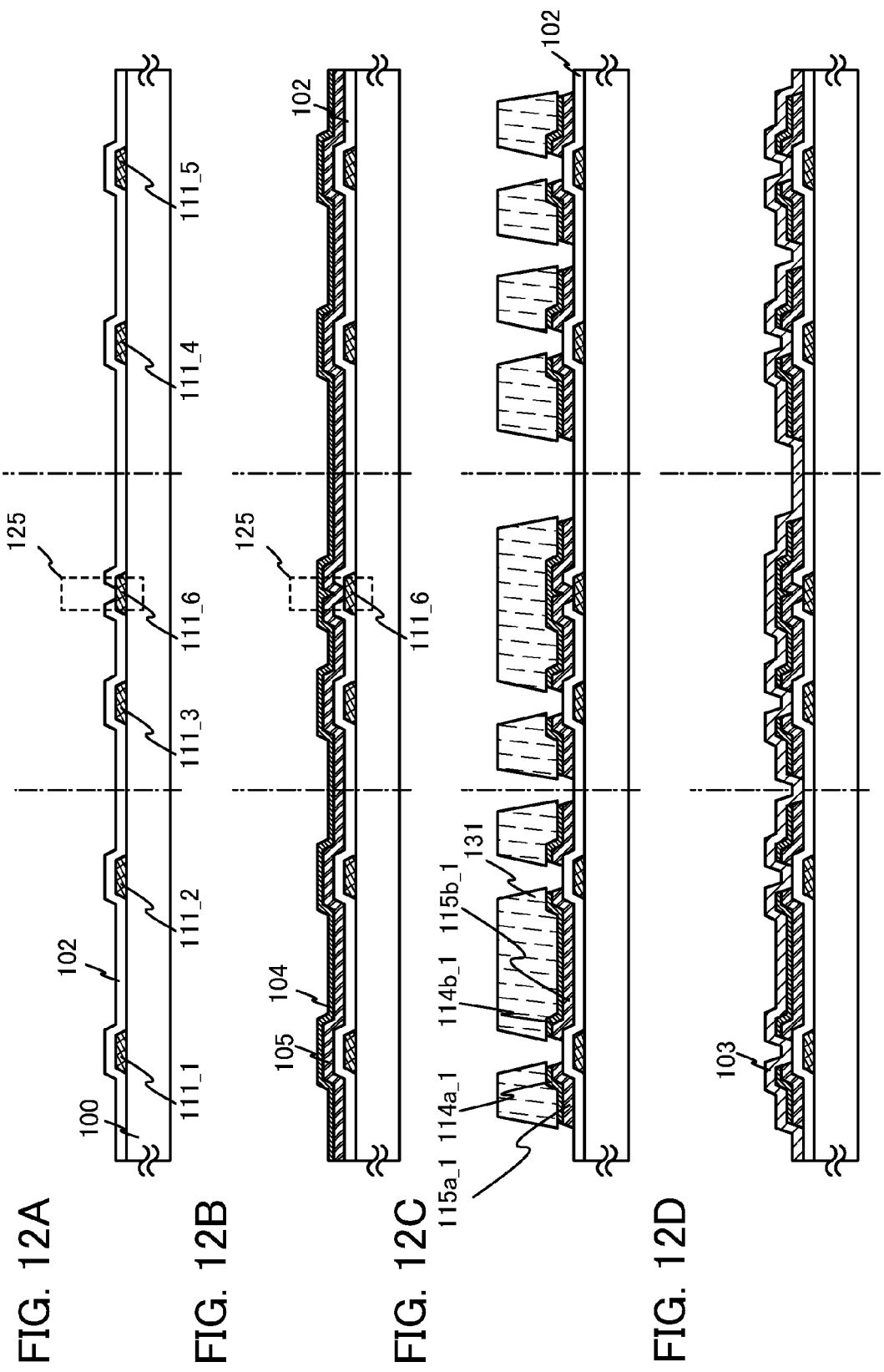

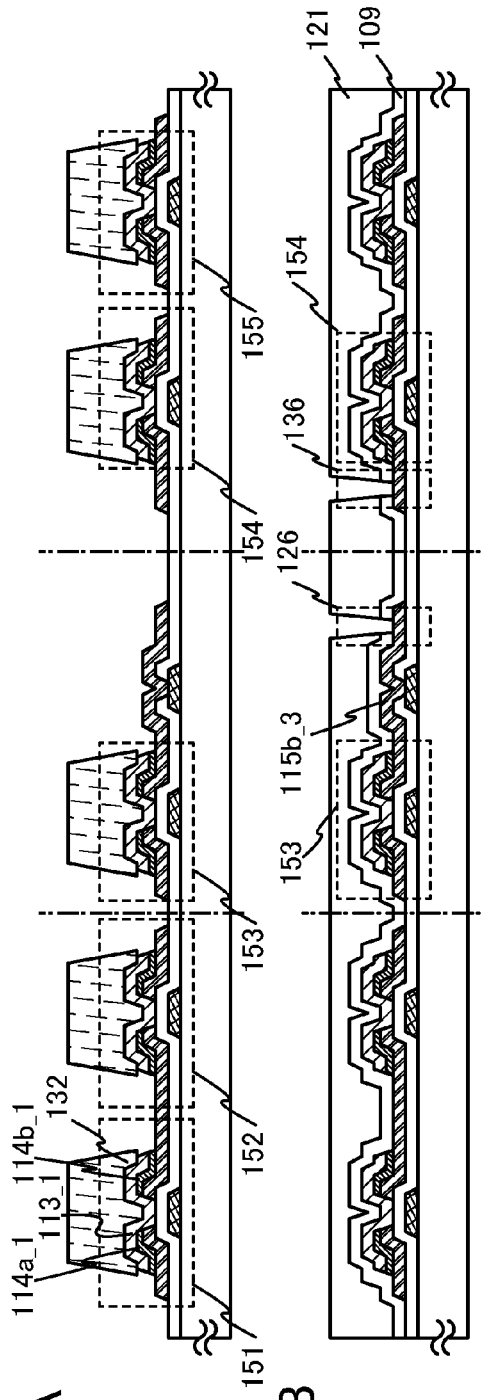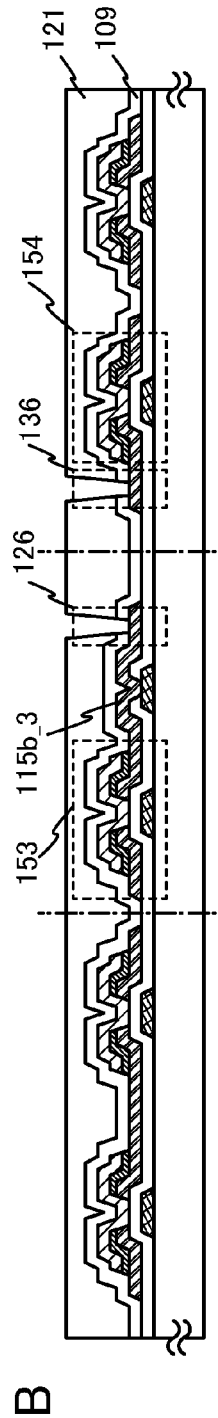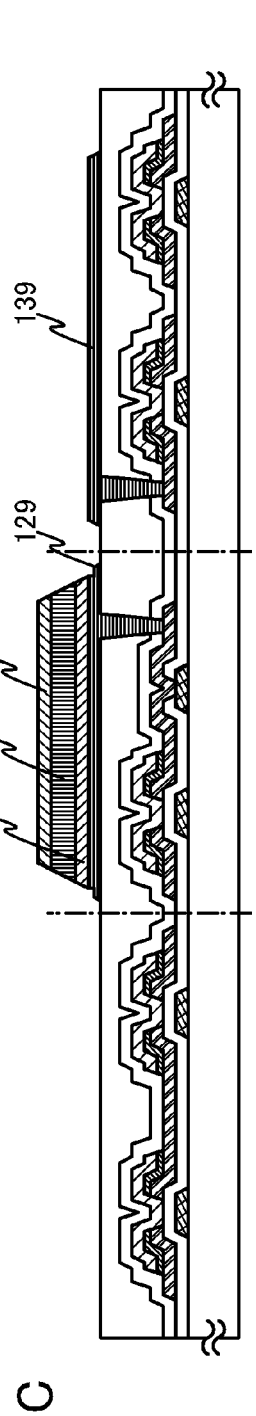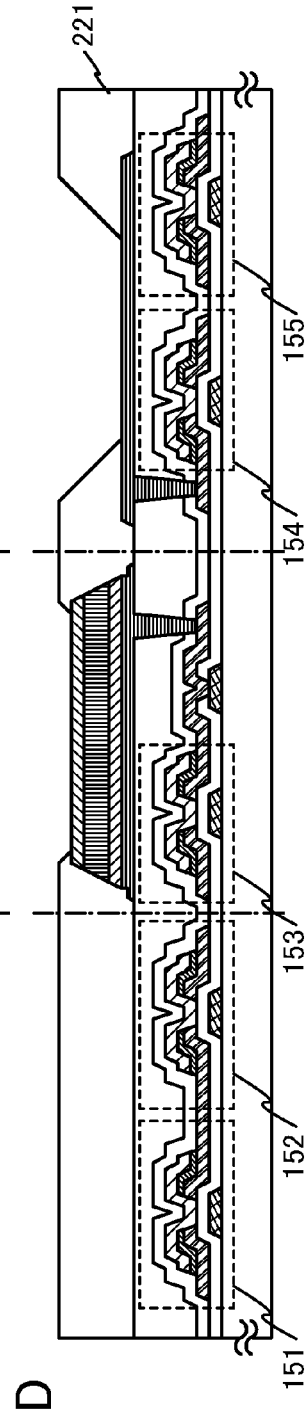
FIG. 13A
FIG. 13B
FIG. 13C
FIG. 13D

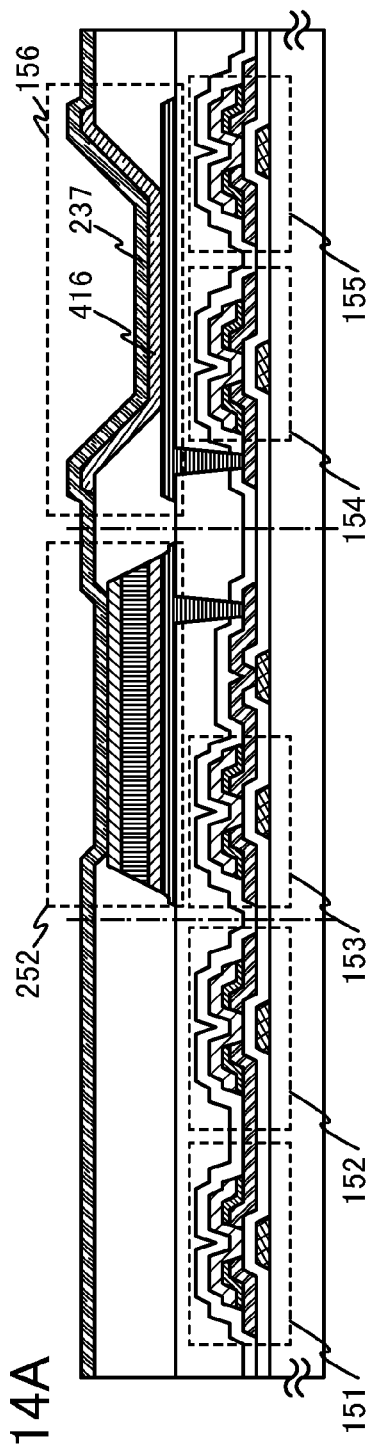
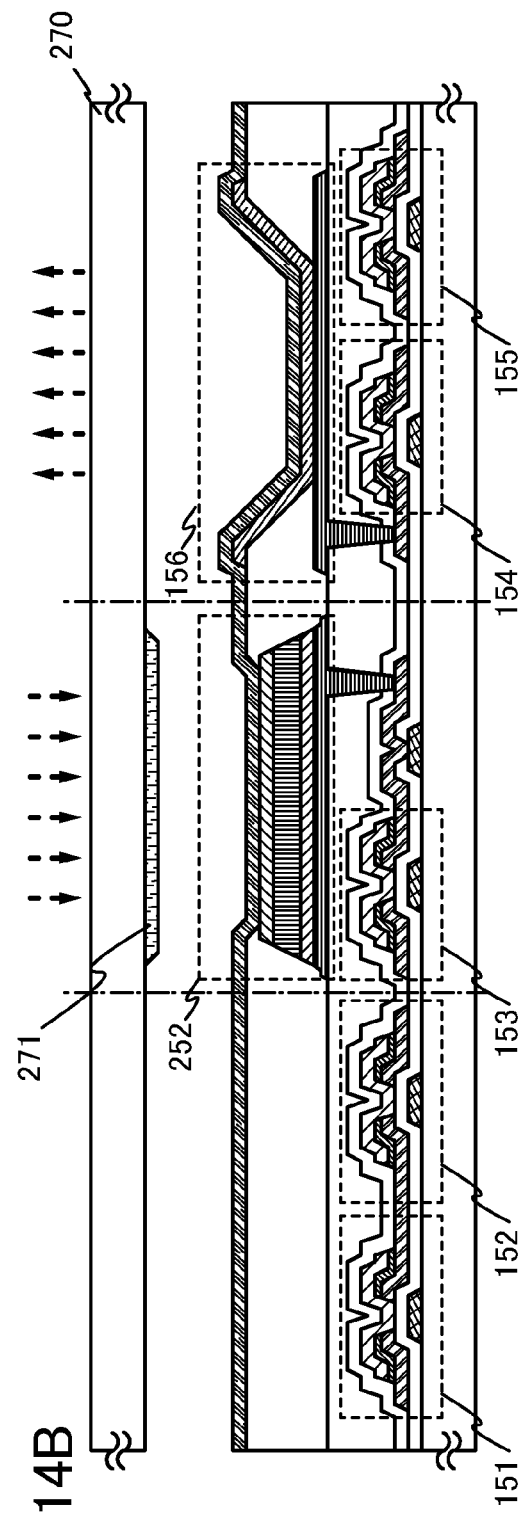
FIG. 14A
FIG. 14B

PHOTOSENSOR AND DISPLAY DEVICE

BACKGROUND OF THE INVENTION

1. Field of the Invention

The present invention relates to a photosensor. In particular, the present invention relates to a photosensor which include thin film transistors with high field-effect mobility and small characteristic variations and a photoelectric conversion element. Further, the present invention relates to a line sensor or an area sensor in which a plurality of pixels including the photosensor are arranged. Further, the present invention relates to a display device including the photosensor.

2. Description of the Related Art

In recent years, an image sensor including a photoelectric conversion element such as a diode, a CCD, and a CMOS which can read out an electrical signal having image information from an optical signal of image information or text or graphics on paper has been used.

A line sensor and an area sensor are image sensors including a plurality of photoelectric conversion elements. A line sensor includes a plurality of photoelectric conversion elements linearly arranged. An object is scanned with the sensor, whereby an image is taken as an electrical signal. An image scanner can exemplify an apparatus including the line sensor. On the other hand, an area sensor includes a plurality of photoelectric conversion elements arranged in a matrix. An image of an object is projected onto the sensor, whereby the image can be captured as an electrical signal. A video camera and a digital still camera can exemplify an apparatus including the area sensor. In the video camera and the digital still camera, an image of the object is reduced and projected onto the area sensor through an optical system and captured as an electrical signal. Besides, there is a contact area sensor which captures an image of an object such as paper or the like as an electrical signal when the paper or the like is placed in contact with the sensor.

Further, a semiconductor device in which an area sensor is incorporated in a display device so that a display region also serves as an input region has been proposed. A display device which has a function of capturing an image using an area sensor is disclosed in Patent Document 1 and Patent Document 2. Further, Patent Document 3 discloses a display device provided with a sensor for controlling the luminance of a light-emitting element.

The display device incorporating an area sensor can not only capture images but also be used as a so-called touch screen, which detects a pen or finger touching its display region in order to input information. The touch screen is easy to operate, allowing a user to feel as if he/she was operating the touch screen by directly touching a displayed image.

[Patent Document 1] Japanese Patent No. 4112184
[Patent Document 2] Japanese Published Patent Application No. 2001-339640
[Patent Document 3] Japanese Published Patent Application No. 2003-167550

SUMMARY OF THE INVENTION

To obtain an area sensor which captures an image of an object accurately, an amplifier circuit is needed which can convert intensity distribution of light received by photoelectric conversion elements arranged in a matrix into electrical signals with high reproducibility and output the electrical signals.

An amplifier circuit including a single crystal silicon transistor has excellent characteristics; however the size of an area sensor is limited by the size of the single crystal silicon substrate. In other words, formation of a large area sensor or a large area sensor also serving as a display device using a single crystal silicon substrate is costly and impractical.

On the other hand, the size of a substrate can be easily increased when a thin film transistor including amorphous silicon is employed. However, field-effect mobility of an amorphous silicon thin film is low; thus, it is difficult to reduce an area occupied by the amplifier circuit. The amplifier circuit which occupies a large area may limit areas of a light-receiving plane of a photoelectric conversion element and of a pixel of a display element which are formed on the same substrate as the amplifier circuit.

Further, thin film transistors including polycrystalline silicon vary in their characteristics because of excimer laser annealing. If amplifier circuits including thin film transistors which vary in their characteristics are used, it is impossible to convert intensity distribution of light received by photoelectric conversion elements arranged in a matrix into electrical signals with high reproducibility and output the electrical signals.

In addition, in a case of manufacturing products by forming many photosensors or line sensors on one substrate and dividing the substrate, variation in amplifier circuits of products cause variation in characteristics of the products, which leads to reduction in yield. Besides, such a product is not easy to use. Note that a photosensor, a line sensor, and an area sensor in this specification include at least a photoelectric conversion element and an amplifier circuit, and a driver circuit is not essentially incorporated.

One of the objects of embodiments of the present invention is to provide a large area sensor which can convert intensity distribution of light received by photoelectric conversion elements arranged in a matrix into electrical signals with high reproducibility and output the electrical signals. In addition, another object is to provide a display device with a high writing speed and little display unevenness which can also serve as a large area sensor which can convert intensity distribution of light received by photoelectric conversion elements arranged in a matrix into electrical signals with high reproducibility and output the electrical signals. Further, another object is to provide a photosensor and a line sensor which can be mass manufactured over a large substrate and have uniform characteristics. The present invention aims to achieve at least one of the above objects.

The present inventors have found that amplifier circuits which include thin film transistors with high field-effect mobility and small characteristic variations, which include an oxide semiconductor, particularly, an oxide semiconductor containing indium, gallium, and zinc, have small characteristic variations and occupy a small area. As a result, an area sensor including the amplifier circuit as an amplifier circuit for a photodiode can convert intensity distribution of light received by the photodiode into electrical signals with high reproducibility and output the electrical signals. Further, by forming thin film transistors including an oxide semiconductor, typically, an oxide semiconductor containing indium, gallium, and zinc, over a large substrate, it becomes possible to provide a large area sensor which can convert intensity distribution of light into electrical signals with high reproducibility. Further, by mass manufacturing photosensors of uniform characteristics over a large substrate, it becomes possible to provide a large number of photosensors and line sensors of uniform characteristics.

In one embodiment of the photosensor of the present invention, a photodiode is used as a photoelectric conversion element. Further, one embodiment of the photosensor of the present invention includes an amplifier circuit which includes a thin film transistor including an oxide semiconductor containing indium (In), gallium (Ga), and zinc (Zn).

An example of a photodiode in this specification is a photodiode including a cathode electrode, an anode electrode, and a photoelectric conversion layer provided between the cathode electrode and the anode electrode. When light reaches the photoelectric conversion layer, electric current is generated by a photovoltaic effect.

An example of an oxide semiconductor in this specification is represented as $InMO_3(ZnO)_m$ (m>0). A thin film is formed from an oxide semiconductor and is used for forming a thin film transistor. Note that M denotes one or more metal elements selected from Ga, Fe, Ni, Mn, and Co. In addition to a case where Ga is M, there is a case where Ga and any of the above metal elements other than Ga, for example, Ga and Ni or Ga and Fe are contained as M. Further, in some cases, the above oxide semiconductor contains a transition metal element such as Fe or Ni or an oxide of the transition metal as an impurity element, in addition to the metal element which is contained as M. In this specification, this thin film is also referred to as an oxide semiconductor film containing indium, gallium, and zinc or an InGa—Zn—O-based non-single-crystal film. Note that the concentration of sodium (Na) contained in an InGa—Zn—O-based non-single-crystal film is $5\times10^{18}/cm^3$ or less, preferably $1\times10^{18}/cm^3$ or less. Further, as another oxide semiconductor, an In—Sn—Zn—O-based, In—Al—Zn—O-based, Sn—Ga—Zn—O-based, Al—Ga—Zn—O-based, Sn—Al—Zn—O-based, In—Zn—O-based, Sn—Zn—O-based, Al—Zn—O-based, In—O-based, Sn—O-based, or Zn—O-based oxide semiconductor can be used.

Further, a thin film transistor including an oxide semiconductor containing indium, gallium, and zinc has a high field-effect mobility, and amplifier circuits and driver circuits of display elements including the thin film transistors occupy a small area and have small variation in their characteristics. Therefore, a large number of amplifier circuits and driver circuits of display elements can be formed over a large substrate.

In other words, an embodiment of the present invention is a photosensor which includes a photoelectric conversion element and an amplifier circuit having a thin film transistor including an oxide semiconductor containing indium, gallium, and zinc.

Another embodiment of the present invention is a photosensor which includes a photoelectric conversion element and an amplifier circuit. The photoelectric conversion element includes a photoelectric conversion layer which includes a stack of a first semiconductor layer including an impurity element having one conductivity type, a second semiconductor layer in contact with the first semiconductor layer, and a third semiconductor layer in contact with the second semiconductor layer and includes an impurity element having a conductivity type opposite to the conductivity type of the first semiconductor layer. The amplifier circuit includes a selection thin film transistor, an amplifying thin film transistor, and a reset thin film transistor which each include an oxide semiconductor containing indium, gallium, and zinc. In the amplifier circuit, a gate electrode of the reset thin film transistor is connectable to a reset gate signal line, one of a source electrode and a drain electrode of the reset thin film transistor is connectable to a sensor power supply line, the other one of the source electrode and the drain electrode of the reset thin film transistor is connectable to a gate electrode layer of the amplifying thin film transistor and one of an anode and a cathode of the photoelectric conversion element, one of a source electrode and a drain electrode of the amplifying thin film transistor is connectable to the sensor power supply line, one of a source electrode and a drain electrode of the selection thin film transistor is connectable to a sensor output wiring, the other one of the source electrode and the drain electrode of the selection thin film transistor is connectable to the other one of the source electrode and the drain electrode of the amplifying thin film transistor, and a gate electrode layer of the selection thin film transistor is connectable to a sensor gate signal line.

Another embodiment of the present invention is a photosensor in which a plurality of pixels are arranged. Each of the pixels includes a photoelectric conversion element and an amplifier circuit. The photoelectric conversion element includes a stack of a first semiconductor layer including an impurity element having one conductivity type, a second semiconductor layer in contact with the first semiconductor layer, and a third semiconductor layer in contact with the second semiconductor layer and includes an impurity element having a conductivity type opposite to the conductivity type of the first semiconductor layer. The amplifier circuit includes a selection thin film transistor, an amplifying thin film transistor, and a reset thin film transistor which each include an oxide semiconductor containing indium, gallium, and zinc. In the amplifier circuit, a gate electrode layer of the reset thin film transistor is connectable to a reset gate signal line, one of a source electrode and a drain electrode of the reset thin film transistor is connectable to a sensor power supply line, the other one of the source electrode and the drain electrode of the reset thin film transistor is connectable to a gate electrode layer of the amplifying thin film transistor and one of an anode and a cathode of the photoelectric conversion element, one of a source electrode and a drain electrode of the amplifying thin film transistor is connectable to the sensor power supply line, one of a source electrode and a drain electrode of the selection thin film transistor is connectable to a sensor output wiring, the other one of the source electrode and the drain electrode of the selection thin film transistor is connectable to the other one of the source electrode and the drain electrode of the amplifying thin film transistor, a gate electrode layer of the selection thin film transistor is connectable to a sensor gate signal line, and the reset thin film transistor and the selection thin film transistor are turned on or off according to signals input to the reset gate signal line and the sensor gate signal line.

Another embodiment of the present invention is an area sensor which includes a plurality of pixels. Each of the pixels includes a photoelectric conversion element and an amplifier circuit having a thin film transistor including an oxide semiconductor containing indium, gallium, and zinc.

Another embodiment of the present invention is an area sensor which includes a plurality of pixels. Each of the pixels includes a photoelectric conversion element and an amplifier circuit. The photoelectric conversion element includes a photoelectric conversion layer which includes a stack of a first semiconductor layer including an impurity element having one conductivity type, a second semiconductor layer in contact with the first semiconductor layer, and a third semiconductor layer in contact with the second semiconductor layer and includes an impurity element having a conductivity type opposite to the conductivity type of the first semiconductor layer. The amplifier circuit includes a selection thin film transistor, an amplifying thin film transistor, and a reset thin film transistor which each include an oxide semiconductor containing indium, gallium, and zinc. In the amplifier circuit, a gate electrode layer of the reset thin film transistor is connectable to a reset gate signal line, one of a source electrode and a drain electrode of the reset thin film transistor is connectable to a sensor power supply line, the other one of the source electrode and the drain electrode of the reset thin film transistor is connectable to a gate electrode layer of the amplifying thin film transistor and one of an anode and a cathode of the photoelectric conversion element, one of a source electrode and a drain electrode of the amplifying thin film transistor is connectable to the sensor power supply line, one of a source electrode and a drain electrode of the selection thin film transistor is connectable to a sensor output wiring, the other one of the source electrode and the drain electrode of the selection thin film transistor is connectable to the other one of the source electrode and the drain electrode of the amplifying thin film transistor, and a gate electrode layer of the selection thin film transistor is connectable to a sensor gate signal line.

Another embodiment of the present invention is an area sensor which includes a plurality of pixels. Each of the pixels includes a photoelectric conversion element and an amplifier circuit. The photoelectric conversion element includes a photoelectric conversion layer which includes a stack of a first semiconductor layer including an impurity element having one conductivity type, a second semiconductor layer in contact with the first semiconductor layer, and a third semiconductor layer in contact with the second semiconductor layer and includes an impurity element having a conductivity type opposite to the conductivity type of the first semiconductor layer. The amplifier circuit includes a selection thin film transistor, an amplifying thin film transistor, and a reset thin film transistor which each include an oxide semiconductor containing indium, gallium, and zinc. In the amplifier circuit, a gate electrode layer of the reset thin film transistor is connectable to a reset gate signal line, one of a source electrode and a drain electrode of the reset thin film transistor is connectable to a sensor power supply line, the other one of the source electrode and the drain electrode of the reset thin film transistor is connectable to a gate electrode layer of the amplifying thin film transistor and one of an anode and a cathode of the photoelectric conversion element, one of a source electrode and a drain electrode of the amplifying thin film transistor is connectable to the sensor power supply line, one of a source electrode and a drain electrode of the selection thin film transistor is connectable to a sensor output wiring, the other one of the source electrode and the drain electrode of the selection thin film transistor is connectable to the other one of the source electrode and the drain electrode of the amplifying thin film transistor, a gate electrode layer of the selection thin film transistor is connectable to a sensor gate signal line, and the reset thin film transistor and the selection thin film transistor are turned on or off according to signals input to the reset gate signal line and the sensor gate signal line.

Another embodiment of the present invention is a display device which includes a plurality of pixels. Each of the pixels includes a photoelectric conversion element, an amplifier circuit, a display element, and a driver circuit of the display element. The amplifier circuit and the driver circuit each include a thin film transistor including an oxide semiconductor containing indium, gallium, and zinc.

Another embodiment of the present invention is a display device which includes a plurality of pixels. Each of the pixels includes a photoelectric conversion element, an amplifier circuit, a display element, and a driver circuit of the display element. The photoelectric conversion element includes a photoelectric conversion layer which includes a stack of a first semiconductor layer including an impurity element having one conductivity type, a second semiconductor layer in contact with the first semiconductor layer, and a third semiconductor layer in contact with the second semiconductor layer and includes an impurity element having a conductivity type opposite to the conductivity type of the first semiconductor layer. The amplifier circuit includes a selection thin film transistor, an amplifying thin film transistor, and a reset thin film transistor which each include an oxide semiconductor containing indium, gallium, and zinc. In the amplifier circuit, a gate electrode layer of the reset thin film transistor is connectable to a reset gate signal line, one of a source electrode and a drain electrode of the reset thin film transistor is connectable to a sensor power supply line, the other one of the source electrode and the drain electrode of the reset thin film transistor is connectable to a gate electrode layer of the amplifying thin film transistor and one of an anode and a cathode of the photoelectric conversion element, one of a source electrode and a drain electrode of the amplifying thin film transistor is connectable to the sensor power supply line, one of a source electrode and a drain electrode of the selection thin film transistor is connectable to a sensor output wiring, the other one of the source electrode and the drain electrode of the selection thin film transistor is connectable to the other one of the source electrode and the drain electrode of the amplifying thin film transistor, and a gate electrode layer of the selection thin film transistor is connectable to a sensor gate signal line. The driver circuit of the display element at least includes a switching thin film transistor including an oxide semiconductor containing indium, gallium, and zinc. In the driver circuit of the display element, a gate electrode layer of the switching thin film transistor is connectable to a gate signal line and one of a source electrode and a drain electrode of the switching thin film transistor is connectable to a source signal line.

According to one embodiment of the present invention, the display element includes an anode, a cathode, and a layer containing a light-emitting substance between the anode and the cathode.

According to one embodiment of the present invention, the display element includes a pixel electrode, a counter electrode, and a layer containing liquid crystal between the pixel electrode and the counter electrode.

Another embodiment of the present invention is a method for operating the display device provided with an area sensor with a laser pointer.

According to the present invention, a large area sensor or a large line sensor can be provided which can convert intensity distribution of light received by a plurality of photoelectric conversion elements into electrical signals with high reproducibility and output the electrical signals. In addition, a display device with a high writing speed and little display unevenness which can also serve as a large area sensor which can convert intensity distribution of light received by photoelectric conversion elements arranged in a matrix into electrical signals with high reproducibility and output the electrical signals can be provided.

BRIEF DESCRIPTION OF THE DRAWINGS

FIGS. 5A to 5D show manufacturing steps of a pixel portion in an area sensor.

FIGS. 6A to 6D show manufacturing steps of a pixel portion in an area sensor.

FIGS. 7A to 7D show manufacturing steps of a pixel portion in an area sensor.

FIGS. 12A to 12D show manufacturing steps of a display device provided with an area sensor.

FIGS. 13A to 13D show manufacturing steps of a display device provided with an area sensor.

FIGS. 14A and 14B show manufacturing steps of a display device provided with an area sensor.

DETAILED DESCRIPTION OF THE INVENTION

Hereinafter, embodiments of the present invention will be described in detail with reference to the accompanying drawings. Note that the present invention is not limited to the following description and it will be readily appreciated by those skilled in the art that modes and details can be modified in various ways without departing from the spirit and the scope of the present invention. Therefore, the present invention is not construed as being limited to the description of the embodiments given below.

Embodiment 1

In this embodiment, an example of an area sensor including a plurality of photoelectric conversion elements and amplifier circuits is described with reference to drawings. The amplifier circuit includes thin film transistors including an oxide semiconductor, particularly, an oxide semiconductor containing indium, gallium, and zinc.

Figure 1:
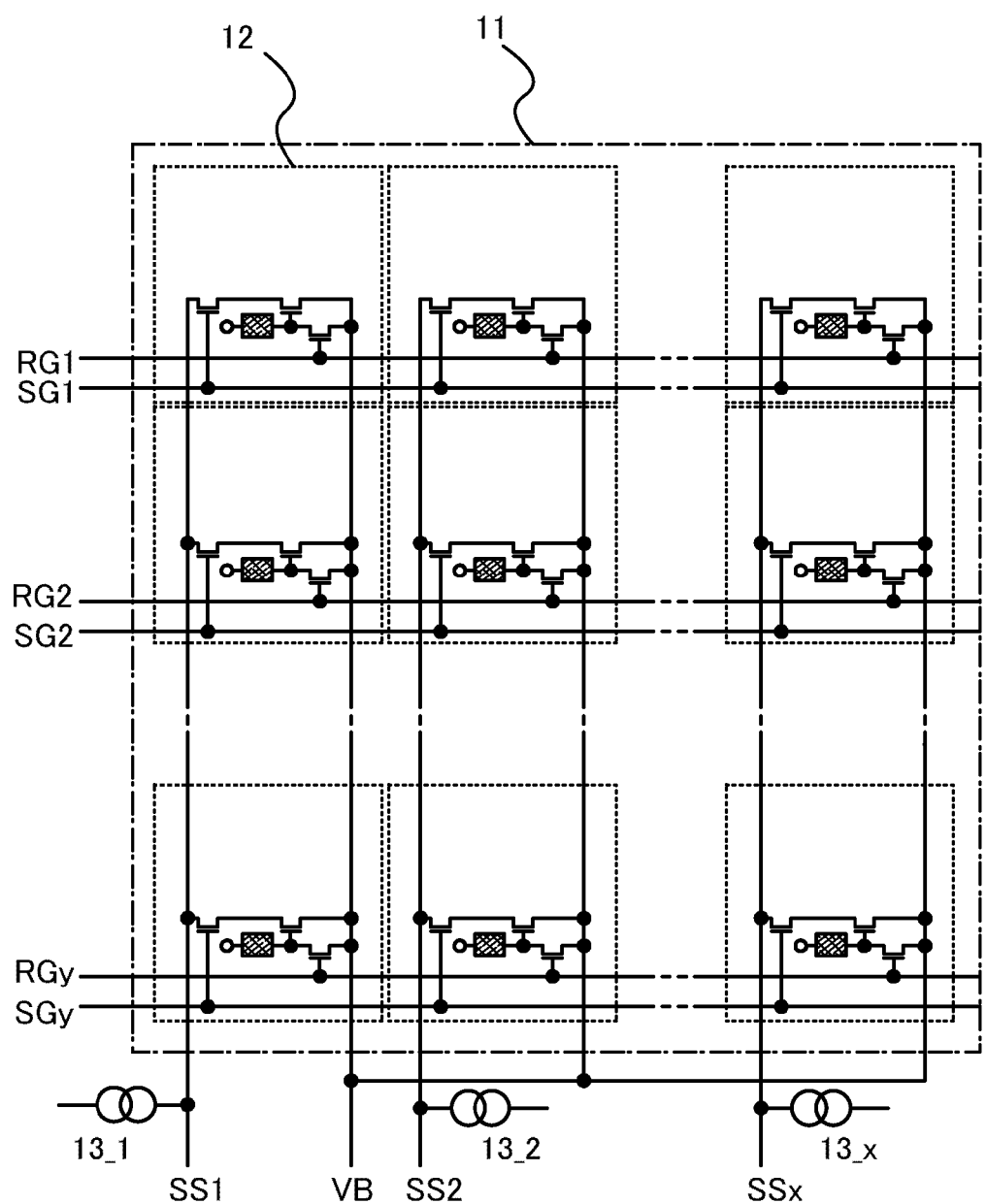
FIG. 1 is a circuit diagram of an area sensor.

FIG. 1 illustrates connections of reset gate signal lines RG1 to RGy, sensor gate signal lines SG1 to SGy, sensor output wirings SS1 to SSx, a sensor power supply line VB, and a plurality of pixels 12 which are included in an area sensor portion 11.

In the area sensor portion 11, the plurality of pixels 12 are arranged in a matrix. Each of the pixels 12 is connected to one of the reset gate signal lines RG1 to RGy, one of the sensor gate signal lines SG1 to SGy, one of the sensor output wirings SS1 to SSx, and the sensor power supply line VB.

The sensor output wirings SS1 to SSx are connected to constant current power supplies 13_1 to 13_x, respectively.

Figure 2:
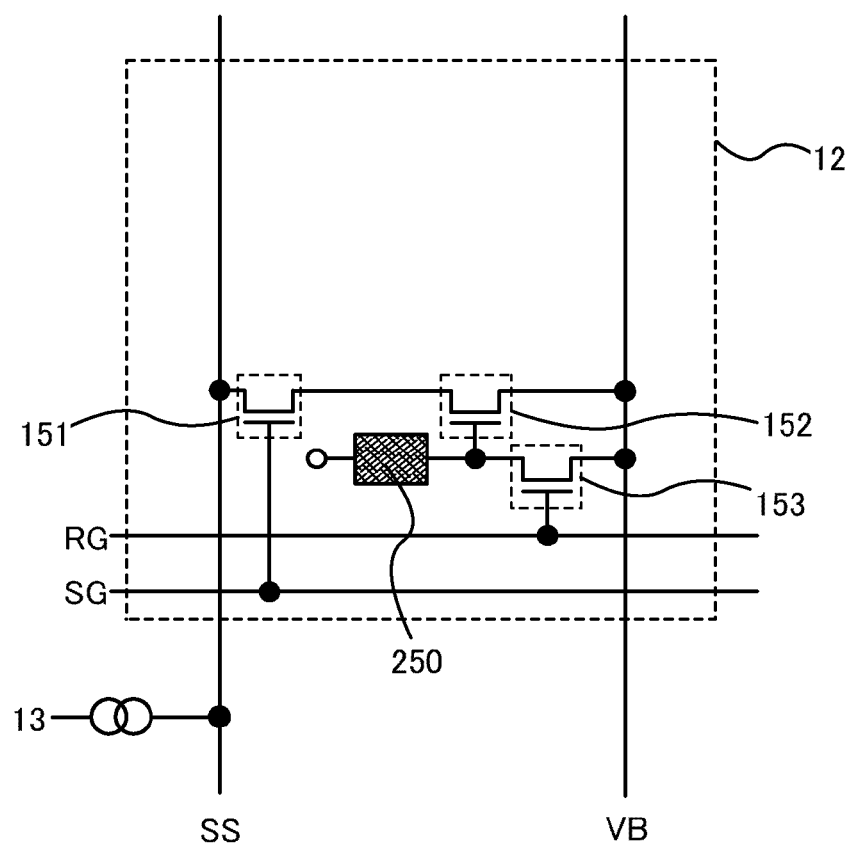
FIG. 2 is a circuit diagram of a pixel of an area sensor.

FIG. 2 shows an example of connection between the photoelectric conversion element and the amplifier circuit in the pixel portion. The amplifier circuit includes thin film transistors including an oxide semiconductor containing indium, gallium, and zinc. A reset gate signal line RG is one of the reset gate signal lines RG1 to RGy. A sensor gate signal line SG is one of the sensor gate signal lines SG1 to SGy. A sensor output wiring SS is one of the sensor output wirings SS1 to SSx. The pixel 12 includes a selection TFT 151, an amplifying TFT 152, a reset TFT 153, and a photodiode 250.

A gate electrode of the reset TFT 153 is connected to the reset gate signal line RG. One of a source electrode and a drain electrode of the reset TFT 153 is connected to the sensor power supply line VB, which is kept at a fixed potential (a reference potential), and the other one is connected to the photodiode 250 and to a gate electrode of the amplifying TFT 152.

Although not shown, the photodiode 250 includes a cathode electrode, an anode electrode, and a photoelectric conversion layer provided therebetween. The other one of the source electrode and the drain electrode of the reset TFT 153 is connected to the anode electrode or the cathode electrode of the photodiode 250.

One of a source electrode or a drain electrode of the amplifying TFT 152 is connected to the sensor power supply line VB and is kept at a fixed reference potential, and the other one is connected to a source electrode or a drain electrode of the selection TFT 151.

A gate electrode of the selection TFT 151 is connected to the sensor gate signal line SG. One of the source electrode or the drain electrode of the selection TFT 151 is connected to the one of the source electrode or the drain electrode of the amplifying TFT 152 as described above, and the other one is connected to the sensor output wiring SS. The sensor output wiring SS is connected to a constant current power supply 13 (one of the constant current power supplies 13_1 to 13_x) and is kept supplied with a fixed amount of current.

Here, n-channel thin film transistors including an oxide semiconductor containing indium, gallium, and zinc are used as the selection TFT 151, the amplifying TFT 152, and the reset TFT 153, and the cathode electrode of the photodiode 250 is connected to the drain electrode of the reset TFT 153 so that voltage is applied in the so-called reverse-bias direction. An output which is less dependent on temperature can be obtained from a circuit in which voltage in the reverse-bias direction is applied to the photodiode 250.

Next, driving of the area sensor according to the present invention is described with reference to FIGS. 1 to 3.

First, light with image information of an object reaches the photodiode 250 in the pixel 12. The photodiode 250 converts intensity of the light into an electrical signal. Then, the electrical signal with the image information generated by the photodiode 250 is output as image signals by the selection TFT 151, the amplifying TFT 152, and the reset TFT 153.

Figure 3:
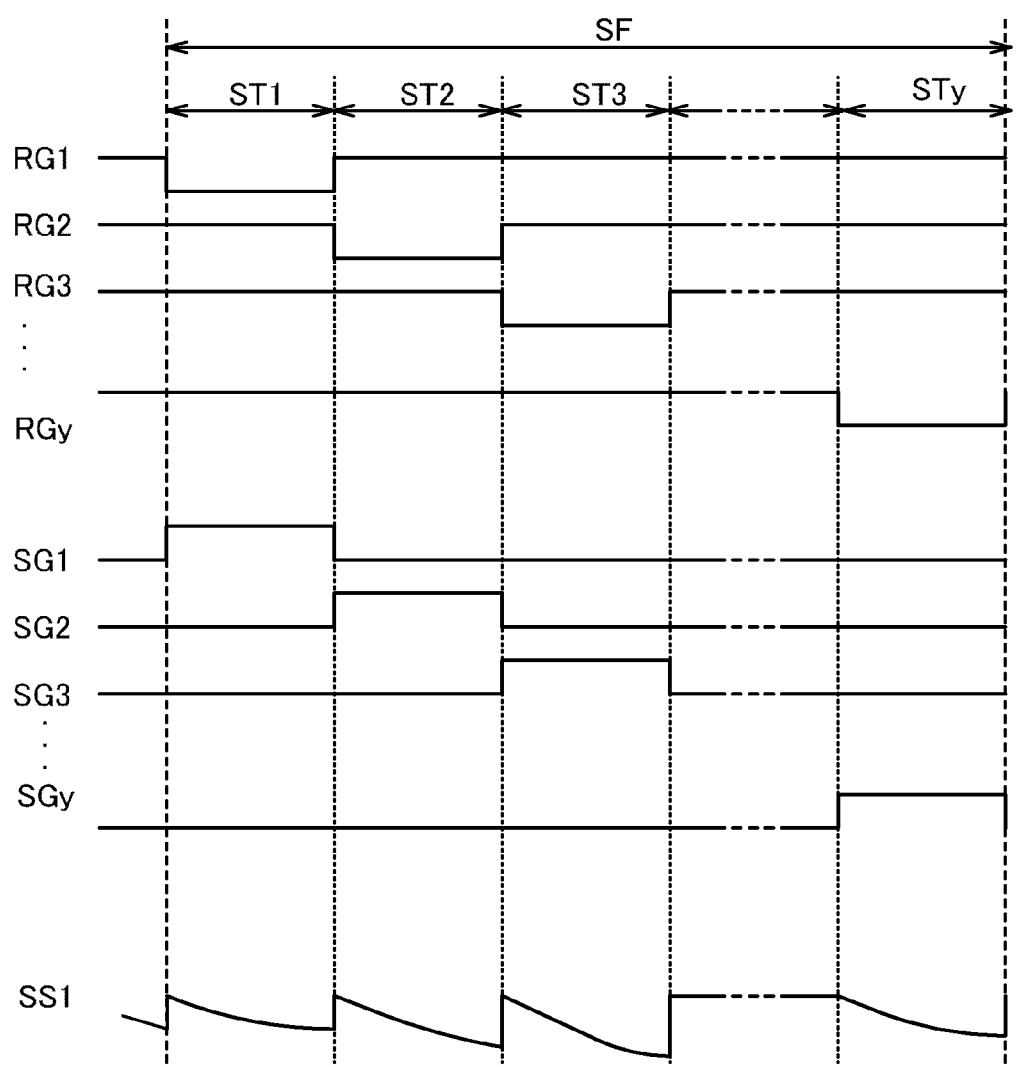
FIG. 3 is a timing diagram of an area sensor capturing an image.

FIG. 3 is a timing diagram showing operations of the selection TFTs 151, the amplifying TFTs 152, and the reset TFTs 153. Note that in the timing diagram shown here, the selection TFTs 151, the amplifying TFTs 152, and the reset TFTs 153 are n-channel TFTs.

First, the reset TFTs 153 in pixels in a first line, which are connected to the reset gate signal line RG1, are in an On state by a reset signal input to the reset gate signal line RG1.

Accordingly, the reference potential of the sensor power supply line VB is applied to the gate electrodes of the amplifying TFTs 152.

On the other hand, the selection TFTs 151 in the pixels in the first line, which are connected to the sensor gate signal line SG1, are in an Off state by a sensor signal input to the sensor gate signal line SG1. Note that in this specification, a period in which the reset TFT 153 is in an On state is called a reset period.

Then, a potential of the reset signal input to the reset gate signal line RG1 changes and the reset TFTs 153 in all the pixels in the first line are turned off. Accordingly, the reference potential of the sensor power supply line VB stops being supplied to the gate electrodes of the amplifying TFTs 152 in the pixels in the first line. Note that a period during which the reset TFTs 153 are in an Off state is called a sample period ST in this specification. Specifically, a period in which the reset TFTs 153 in the pixels in the first line are in an Off state is called a sample period ST1.

In the sample period ST1, the potential of the sensor signal input to the sensor gate signal line SG1 changes, whereby the selection TFTs 151 in the pixels in the first line are turned on. Thus, the source electrodes of the amplifying TFTs 152 in the pixels in the first line are electrically connected to the sensor output wiring SS1 via the selection TFTs 151.

In the sample period ST1, when light reaches the photodiode 250, current flows through the photodiode 250. Therefore, the potential of the gate electrode of the amplifying TFT 152 which is kept at the reference potential in the reset period changes according to the amount of current generated in the photodiode 250. In the amplifying TFT 152, which is connected to the constant current power supply 13_1 via the sensor output wiring SS1, a potential difference $V_{GS}$ between the source electrode and the gate electrode is fixed regardless of the output from the photodiode 250; thus, the amplifying TFT 152 serves as a source follower.

The amount of current flows through the photodiode 250 is proportional to intensity of light which is incident on the photodiode 250; thus, the intensity of light is converted into an electrical signal by the photodiode 250. The electrical signal generated by the photodiode 250 is input to the gate electrode of the amplifying TFT 152.

Here, the cathode electrode of the photodiode 250 is connected to the gate electrode of the amplifying TFT 152 and the anode electrode of the photodiode 250 is connected to a common wiring. Therefore, in a period during which the reset TFT 153 is in an On state, the gate electrode of the amplifying TFT 152, which is an n-channel TFT, is kept at a positive reference potential. However, in the sample period ST1, the potential of the gate electrode of the amplifying TFT 152 decreases according to the intensity of light reaching the photodiode 250.

On the other hand, the sensor output wiring SS is connected to the constant current power supply so that the fixed amount of current flows through the amplifying TFT 152 and the selection TFT 151 to the sensor output wiring SS. Accordingly, the potential of the sensor output wiring SS changes to keep the potential difference $V_{GS}$ between the source electrode and the gate electrode of the amplifying TFT 152 fixed. Specifically, the potential of the source electrode of the amplifying TFT 152 is kept at a potential obtained by subtracting $V_{GS}$ from the potential of the gate electrode of the amplifying TFT 152.

In the above manner, the photodiode 250 which receives image information of the object causes a potential change of the gate electrode of the amplifying TFT 152, and the potential change is output as a potential change of the source electrode of the amplifying TFT 152 to the sensor output wiring SS1 through the selection TFT 151 in an On state.

Next, the reset TFTs 153 in pixels in a second line, which are connected to the reset gate signal line RG2, are turned off by a reset signal input from the reset gate signal line RG2, whereby the sample period ST2 is started. Note that before the next sampling period starts, the reset TFTs 153 in the pixels in the first line are placed in a reset period again by a reset signal input from the reset gate signal line RG1, which is connected to the reset TFTs 153.

In the sample period ST2, similar to the sample period ST1, an electrical signal with the image information is generated in the photodiode and an image signal is input to the sensor output wiring SS2.

The above operation is repeated. When a sample period STy is finished, one image can be captured as image signals. In this specification, the period of time from the start of the sample period ST1 through the end of the sample period STy is called a sensor frame period SF.

As described above, when the reset TFT 153 is in an Off state and the selection TFT 151 is in an On state, if the photodiode 250 converts intensity of light into an electrical signal and the gate potential of the amplifying TFT 152 reflects the electrical signal, a change in the gate potential of the amplifying TFT 152 is reflected by the source electrode potential of the amplifying TFT 152, whereby the intensity of light received by the photodiode 250 is output to the sensor output wiring SS. Accordingly, characteristics of the transistors included in the amplifier circuit have great effect on characteristics of the amplifier circuit. In particular, in an area sensor in which a plurality of photodiodes and amplifier circuits are arranged in a matrix, if amplifier circuits vary in their characteristics, intensity distribution of light cannot be converted into an electrical signal properly. For example, in the amplifier circuits given as an example in this embodiment, uniformity in $I_d$-$V_{GS}$ characteristics of the amplifying TFTs 152 is important. If the $I_d$-$V_{GS}$ characteristics vary, it is difficult to properly output intensity distribution of light received by the photodiodes 250 arranged in a matrix to the output wirings.

Figure 4:
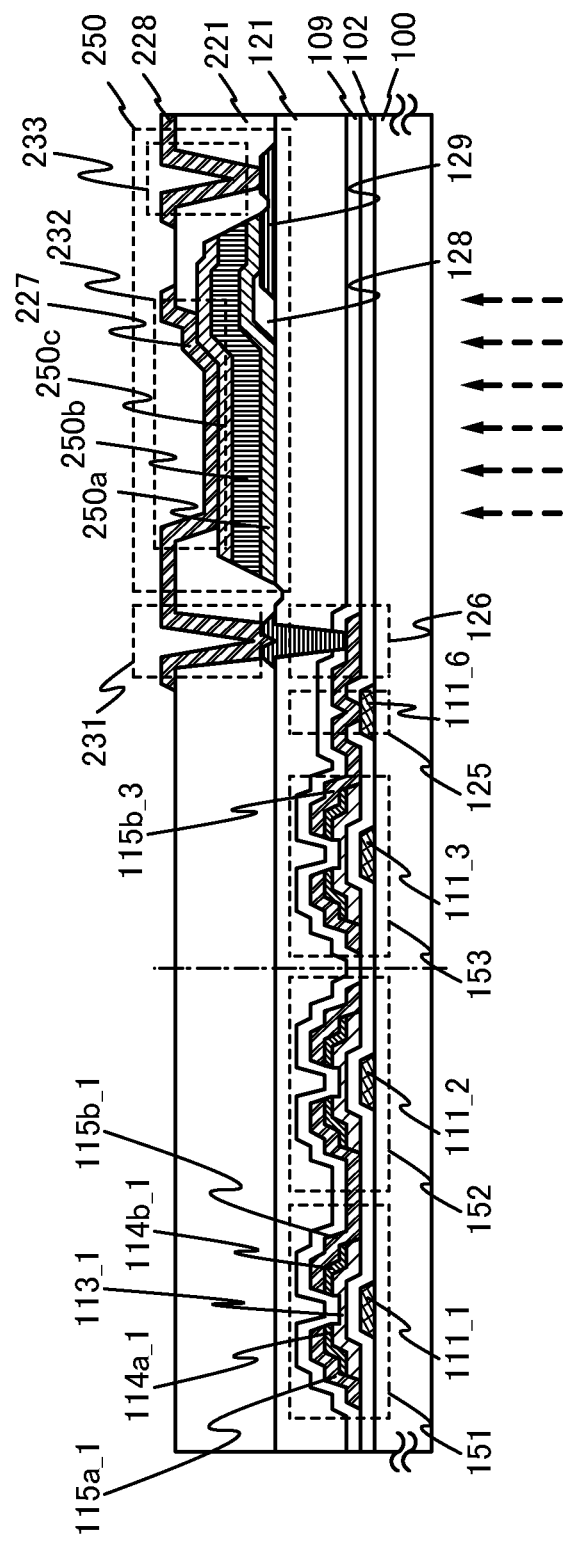
FIG. 4 is a cross-sectional view of a pixel portion in an area sensor.

FIG. 4 is a cross-sectional view of an example the area sensor. Specifically, FIG. 4 is a cross-sectional view of the area sensor including a photodiode and a thin film transistor including an oxide semiconductor containing indium, gallium, and zinc. An example of the area sensor is described with reference to FIG. 4.

First, a structure of the selection TFT 151, the amplifying TFT 152, and the reset TFT 153 included in the amplifier circuit is described. Since main parts of the selection TFT 151, the amplifying TFT 152, and the reset TFT 153 have the same structure, the selection TFT 151 is mainly described below.

The selection TFT 151, the amplifying TFT 152, and the reset TFT 153 respectively include a gate electrode layer 111_1, a gate electrode layer 111_2, and a gate electrode layer 111_3 which are formed from the same layer as the reset gate signal line RG and the sensor gate signal line SG. The gate electrode layer 111_1, the gate electrode layer 111_2, and the gate electrode layer 111_3 are formed over a substrate 100. A gate insulating film 102 is formed over the gate electrode layer 111_1, the gate electrode layer 111_2, and the gate electrode layer 111_3.

A first oxide semiconductor layer 113_1 is formed over the gate insulating film 102. A source electrode layer and a drain electrode layer (115a_1 and 115b_1) which are formed from the same layer as the sensor output wiring SS and the sensor power supply line VB are provided over the gate electrode layer 111_1 with the first oxide semiconductor layer 113_1 interposed therebetween. The source electrode layer and the drain electrode layer (115a_1 and 115b_1) are provided in a manner that they face each other over the gate electrode layer 111_1.

A source electrode layer 115b_3 of the reset TFT 153 is directly connected to a wiring layer 111_6 through a contact hole 125 provided in the gate insulating film 102. By reducing the number of connections, not only the number of connection interfaces which may increase electric resistance, but an area occupied by the contact holes is reduced. Note that although not shown, the wiring layer 1116 is connected to the gate electrode layer 111_2 of the amplifying TFT 152.

The first oxide semiconductor layer 113_1 is provided under the source electrode layer and the drain electrode layer (115a_1 and 115b_1) facing each other and overlaps with the gate electrode layer 111_1 with the gate insulating film 102 interposed therebetween. In other words, the first oxide semiconductor layer 113_1 is provided so as to overlap with the gate electrode 111_1 and to be in contact with an upper surface portion of the gate insulating film 102 and lower surface portions of buffer layers 114a_1 and 114b_1.

The first oxide semiconductor layer is formed from an InGa—Zn—O-based non-single-crystal film. The composition of the InGa—Zn—O-based non-single-crystal film changes depending on its film formation condition. Here, a target having a composition of $In_2O_3:Ga_2O_3:ZnO$ is 1:1:1 (the composition ratio of the metal elements: In, Ga, and Zn is 1:1:0.5) is used. In Condition 1, the flow rate of an argon gas is 40 sccm in sputtering. In Condition 2, the flow rate of an argon gas is 10 sccm and the flow rate of oxygen is 5 sccm in sputtering.

A typical composition of an oxide semiconductor film which is measured by inductively coupled plasma mass spectrometry (ICP-MS) is $InGa_{0.95}Zn_{0.41}O_{3.33}$ in the case of Condition 1, and $InGa_{0.94}Zn_{0.40}O_{3.31}$ in the case of Condition 2.

A typical composition of an oxide semiconductor film which is quantified by Rutherford backscattering spectrometry (RBS) is $InGa_{0.93}Zn_{0.44}O_{3.49}$ in the case of Condition 1, and $InGa_{0.92}Zn_{0.45}O_{3.86}$ in the case of Condition 2.

Since the In—Ga—Zn—O-based non-single-crystal film is formed by a sputtering method and then subjected to heat treatment at a temperature of from 200° C. to 500° C., typically, from 300° C. to 400° C. for 10 minutes to 100 minutes, an amorphous structure is observed when its crystal structure is analyzed by X-ray diffraction (XRD).

The buffer layers (114a_1 and 114b_1) are in contact with and provided between the first oxide semiconductor layer 113_1, and the source electrode layer and the drain electrode layer (115a_1 and 115b_1). The buffer layers are formed from a second oxide semiconductor film which has higher electrical conductivity than the first oxide semiconductor film. Therefore, the buffer layers (114a_1 and 114b_1) serve as a source electrode and a drain electrode in the selection TFT 151, the amplifying TFT 152, and the reset TFT 153. The buffer layers (114a_1 and 114b_1) have n-type conductivity and an activation energy ($\Delta E$) of from 0.01 eV to 0.1 eV inclusive and can also be referred to as $n^+$ regions. In the case where the buffer layer is a non-single-crystal oxide semiconductor layer containing indium, gallium, and zinc, nanocrystal is included in the non-single-crystal structure in some cases. With such a structure, the selection TFT 151, the amplifying TFT 152, and the reset TFT 153 can have improved thermal stability and can be operated stably.

Accordingly, the function of the amplifier circuit can be improved and the operation can be stabilized. In addition, the amount of junction leakage is reduced and the characteristics of the selection TFT 151, the amplifying TFT 152, and the reset TFT 153 can be improved.

In the selection TFT 151, a first interlayer insulating film 109 and a second interlayer insulating film 121 are provided in that order over the first oxide semiconductor layer 113_1 and the source electrode layer and the drain electrode layer (115a_1 and 115b_1). As for the amplifying TFT 152 and the reset TFT 153, the first interlayer insulating film 109 and the second interlayer insulating film 121 are also provided as in the amplifying TFT 152. Note that a plurality of interlayer insulating films are not necessarily provided and the photodiode 250 may be formed directly over the first interlayer insulating film 109.

The photodiode 250 is formed over the second interlayer insulating film 121 as an example of the photoelectric conversion element. The photodiode 250 over the second interlayer insulating film 121 includes a lower electrode layer 129 formed from a third conductive layer and an upper electrode layer 227 formed from a fourth conductive layer. Between the lower electrode layer 129 and the upper electrode layer 227, a first semiconductor layer 250a, a second semiconductor layer 250b, and a third semiconductor layer 250c are stacked in that order over the second interlayer insulating film 121. A protective layer 128 covers an end portion of the lower electrode layer 129.

The lower electrode layer 129 of the photodiode 250 is connected to the common wiring via a wiring layer 228. The upper electrode layer 227 of the photodiode 250 is connected to the source electrode layer 115b_3 of the reset TFT 153 through contact holes 231 and 126 and is further connected to the wiring layer 111_6 through the contact hole 125. Although not shown, the wiring layer 111_6 is connected to the gate electrode layer 111_2 of the amplifying TFT 152.

A third interlayer insulating film 221 is formed over the second interlayer insulating film 121 and the photodiode 250. The contact hole 231 and a contact hole 232 are formed in the third interlayer insulating film 221. Through the contact hole 232, the third semiconductor layer 250c and the upper electrode layer 227 are connected. Through the contact hole 233, the lower electrode layer 129 and the wiring layer 228 are connected.

Here, a pin photodiode is given as an example, in which a p-type amorphous silicon layer, an amorphous silicon layer having high resistance, and an n-type amorphous silicon layer are stacked as the first semiconductor layer 250a, the second semiconductor layer 250b, and the third semiconductor layer 250c, respectively. Note that the amorphous silicon layer having high resistance has an electrical conductivity of $10^{-13}$ S/cm to $10^{-7}$ S/cm inclusive, preferably, $10^{-12}$ S/cm to $10^{-8}$ S/cm inclusive in the dark at room temperature. Here, the amorphous silicon layer having high resistance has an electrical conductivity of $10^{-11}$ S/cm to $10^{-10}$ S/cm inclusive. In addition, since the mobility of holes generated by the photoelectric effect is lower than that of electrons, a pin photodiode has better characteristics when a surface on the p-type semiconductor layer side is used as a light-receiving plane. Here, light approaching a plane of the substrate opposite from the amplifier circuit and the pin photodiode is received by the photodiode 250 and is converted into electrical signals. Further, light approaching the semiconductor layer having a conductivity type opposite from that of the semiconductor layer on the light-receiving plane is disturbance light; therefore, the electrode layer on the semiconductor layer having the opposite conductivity type is preferably formed from a light-blocking conductive film. Note that a surface on the n-type semiconductor layer side can alternatively be used as the light-receiving plane. In that case, a light-transmitting conductive film is preferably used as the upper electrode layer 227 and a light-blocking conductive film is preferably used as the lower electrode layer 129.

Thus, the area sensor including a pin photodiode as a photoelectric conversion element and an amplifier circuit having a thin film transistor including an oxide semiconductor containing indium, gallium, and zinc can be formed. With the area sensor, image information can be converted into an electrical signal and output.

The amplifier circuits include thin film transistors including an oxide semiconductor containing indium, gallium, and zinc with high field-effect mobility and small characteristic variations and therefore have small characteristic variations and occupy a small area. An area sensor including such amplifier circuits for photodiodes can convert intensity distribution of light received by the photodiodes into electrical signals with high reproducibility and output the electrical signals. Further, since the area occupied by the amplifier circuits is small, the proportion of an area of a light-receiving portion of photoelectric conversion elements can be increased, whereby electrical signals with less noise can be output. Further, since the thin film transistors including an oxide semiconductor containing indium, gallium, and zinc can be easily arranged in a matrix over a large substrate, a large area sensor can be provided.

Embodiment 2

In this embodiment, an example of a manufacturing process for the area sensor in FIG. 4 which is described in Embodiment 1 is described with reference to FIGS. 5A to 5D and FIGS. 6A to 6D. Note that since main parts of the selection TFT 151, the amplifying TFT 152, and the reset TFT 153, the manufacturing process of which is described with reference to FIGS. 5A to 5D and FIGS. 6A to 6D, have the same structure, a process for forming the selection TFT 151 is mainly described below.

In FIG. 5A, a light-transmitting substrate is used as a substrate 100. A glass substrate of barium borosilicate glass, aluminoborosilicate glass, aluminosilicate glass, or the like available in the market can be employed. For example, a glass substrate which includes more barium oxide (BaO) than boric acid ($B_2O_3$) in composition ratio and whose strain point is 730° C. or higher is preferable. This is because such a glass substrate is not strained even when an oxide semiconductor layer is thermally processed at high temperatures of about 700° C.

As a light-transmitting substrate, in addition to a glass substrate, a quartz substrate, a plastic substrate or the like with heat resistance which can withstand a process temperature in this manufacturing process can be used. In particular, a thin film transistor including an oxide semiconductor containing indium, gallium, and zinc can be formed at a relatively low temperature; therefore, a process temperature which the substrate should be withstand is low. An insulating film may be provided as a base film over the substrate 100. The base film may be formed with a single layer or plural layers of a silicon oxide film, a silicon nitride film, a silicon oxynitride film, and/or a silicon nitride oxide film by a CVD method, a sputtering method, or the like. Note that in this embodiment, a structure in which an area sensor formed over one surface of a light-transmitting substrate detects light which enters the light-transmitting substrate from the opposite surface and passes through the substrate is mainly described. Note that if a structure in which light directly reaches the area sensor formed over the substrate without passing through the substrate is employed, the substrate does not necessarily need to transmit light.

Next, a conductive film which is to be the gate electrode layer 111, the sensor output wiring SS which is not shown, a gate wiring including the sensor power supply line VB, a capacitor wiring, and a terminal of a terminal portion is formed entirely over the substrate 100. The conductive film can be formed using titanium (Ti), tantalum (Ta), tungsten (W), molybdenum (Mo), chromium (Cr), platinum (Pt), copper (Cu), gold (Au), silver (Ag), or the like. In particular, the conductive film is preferably formed from a low-resistance conductive material such as aluminum (Al) or copper (Cu). However, since aluminum alone has problems such as low heat resistance and a tendency to be corroded, it is used in combination with a conductive material having heat resistance to form a conductive film.

For the conductive film including aluminum as a first component, it is preferable to use an aluminum alloy to which an element such as titanium (Ti), tantalum (Ta), tungsten (W), molybdenum (Mo), chromium (Cr), neodymium (Nd), scandium (Sc), nickel (Ni), platinum (Pt), copper (Cu), gold (Au), silver (Ag), manganese (Mn), carbon (C), or silicon (Si), or an alloy material or compound thereof is added.

Further, the conductive film can be formed by stacking a conductive film formed from a heat-resistant conductive material over a low resistance conductive film. The heat-resistant conductive material is formed from an element selected from titanium (Ti), tantalum (Ta), tungsten (W), molybdenum (Mo), chromium (Cr), neodymium (Nd), or scandium (Sc), an alloy thereof, an alloy of combination thereof, or nitride thereof.

Further, the gate electrode layer 111 may be formed using a light-transmitting conductive film. As the light-transmitting conductive film material, an indium tin oxide alloy ($In_2O_3$—$SnO_2$, abbreviated as ITO), indium tin oxide containing silicon or silicon oxide, indium zinc oxide, zinc oxide, or the like can be used.

Note that together with an oxide semiconductor film containing indium, gallium, and zinc which has high transmittance of visible light, if a light-transmitting conductive film is used for other wiring layers such as a gate electrode layer, a source electrode layer, and a drain electrode layer, a light-transmitting thin film transistor can be formed. If an amplifier circuit includes light-transmitting thin film transistors, an overlap of the amplifier circuit with a light-receiving portion of a photoelectric conversion element does not reduce an area of the light-receiving portion; therefore, an area sensor which outputs electrical signals with less noise can be formed. In addition, a device can be miniaturized without reducing the area of the light-receiving portion.

The conductive film to be the gate electrode layer 111 is formed by a sputtering method or a vacuum evaporation method with a thickness of 50 nm to 300 nm, inclusive. If the gate electrode layer 111 has a thickness of 300 nm or less, break of a semiconductor film and a wiring which are formed later can be prevented. If the gate electrode layer 111 has a thickness of 50 nm or more, the resistance of the gate electrode layer 111 can be reduced and thus the size can be increased.

Here, a film containing aluminum as its first component and a titanium film are stacked as the conductive film over the entire surface of the substrate 100 by a sputtering method.

Next, with use of a resist mask formed using a first photomask in this embodiment, an unnecessary portion of the conductive film formed over the substrate 100 is removed by etching; thus, a wiring and an electrode (a gate wiring including the gate electrode layer 111, a capacitor wiring, and a terminal) are formed. At this point, etching is performed so that at least an end portion of the gate electrode layer 111 can be tapered.

Note that in formation of a resist mask over a large substrate, if a resist material is applied to the entire surface of the substrate, a large amount of resist material and a large amount of developer are consumed. Therefore, it is preferable that a film of a resist material be formed as selected by a droplet discharge method such as an inkjet method or a printing method (a method for forming a pattern, such as screen printing or offset printing), and exposed to light to form a resist mask. By forming the film of a resist material selectively, consumption of the resist material can be reduced; thus, the cost can be greatly reduced. Besides, a large substrate having a size of 1000 mm×1200 mm, 1100 mm×1250 mm, or 1150 mm×1300 mm can be employed.

Then, the gate insulating film 102 is formed. As an insulating film which can be used as the gate insulating film 102, a silicon oxide film, a silicon nitride film, a silicon oxynitride film, a silicon nitride oxide film, an aluminum oxide film, an aluminum nitride film, a magnesium oxide film, an yttrium oxide film, a hafnium oxide film, or a tantalum oxide film can be given as an example. Note that in the case of a structure in which an area sensor formed over one surface of a light-transmitting substrate detects light which enters the light-transmitting substrate from the opposite surface and passes through the substrate, the gate insulating film 102 should have a light-transmitting property.

Here, the silicon oxynitride film refers to a film which contains more oxygen than nitrogen and contains oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, the silicon nitride oxide film refers to a film which contains more nitrogen than oxygen and contains oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

The gate insulating film 102 may have a single-layer structure or a layered structure in which two or three insulating films are stacked. For example, when the gate insulating film 102 in contact with the substrate is formed using a silicon nitride film or a silicon nitride oxide film, adhesion between the substrate 100 and the gate insulating film 102 is increased, and in the case of using a glass substrate as the substrate 100, impurities from the substrate 100 can be prevented from diffusing into the first oxide semiconductor layer 113 and further, oxidation of the gate electrode layer 111 can be prevented. That is, film peeling can be prevented, and electrical characteristics of the resulting thin film transistor can be improved.

The thickness of the gate insulating film 102 is 50 nm to 250 nm. The gate insulating film 102 with a thickness of 50 nm or more can alleviate unevenness caused by the gate electrode layer 111, which is preferable.

Here, a 100-nm-thick silicon oxide film is formed as the gate insulating film 102 by a plasma CVD method or a sputtering method. FIG. 5A shows a cross-sectional view at this step.

Next, the gate insulating film 102 is etched with use of a resist mask formed using a second photomask in this embodiment, so that the contact hole 125 reaching the wiring layer 111_6 is formed. Although not shown, the wiring layer 111_6 is connected to the gate electrode layer 111_2 of the amplifying TFT 152.

Then, plasma treatment may be performed on the gate insulating film 102 prior to formation of an oxide semiconductor film. Here, reverse sputtering where plasma is generated after introduction of an oxygen gas and an argon gas is performed on the surface of the gate insulating film 102, so that the exposed gate insulating film 102 is subjected to treatment using oxygen radicals or oxygen. Thus, dust or impurities attaching to the surface are removed.

The plasma treatment on the gate insulating film 102 and formation of the first oxide semiconductor film and the buffer layer by a sputtering method can be performed successively without exposure to air. Successive film formation can be performed by changing the gas introduced to the chamber or the target which is used as appropriate. Successive film formation without exposure to air can prevent entry of impurities. In the case of performing successive film formation without exposure to air, a manufacturing apparatus of a multichamber type is preferably used.

In particular, it is preferable to successively perform plasma treatment on the gate insulating film 102 in contact with the first oxide semiconductor film and formation of the first oxide semiconductor film without exposure to air. By successive film formation, the interface between the stacked layers can be formed without being contaminated by an atmospheric constituent such as moisture or contaminant elements or dust existing in the atmosphere. Thus, variations in characteristics of the thin film transistors can be reduced.

Note that the term "successive film formation" in this specification means that during a series of steps from a first treatment step by sputtering to a second treatment step by sputtering, an atmosphere in which a substrate to be processed is disposed is not contaminated by a contaminant atmosphere such as air, and is kept controlled to be vacuum or an inert gas atmosphere (a nitrogen atmosphere or a rare gas atmosphere). By successive film formation, film formation can be conducted without moisture or the like attaching to the cleaned substrate to be processed. Note that successive film formation includes plasma treatment such as reverse sputtering.

Following the plasma treatment, the first oxide semiconductor film is formed without exposure of the gate insulating film to air. Successive film formation is effective in preventing dust or moisture from attaching to the interface between the gate insulating film 102 and the first oxide semiconductor film. Note that the first oxide semiconductor film may be formed in the chamber where the reverse sputtering is performed previously or in a different chamber, as long as the film formation can be performed without exposure to air.

Here, the first oxide semiconductor film is formed in an argon or oxygen atmosphere under the condition where an oxide semiconductor target including In, Ga, and Zn (composition ratio is $In_2O_3:Ga_2O_3:ZnO=1:1:1$) with a diameter of 8 inches is used, the distance between the substrate and the target is set at 170 mm, the pressure is set at 0.4 Pa, and the direct current (DC) power supply is set at 0.5 kW. Note that a pulse direct current (DC) power supply is preferable because dust can be reduced and the film thickness can be uniform. The thickness of the first oxide semiconductor film is set to 5 nm to 200 nm. The thickness of the first oxide semiconductor film in this embodiment is 100 nm.

After the first oxide semiconductor film is formed, a buffer layer is formed over the first oxide semiconductor film without exposure of the first oxide semiconductor film to air. As for the buffer layer, the second oxide semiconductor film which has a higher electrical conductivity than the first oxide semiconductor film is formed. The second oxide semiconductor film is formed under the different condition from the first oxide semiconductor film. For example, the ratio of the oxygen gas flow rate to the argon gas flow rate in the deposition condition of the first oxide semiconductor film is set higher than that of the second oxide semiconductor film. Specifically, the second oxide semiconductor film is formed in a rare gas (such as argon or helium) atmosphere (or a gas including oxygen at 10% or less and argon at 90% or more), while the first oxide semiconductor film is formed in an oxygen atmosphere (or a mixed gas of oxygen and argon with the flow rate of oxygen being more than that of argon where the argon gas flow rate: the oxygen gas flow rate=1:1 or more). When the first oxide semiconductor film is formed in an atmosphere containing a large amount of oxygen, the first oxide semiconductor film can have lower electrical conductivity than the second oxide semiconductor layer. Moreover, when the first oxide semiconductor film is formed in an atmosphere which contains a large amount of oxygen, the amount of off current can be reduced; therefore, a thin film transistor with a high on/off ratio can be provided.

Here, sputtering deposition is performed under the condition where an 8-inch-diameter target of an oxide semiconductor including In, Ga, and Zn (the ratio of $In_2O_3$:$Ga_2O_3$:ZnO is 1:1:1) is used, the distance between the target and the substrate is 170 mm, the pressure is set at 0.4 Pa, the direct current (DC) power supply is set at 0.5 kW, the deposition temperature is set to room temperature, and the argon gas flow rate is set at 40 sccm. Thus, a semiconductor film containing In, Ga, Zn, and oxygen as components is formed as the second oxide semiconductor film. Although the target where the composition ratio of $In_2O_3$:$Ga_2O_3$:ZnO is 1:1:1 is used intentionally, an oxide semiconductor film including a crystal grain which has a size of 1 nm to 10 nm just after the film formation is often formed.

Note that the presence or absence of crystal grains and the density of crystal grains can be controlled and the diameter of the crystal grain can be adjusted within 1 nm to 10 nm by adjusting, as appropriate, the deposition condition of reactive sputtering, the target composition ratio, the deposition pressure (0.1 Pa to 2.0 Pa), the electric power (250 W to 3000 W: 8 inches$\phi$), the temperature (room temperature to 100° C.), and the like. The thickness of the second oxide semiconductor film is set to 5 nm to 20 nm. Needless to say, in the case where the film includes crystal grains, the size of the crystal grains does not exceed the film thickness. In this embodiment, the second oxide semiconductor film has a thickness of 5 nm.

Then, a third photolithography process is performed. A resist mask is formed, and the first oxide semiconductor film and the second oxide semiconductor film are etched. Here, wet etching is performed using ITO07N (product of Kanto Chemical Co., Inc.) to remove an unnecessary portion; thus, the first oxide semiconductor layer 113 and the buffer layer 114 are formed. Note that the etching here may be dry etching, without being limited to wet etching.

As an etching apparatus used for the dry etching, an etching apparatus using a reactive ion etching method (an RIE method), or a dry etching apparatus using a high-density plasma source such as electron cyclotron resonance (ECR) or inductively coupled plasma (ICP) can be used. As a dry etching apparatus by which uniform electric discharge can be obtained over a wide area as compared to an ICP etching apparatus, there is an enhanced capacitively coupled plasma (ECCP) mode apparatus in which an upper electrode is grounded, and a lower electrode is connected to a high-frequency power source at 13.56 MHz, and further to a low-frequency power source at 3.2 MHz. This ECCP mode etching apparatus can be employed even when a substrate the length of which exceeds 3 m of the tenth generation substrate, is used for example. FIG. 5B shows a cross-sectional view at this step.

Then, a second conductive film 105 is formed over the buffer layer 114 and the gate insulating film 102 by a sputtering method or a vacuum evaporation method. As a material of the second conductive film 105, materials which are given as examples of a material of the gate electrode layer 111 can be used. Further, in the case where heat treatment at 200° C. to 600° C. is performed, the conductive film preferably has heat resistance for the heat treatment.

Here, the second conductive film 105 has a three-layer structure in which a Ti film is formed, an aluminum film containing Nd (an Al—Nd film) is stacked over the Ti film, and another Ti film is stacked thereover. Alternatively, the second conductive film 105 may have a two-layer structure in which a titanium film is stacked over a film containing aluminum as its first component. Further alternatively, the second conductive film 105 may have a single-layer structure of a titanium film or a film containing aluminum as its first component which also contains silicon. Note that in formation of the second conductive film 105, the second conductive film 105 is connected with the wiring layer 111_6 through the contact hole 125. FIG. 5C shows a cross-sectional view at this step.

Next, with use of a resist mask 131 formed using a fourth photomask, an unnecessary portion of the second conductive film 105 is etched away, so that a wiring and an electrode (a signal line, a capacitor wiring, an electrode including the source electrode layer and the drain electrode layer (115a_1 and 115b_1), and a terminal) are formed (see FIG. 5D). At this time, either wet etching or dry etching can be employed. Here, dry etching using a mixed gas of $SiCl_4$, $Cl_2$, and $BCl_3$ as a reactive gas is employed to etch the conductive film in which the Ti film, the Al—Nd film, and the Ti film are stacked, so that the source electrode layer and the drain electrode layer (115a_1 and 115b_1) are formed.

Next, the buffer layer 114 is etched using the same resist mask 131. Here, dry etching is performed as in the etching of the conductive film to remove an unnecessary portion; thus, the buffer layers 114a and 114b are formed. Note that the etching at this time is not limited to dry etching and may be wet etching. Wet etching can be conducted, for example, using ITO07N (product of Kanto Chemical Co., Inc.). In addition, although depending on the etching condition, an exposed region of the first oxide semiconductor layer 113 is also partly etched in this etching step of the buffer layer 114. Thus, a channel region of the first oxide semiconductor layer 113 between the buffer layers 114a and 114b is a region with a small thickness as illustrated in FIG. 5D.

Then, the resist mask 131 is removed. Note that the exposed region of the first oxide semiconductor layer 113_1 may be subjected to plasma treatment. By the plasma treatment, damage of the first oxide semiconductor layer 113 due to the etching can be repaired. The plasma treatment is preferably performed in an atmosphere of $O_2$ or $N_2O$, or preferably an atmosphere of $N_2$, He, or Ar which also contains oxygen. Alternatively, $Cl_2$ or $CF_4$ may be added to the above atmosphere. Note that the plasma treatment is preferably performed without bias.

Next, heat treatment at 200° C. to 600° C., typically 300° C. to 500° C., is preferably performed. Here, thermal treatment is performed in a furnace at 350° C. for one hour in a nitrogen atmosphere or an air atmosphere. This heat treatment causes rearrangement of the InGa—Zn—O-based non-single-crystal film which forms the oxide semiconductor film at the atomic level. Since the distortion that interrupts carrier movement is suppressed by this heat treatment, the thermal treatment at this time (including photo-annealing) is important. Note that there is no particular limitation on when to perform the heat treatment as long as it is performed after the formation of the first oxide semiconductor film; for example, it may be performed after the formation of a protective layer 128, which is formed later.

Through the above steps, the selection TFT 151 in which the first oxide semiconductor layer 113_1 is a channel formation region is formed. Note that while the selection TFT 151 is formed, the thin film transistors (152 and 153) are also formed in a similar manner.

Then, the first interlayer insulating film 109 and the second interlayer insulating film 121 are formed to cover the thin film transistors (151, 152, and 153). The first interlayer insulating film 109 and the second interlayer insulating film 121 can be formed using a silicon nitride film, a silicon oxide film, a silicon oxynitride film, an aluminum oxide film, an aluminum nitride film, an aluminum oxynitride film, or a tantalum oxide film which is formed by a sputtering method or the like. Further, an organic material having heat resistance, such as acrylic, polyimide, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. A siloxane-based resin may include, as a substituent, an organic group (e.g., an alkyl group, and an aryl group) or a fluoro group. The organic group may include a fluoro group. Note that a siloxane-based resin is a resin formed from a siloxane material as a starting material and having a bond of Si—O—Si. Note that in the case of a structure in which an area sensor formed over one surface of a light-transmitting substrate detects light which enters the light-transmitting substrate from the opposite surface and passes through the substrate, the first interlayer insulating film 109 and the second interlayer insulating film 121 should have a light-transmitting property.

The method for the formation of the first interlayer insulating film 109 and the second interlayer insulating film 121 is not limited to a particular method and the following method can be used depending on the material: a sputtering method, an SOG method, spin coating, dip coating, spray coating, a droplet discharge method (e.g., a jetting method, screen printing, or offset printing), a doctor knife, a roll coater, a curtain coater, a knife coater, or the like.

The first interlayer insulating film 109 and the second interlayer insulating film 121 may each be a stack of layers of those materials. Note that the second interlayer insulating film 121 is not always necessary and the photodiode 250 may be directly formed over the first interlayer insulating film 109.

Then, the contact hole 126 is formed in the first interlayer insulating film 109 and the second interlayer insulating film 121 with a fifth photomask. Further, in a step of baking the first interlayer insulating film 109 or the second interlayer insulating film 121, the oxide semiconductor layer is also annealed (at 300° C. to 400° C.); thus, an area sensor can be manufactured efficiently. FIG. 6A shows a cross-sectional view at this step.

Then, a third conductive film is formed using a material similar to the material for the gate electrode layer 111. A resist mask is formed using a sixth photomask and an unnecessary portion of the third conductive film is etched away; thus, the lower electrode layer 129 of the photodiode and a wiring layer 127 are formed. Here, a single layer of titanium is formed as the third conductive film, and then dry etching is conducted using a mixed gas of $BCl_3$ and $Cl_2$. A tapered shape with a taper angle of approximately 30° is formed here. Note that the taper angle can be reduced by hard baking of the resist.

Then, the protective layer 128 is formed. The protective layer 128 covers an end portion of the lower electrode layer 129 to prevent the semiconductor layer serving as the photoelectric conversion layer from being in contact with the end portion of the lower electrode layer 129. Thus, electric field concentration is prevented. Here, a seventh photomask and photosensitive polyimide are used to form the protective layer 128 which has high light transmittance and a small taper angle. FIG. 6B shows a cross-sectional view at this step.

Then, the first semiconductor film, the second semiconductor film, and the third semiconductor film are stacked in that order. Here, the first semiconductor film is a p-type semiconductor layer and is formed from an amorphous silicon film containing an impurity element imparting p-type conductivity. The first semiconductor film is formed with use of a semiconductor source gas containing an impurity element belonging to Group 13 (such as boron (B)) by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be added to the amorphous silicon film by a diffusion method or an ion injecting method. Heating or the like may be conducted after adding the impurity element by an ion injecting method or the like in order to diffuse the impurity element. In this case, as a method of forming the amorphous silicon film, an LPCVD method, a vapor deposition method, a sputtering method, or the like may be employed. The first semiconductor film is preferably formed to have a thickness of 10 nm to 50 nm, inclusive.

The second semiconductor film is an i-type semiconductor layer (intrinsic semiconductor layer) and is formed from an amorphous silicon film. As for formation of the second semiconductor film, an amorphous silicon film is formed with use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. As a method of forming the second semiconductor film, an LPCVD method, a vapor deposition method, a sputtering method, or the like may alternatively be employed. The second semiconductor film is preferably formed to have a thickness of 200 nm to 1000 nm, inclusive.

The third semiconductor film is an n-type semiconductor layer and is formed from an amorphous silicon film containing an impurity element imparting n-type conductivity. The third semiconductor film is formed with use of a semiconductor source gas containing an impurity element belonging to Group 15 (such as phosphorus (P)) by a plasma CVD method. As the semiconductor source gas, silane (SiH$_4$) may be used. Alternatively, Si$_2$H$_6$, SiH$_2$Cl$_2$, SiHCl$_3$, SiCl$_4$, SiF$_4$, or the like may be used. Further alternatively, an amorphous silicon film which does not contain an impurity element may be formed, and then, an impurity element may be added to the amorphous silicon film by a diffusion method or an ion injecting method. Heating or the like may be conducted after adding the impurity element by an ion injecting method or the like in order to diffuse the impurity element. In this case, as a method of forming the amorphous silicon film, an LPCVD method, a vapor deposition method, a sputtering method, or the like may be employed. The third semiconductor film is preferably formed to have a thickness of 20 nm to 200 nm, inclusive.

Further, the first semiconductor film, the second semiconductor film, and the third semiconductor film are not necessarily formed from an amorphous semiconductor, and they may be formed from a polycrystalline semiconductor or a semiamorphous semiconductor (hereinafter, referred to as an SAS).

Note that an SAS refers to a semiconductor with an intermediate structure between an amorphous structure and a crystalline structure (including a single crystal structure and a polycrystal structure). The SAS is a semiconductor having a third state that is stable in terms of free energy and is a crystal having a short range order and lattice distortion and can be diffused in a non-single crystalline semiconductor film with its grain diameter of 0.5 nm to 20 nm. The SAS has a Raman spectrum shifted to a lower wavenumber side than 520 cm$^{-1}$, and diffraction peaks of (111) and (220) that are thought to be caused by a crystal lattice of Si are observed by X-ray diffraction. In addition, the SAS contains at least 1 atomic % of hydrogen or halogen to terminate dangling bonds. In this specification, such a semiconductor is referred to as a SAS for convenience. Moreover, a rare gas element such as helium, argon, krypton, or neon may be contained to further promote lattice distortion, so that stability is enhanced and a semiamorphous semiconductor with favorable characteristics can be obtained. Note that a microcrystalline semiconductor is also included in the SAS. The SAS can be obtained by glow discharge decomposition of a gas containing silicon. As a typical gas containing silicon, silane (SiH$_4$), and Si$_2$H$_6$, SiH$_2$Cl$_2$, SiHCl$_3$, SiCl$_4$, SiF$_4$, and the like may also be used. When the gas containing silicon is diluted with hydrogen or with a gas in which at least one of rare gas elements selected from helium, argon, krypton, or neon is added to hydrogen, SAS can be formed easily. It is preferable that the gas containing silicon is diluted 2-fold to 1000-fold. Further, the energy bandwidth can be adjusted to be 1.5 eV to 2.4 eV or 0.9 eV to 1.1 eV when a carbide gas such as CH$_4$ or C$_2$H$_6$, a germanium gas such as GeH$_4$ or GeF$_4$, F$_2$, or the like is mixed into the gas containing silicon.

Then, an eighth photolithography process is conducted to form a resist mask. Unnecessary portions of the first semiconductor film, the second semiconductor film, and the third semiconductor film are etched away, so that the first semiconductor layer 250$a$, the second semiconductor layer 250$b$, and the third semiconductor layer 250$c$ are formed. Here, dry etching is conducted using a mixed gas of CF$_4$ and Cl$_2$, a mixed gas of CF$_4$ and O$_2$, or a mixed gas of CHF$_3$ and He, so that etching residue is not left over a tapered portion.

Then, the third interlayer insulating film 221 is formed. The third interlayer insulating film 221 is formed from an insulating material but the material or forming method is not limited particularly. For example, the third interlayer insulating film 221 may be formed from a material which is used for the first interlayer insulating film 109 and the second interlayer insulating film 121. As a material used for the formation of the third interlayer insulating film 221, a silicon oxide based material, a silicon nitride based material, a siloxane resin, or the like can be given. Here, a ninth photomask and a photosensitive polyimide resin are used for forming the third interlayer insulating film 221. The third insulating film 221 has the contact hole 233 reaching the lower electrode layer 129, the contact hole 232 reaching the third semiconductor layer 250$c$, and the contact hole 231 reaching the wiring layer 127. FIG. 6C shows a cross-sectional view at this step.

Then, a fourth conductive film is formed using a material similar to the material for the gate electrode layer 111. A resist mask is formed using a tenth photomask and an unnecessary portion of the fourth conductive film is etched away; thus, the upper electrode layer 227 of the photodiode and the wiring layer 228 are formed. The upper electrode layer 227 is connected to the third semiconductor layer 250$c$ through the contact hole 232 and is connected to the wiring layer 127 through the contact hole 232. In addition, the wiring layer 228 is connected to the lower electrode layer 129 through the contact hole 233 and is connected to the common wiring which is not shown. Here, the fourth conductive film is formed by stacking a film containing aluminum as its main component and a titanium film by a sputtering method. FIG. 6D shows a cross-sectional view at this step.

Note that in the case where many area sensors are formed over a large substrate, the substrate is cut with a dividing apparatus to separate the area sensors. In the case where many line sensors or photosensors are formed over a large substrate, the substrate is also cut so that the line sensors or photosensors can be used separately.

In the above manner, the area sensor including a pin photodiode as a photoelectric conversion element and an amplifier circuit having a thin film transistor including an oxide semiconductor containing indium, gallium, and zinc can be formed.

Note that in addition to the above structure in which an area sensor formed over one surface of a light-transmitting substrate detects light which enters the light-transmitting substrate from the opposite surface and passes through the substrate, a structure in which light directly reaches the area sensor formed over the substrate is also within the scope of one embodiment of the present invention. Specifically, if the upper electrode layer 227 having a light-transmitting property is formed by using a light-transmitting conductive film as the fourth conductive film, an area sensor whose light-receiving plane is on the third semiconductor layer 250$c$ side can be formed. In such a case, note that light passing through the substrate and approaching the first semiconductor layer 250$a$ is disturbance light; therefore, it is preferable that the lower electrode layer 129 is formed using a light-blocking conductive film and is extended to be provided between the second interlayer insulating film 121 and the first semiconductor layer.

The amplifier circuits described in this embodiment include the thin film transistors including an oxide semiconductor containing indium, gallium, and zinc with high field-effect mobility and small characteristic variations and therefore have small characteristic variations and occupy a small area. An area sensor including such amplifier circuits for photodiodes can convert intensity distribution of light received by the photodiodes into electrical signals with high reproducibility and output the electrical signals. Further, since the thin film transistors including an oxide semiconductor containing indium, gallium, and zinc can be easily arranged in a matrix over a large substrate, a large area sensor can be provided.

Embodiment 3

In this embodiment, a manufacturing process for an embodiment of an area sensor which is different from that of Embodiment 2 is described with reference to FIGS. 7A to 7D. In this embodiment, light directly reaches an area sensor which is formed over a substrate.

By the method described in Embodiment 2, an amplifier circuit which includes a thin film transistor including an oxide semiconductor containing indium, gallium, and zinc, the first interlayer insulating film 109, and the second interlayer insulating film 121 are formed over the substrate using four photomasks. FIG. 7A shows a cross-sectional view at this step. Note that if a structure in which light directly reaches the area sensor formed over the substrate is employed, the substrate 100, the gate insulating film 102, the first interlayer insulating film 109, and the second interlayer insulating film 121 are not always required to have a light-transmitting property. Further, the second interlayer insulating film 121 is not always necessary and the photodiode 251 may be directly formed over the first interlayer insulating film 109.

Then, the contact hole 126 which reaches the source electrode layer 115b_3 of the reset TFT 153 is formed in the first interlayer insulating film and the second interlayer insulating film using a resist mask which is formed using a fifth photomask in this embodiment.

Then, a third conductive film is formed using a material similar to the material for the gate electrode layer 111 described in Embodiment 2. A resist mask is formed using a sixth photomask in this embodiment and an unnecessary portion of the third conductive film is etched away; thus, the lower electrode layer 129 of the photodiode is formed. Further, the lower electrode layer 129 is connected to the amplifier circuit through the contact hole 126. Here, a single layer of titanium is formed as the third conductive film, and then dry etching is conducted using a mixed gas of $BCl_3$ and $Cl_2$. FIG. 7B shows a cross-sectional view at this step.

Then, the first semiconductor film, the second semiconductor film, and the third semiconductor film are stacked in that order. In this embodiment, the first semiconductor film is an n-type semiconductor layer and is formed from an amorphous silicon film containing an impurity element imparting n-type conductivity. The first semiconductor film is formed with use of a semiconductor source gas containing an impurity element belonging to Group 15 (such as phosphorus (P)) by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be added to the amorphous silicon film by a diffusion method or an ion injecting method. Heating or the like may be conducted after adding the impurity element by an ion injecting method or the like in order to diffuse the impurity element. In this case, as a method of forming the amorphous silicon film, an LPCVD method, a vapor deposition method, a sputtering method, or the like may be employed. The first semiconductor film is preferably formed to have a thickness of 20 nm to 200 nm, inclusive.

The second semiconductor film is an i-type semiconductor layer (intrinsic semiconductor layer) and is formed from an amorphous silicon film. As for formation of the second semiconductor film, an amorphous silicon film is formed with use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. As a method of forming the second semiconductor film, an LPCVD method, a vapor deposition method, a sputtering method, or the like may alternatively be employed. The second semiconductor film is preferably formed to have a thickness of 200 nm to 1000 nm, inclusive.

The third semiconductor film is a p-type semiconductor layer and is formed from an amorphous silicon film containing an impurity element imparting p-type conductivity. The third semiconductor film is formed with use of a semiconductor source gas containing an impurity element belonging to Group 13 (such as boron (B)) by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be added to the amorphous silicon film by a diffusion method or an ion injecting method. Heating or the like may be conducted after adding the impurity element by an ion injecting method or the like in order to diffuse the impurity element. In this case, as a method of forming the amorphous silicon film, an LPCVD method, a vapor deposition method, a sputtering method, or the like may be employed. The third semiconductor film is preferably formed to have a thickness of 10 nm to 50 nm, inclusive.

Further, as in the description in Embodiment 2, the first semiconductor film, the second semiconductor film, and the third semiconductor film may be formed using a polycrystalline semiconductor or a semiamorphous semiconductor (hereinafter, referred to as an SAS) as an alternative to an amorphous semiconductor.

Then, a seventh photolithography process is conducted to form a resist mask. Unnecessary portions of the first semiconductor film, the second semiconductor film, and the third semiconductor film are etched away, so that a first semiconductor layer 251a, a second semiconductor layer 251b, and a third semiconductor layer 251c are formed. Here, dry etching is conducted using a mixed gas of $CF_4$ and $Cl_2$, a mixed gas of $CF_4$ and $O_2$, or a mixed gas of $CHF_3$ and He, so that etching residue is not left over a tapered portion.

Then, the third interlayer insulating film 221 is formed. The third interlayer insulating film 221 is formed from an insulating material. Here, the third interlayer insulating film 221 is formed using an eighth photomask and a photosensitive polyimide resin, as in Embodiment 2. The third insulating film 221 has a contact hole 225 reaching the third semiconductor layer 251c. FIG. 7C shows a cross-sectional view at this step.

Then, a fourth conductive film having a light-transmitting property is formed over the third semiconductor layer 251c and the third interlayer insulating film 221. As the fourth conductive film having a light-transmitting property, for example, a film of indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added can be given.

A resist mask is formed using a ninth photomask and an unnecessary portion of the fourth conductive film is etched away; thus, the upper electrode layer 227 of the photodiode is formed. Note that the upper electrode layer 227 is connected to the common wiring. FIG. 7D shows a cross-sectional view at this step.

Here, an nip photodiode is given as an example, in which an n-type amorphous silicon layer, an amorphous silicon layer having high resistance, and a p-type amorphous silicon layer are stacked as the first semiconductor layer 251a, the second semiconductor layer 251b, and the third semiconductor layer 251c, respectively. In addition, since the mobility of holes generated by the photoelectric effect is lower than that of electrons, an nip photodiode has better characteristics when a surface on the p-type semiconductor layer side is used as a light-receiving plane. Here, light approaching a plane of the substrate on which the amplifier circuit and the nip photodiode are formed is received by the photodiode 251 and is converted into electrical signals. Further, light approaching the semiconductor layer having a conductivity type opposite from that of the semiconductor layer on the light-receiving plane is disturbance light; therefore, the electrode layer on the semiconductor layer having the opposite conductivity type is preferably formed from a light-blocking conductive film. Note that a surface of the n-type semiconductor layer side can alternatively be used as the light-receiving plane.

In the above manner, the area sensor including an nip photodiode as a photoelectric conversion element and an amplifier circuit having a thin film transistor including an oxide semiconductor containing indium, gallium, and zinc can be obtained.

In the area sensor in this embodiment, a surface on the upper electrode layer 227 side is a light-receiving plane of the photodiode 251. Since an interlayer insulating film or the like is not stacked over the upper electrode layer 227, the amount of scattering of incident light at the interface between the layers is small; therefore, the intensity of light is not changed. Thus, the photodiode 251 is highly sensitive.

Although a structure in which light directly reaches the area sensor formed over the substrate without passing through the substrate is described above in this embodiment, a structure in which light which enters the light-transmitting substrate from one surface and passes through a substrate reaches an area sensor formed over the opposite surface of the light-transmitting substrate is also within the scope of one embodiment of the present invention. For example, if the lower electrode layer 129 having a light-transmitting property is formed by using a light-transmitting conductive film as the third conductive film, an area sensor whose light-receiving plane is on the first semiconductor layer 251a side can be formed. In such a case, note that light directly approaching the third semiconductor layer 251c without passing through the substrate is disturbance light; therefore, the upper electrode layer 227 is formed using a light-blocking conductive film to block the disturbance light approaching the third semiconductor layer 251c.

The amplifier circuits include the thin film transistors which include an oxide semiconductor containing indium, gallium, and zinc with high field-effect mobility and small characteristic variations and therefore have small characteristic variations and occupy a small area. An area sensor including such amplifier circuits for photodiodes can convert intensity distribution of light received by the photodiodes into electrical signals with high reproducibility and output the electrical signals. Further, since the thin film transistors including an oxide semiconductor containing indium, gallium, and zinc can be easily arranged in a matrix over a large substrate, a large area sensor can be provided.

Embodiment 4

In this embodiment, an example of an active matrix display device provided with an area sensor is described with reference to FIG. 8 to FIG. 10. In the active matrix display device provided with an area sensor, pixels are arranged in a matrix. Each of the pixels has a photoelectric conversion element, a display element, an amplifier circuit, and a driver circuit of the display element. The amplifier circuit and the driver circuit of the display element include a thin film transistor including an oxide semiconductor typified by an oxide semiconductor containing indium, gallium, and zinc. Note that in this embodiment, a display device which can display and capture full color images is given as an example.

The display device provided with an area sensor in this embodiment can be used as a display device in which display elements are arranged in a matrix. Additionally, the display elements arranged in a matrix can also be used as a lighting device. For example, when the display device provided with an area sensor is held in contact with an object and the display elements serve as a lighting device to light up the object, the area sensor converts light reflected by the object into an electrical signal; whereby the display device provided with an area sensor can be used as a contact area sensor. Note that an example is given here in which an organic light-emitting element utilizing electroluminescence is used as the display element, but the display element is not limited to a self-luminous type such as an organic light-emitting element. For example, a backlight of a liquid crystal element may be used as a lighting device for the object.

Note that in an organic light-emitting element, by application of voltage to a light-emitting element, electrons and holes are separately injected from a pair of electrodes into a layer containing a light-emitting organic compound, and thus current flows. Then, these carriers (electrons and holes) are recombined; thus, an organic compound having a light-emitting property is brought into an excited state. When the light-emitting organic compound returns to a ground state from the excited state, it emits light. Owing to such a mechanism, this light emitting element is referred to as a current-excitation light emitting element.

Figure 8:
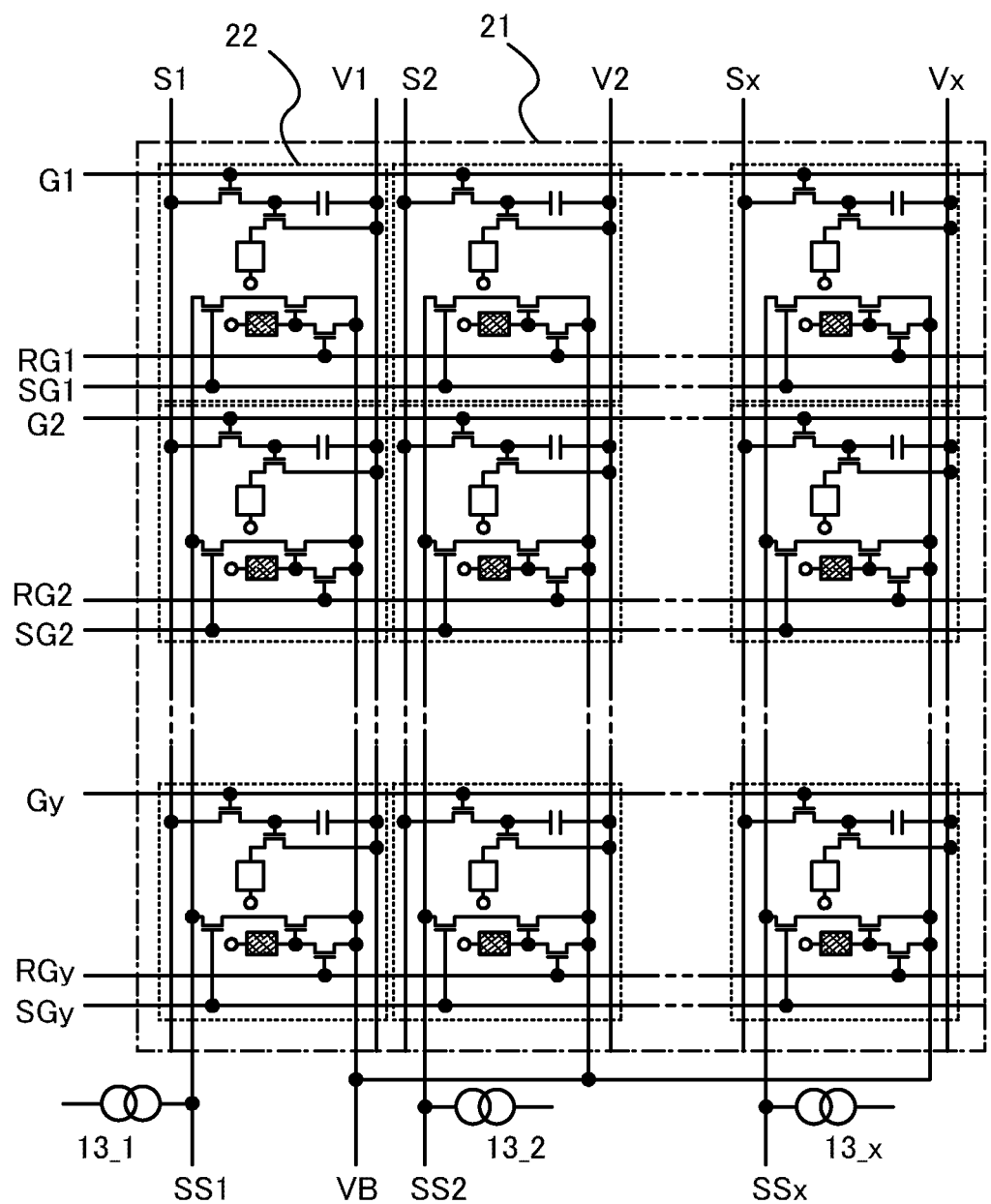
FIG. 8 is a circuit diagram of a display device provided with an area sensor.

FIG. 8 illustrates connections of source signal lines S1 to Sx, power supply lines V1 to Vx, gate signal lines G1 to Gy, the reset gate signal lines RG1 to RGy, the sensor gate signal lines SG1 to SGy, the sensor output wirings SS1 to SSx, the sensor power supply line VB, and a plurality of pixels 22; which are included in a display portion 21 provided with an area sensor.

In the display portion 21 provided with an area sensor, a plurality of pixels 22 are arranged in a matrix. Each of the pixels 22 is connected to one of the source signal lines S1 to Sx, one of the power supply lines V1 to Vx, one of the gate signal lines G1 to Gy, one of the reset gate signal lines RG1 to RGy, one of the sensor gate signal lines SG1 to SGy, one of the sensor output wirings SS1 to SSx, and the sensor power supply line VB.

The sensor output wirings SS1 to SSx are connected to the constant current power supplies 13_1 to 13_x, respectively.

Further, in the area sensor given as an example of this embodiment which can capture full color images, the display portion 21 provided with an area sensor has pixels of each of these colors, R (red) G (green), and B (blue). The pixels of RGB each include a display element and a photoelectric conversion element of the respective colors. As display elements of the colors of RGB, for example, three kinds of organic light-emitting elements emitting light of RGB may be provided, or combination of a white-light emission organic light-emitting element and three kinds of color filters or combination of an organic light-emitting element of blue or blue-green light and a phosphor (a phosphorous color conversion layer: CCM) may be provided. Further, a liquid crystal element and a color filter may be used.

As photoelectric conversion elements of the colors of RGB, combination of three kinds of color filters, RGB, and a photodiode can be employed. Here, a substrate provided with photodiodes arranged in a matrix and a counter substrate provided with color filters arranged in a matrix are positioned and attached; thus, photodiodes with color filters are formed. The color filters are arranged so that light passes through the color filters and reaches the photodiodes.

The pixel portion which is given as an example in this embodiment includes light-emitting elements arranged in a matrix which emit light of R, G, or B. The light-emitting elements which emit red light, the light-emitting elements which emit green light, and the light-emitting elements which emit blue light successively light up the object, and the photodiodes which are also included in the pixels detect light reflected by the object.

Figure 9:
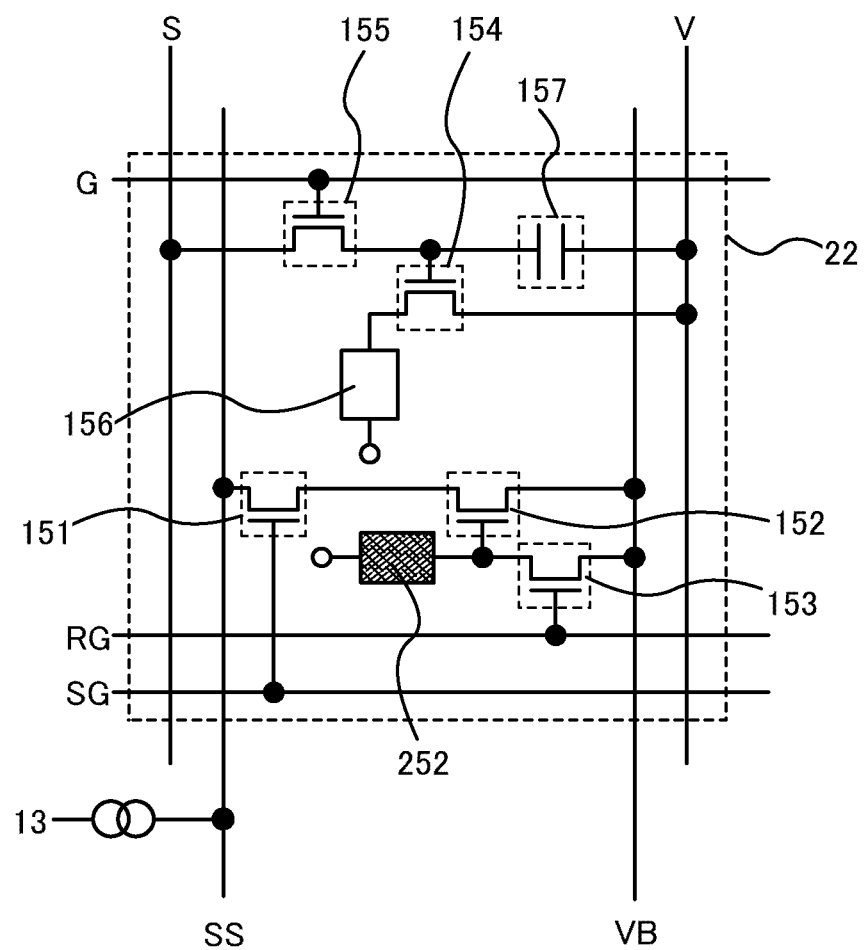
FIG. 9 is a circuit diagram of a pixel in a display device provided with an area sensor.
Figure 10:
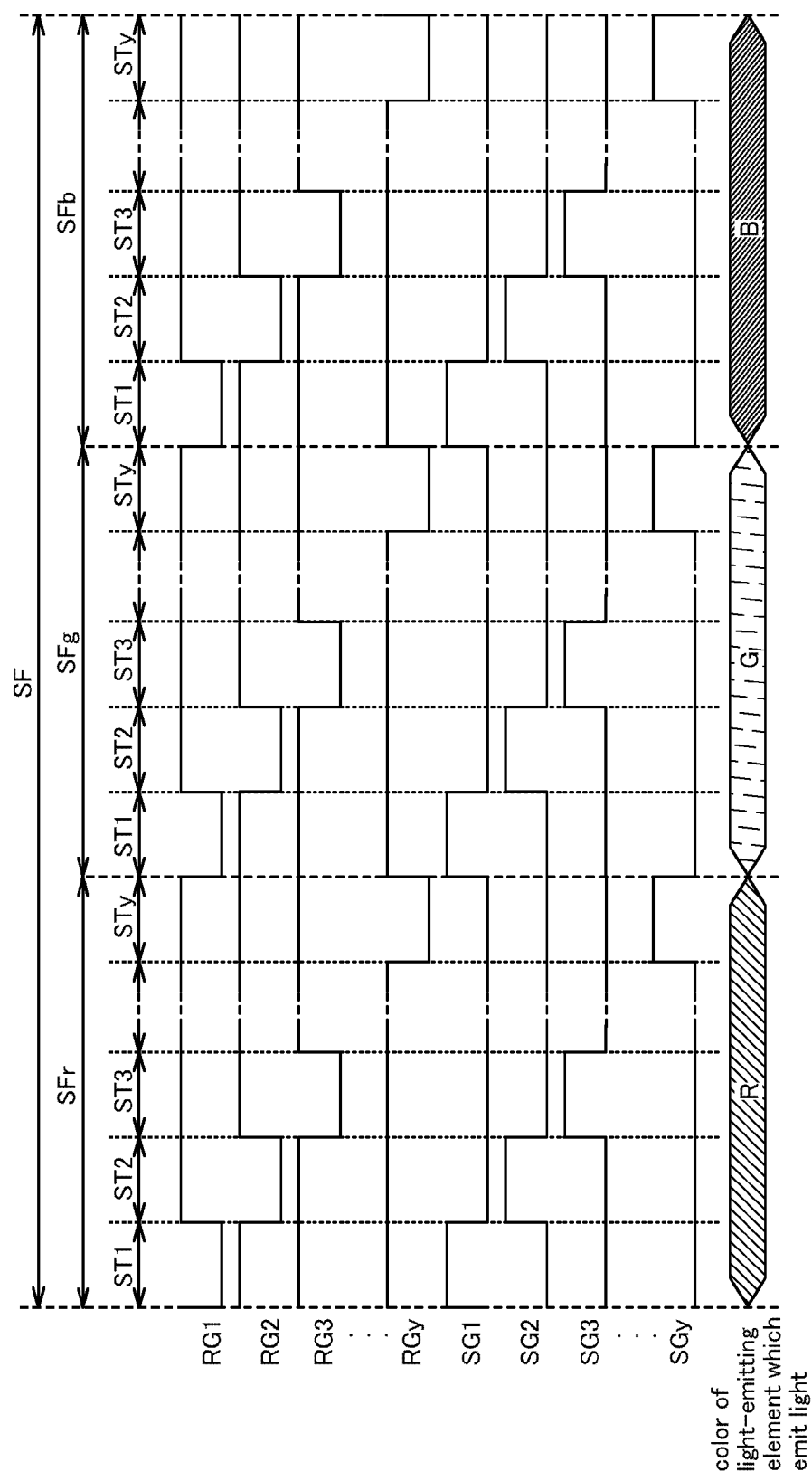
FIG. 10 is a timing diagram of an area sensor capturing a color image.

FIG. 9 illustrates an example of connections of a photoelectric conversion element, an organic light-emitting element, an amplifier circuit, and a driver circuit of the display element in the pixel portion, in which the amplifier circuit and the driver circuit of the display element include a thin film transistor including an oxide semiconductor containing indium, gallium, and zinc. A source signal line S is one of the source signal lines S1 to Sx. A power supply line V is one of the power supply lines V1 to Vx. A gate signal line G is one of the gate signal lines G1 to Gy. A reset gate signal line RG is one of the reset gate signal lines RG1 to RGy. A sensor gate signal line SG is one of the sensor gate signal lines SG1 to SGy. A sensor output wiring SS is one of the sensor output wirings SS1 to SSx. Further, the pixel 22 includes an EL-driving TFT 154, a switching TFT 155, and an organic light-emitting element 156. Additionally, the pixel 22 includes the selection TFT 151, the amplifying TFT 152, the reset TFT 153 for the photodiode, and a photodiode 252. Note that a capacitor 157 provided in the pixel 22 in FIG. 9 is optional and may be omitted.

The organic light-emitting element 156 includes an anode, a cathode, and a layer 416 containing a light-emitting material provided between the anode and the cathode. Here, the anode (pixel electrode) of the organic light-emitting element 156 is connected to a source region of the EL-driving TFT 154 and the cathode of the organic light-emitting element 156 is connected to a common electrode.

A gate electrode of the switching TFT 155 is connected to the gate signal line G. One of a source electrode and a drain electrode of the switching TFT 155 is connected to the source signal line S, and the other one is connected to a gate electrode of the EL-driving TFT 154.

One of a source electrode and a drain electrode of the EL-driving TFT 154 is connected to the power supply line V, and the other one is connected to the organic light-emitting element 156. The capacitor 157 is connected to the gate electrode of the EL-driving TFT 154 and the power supply line V.

The selection TFT 151, the amplifying TFT 152, the reset TFT 153, the photodiode 252, the gate signal line RG, the sensor gate signal line SG, the sensor power supply line VB, and the sensor output wiring SS for the photodiode and the amplifier circuit are connected as in Embodiment 1. The sensor output wiring SS is connected to the constant current power supply 13 (one of the constant current power supplies 13_1 to 13_x) and is kept supplied with a fixed amount of current.

First, a method is described in which a video signal is input to the display device provided with an area sensor of this embodiment to control the organic light-emitting element with the video signal, whereby the display device provided with an area sensor is driven as a display device.

Here, the common wiring to which the cathode of the organic light-emitting element 156 is connected is set at a low power supply potential. The low power supply potential is a potential lower than a high power supply potential when the high potential of the power supply line V is a reference. As the low power supply potential, GND, 0 V, or the like may be employed, for example. A potential difference between the high power supply potential and the low power supply potential is applied to the organic light-emitting element 156 so that current flows through the organic light-emitting element 156, whereby the organic light-emitting element 156 emits light. Thus, potentials are set so that the difference between the high power supply potential and the low power supply potential is greater than or equal to a forward threshold voltage of the organic light-emitting element 156.

In the case of a voltage-input voltage driving method, a video signal is input to the gate of the EL-driving TFT 154 so that the EL-driving TFT 154 is either completely turned on or completely turned off. That is, the EL-driving TFT 154 operates in a linear region. Since the EL-driving TFT 154 operates in a linear region, voltage higher than the voltage of the power supply line V is applied to the gate of the EL-driving TFT 154. Note that voltage higher than or equal to the sum of the voltage of the power supply line and the Vth of the EL-driving TFT 154 is applied to the source signal line S.

In the case of performing analog grayscale driving instead of digital time grayscale driving, the same pixel structure as that in FIG. 8 can be used by changing signal input.

In the case of performing analog grayscale driving, voltage higher than or equal to the sum of the forward voltage of the organic light-emitting element 156 and the Vth of the EL-driving TFT 154 is applied to the gate of the EL-driving TFT 154. The forward voltage of the organic light-emitting element 156 indicates a voltage at which desired luminance is obtained, and includes at least a forward threshold voltage. Note that by inputting a video signal to allow the EL-driving TFT 154 to operate in a saturation region, current can flow in the organic light-emitting element 156. In order to drive the EL-driving TFT 154 in a saturation region, a potential of the power supply line V is set higher than a gate potential of the EL-driving TFT 154. When an analog video signal is used, current in accordance with the video signal flows in the organic light-emitting element 156, and the analog grayscale driving can be performed.

Note that the pixel structure is not limited to the structure shown in FIG. 9. For example, a switch, a resistor, a capacitor, a transistor, a logic circuit, or the like may be added to the pixel shown in FIG. 9.

Next, a method in which the display element is used as a lighting device of the area sensor for lighting up the object is described. Note that here, the case in which the organic light-emitting element 156 connected to the pixel 22 emits light in the sample period of the photodiode 252 is described. Specifically, the case in which the organic light-emitting elements in the pixels in the first line emit light during the sample period ST1 is described. Note that all the pixels may keep emitting light during the sensor frame period SF.

It is preferable that the display elements arranged in a matrix emit light with uniform intensity in either case where the display elements are driven as display devices or where the display elements are driven as a lighting device to light up the object. Unevenness in intensity of light may cause uneven display or uneven image capturing, which makes display and capture of images at high quality difficult. In the light-emitting element which is given as an example in this embodiment, uniformity in $I_d$-$V_{GS}$ characteristics of the EL-driving TFTs 154 is important. If the characteristics vary, uniform light emission can not be obtained from the organic light-emitting elements 156 which are arranged in a matrix.

Next, operation in which the area sensor which includes n-channel thin film transistors including an oxide semiconductor containing indium, gallium, and zinc as the selection TFT 151, the amplifying TFT 152, and the reset TFT 153, captures a color image is described with reference to the timing diagram in FIG. 10.

First, while the organic light-emitting elements in the pixels of R emit light, the sample period ST1 through the sample period STy finish. In the period in which the organic light-emitting elements in the pixels of R emit light, a period of time from the start of the sample period ST1 through the end of the sample period STy is called an R sensor frame period SFr. In the R sensor frame period SFr, image signals corresponding to R are taken into the area sensor. Note that in the R sensor frame period SFr, the pixels of G and B do not emit light. In other words, in the R sensor frame period SFr, the object reflects a part of red light which is delivered to the object and the photosensor captures the reflected light.

Then, while the organic light-emitting elements in the pixels of G emit light, the sample period ST1 through the sample period STy finish. In the period in which the organic light-emitting elements in the pixels of G emit light, a period of time from the start of the sample period ST1 through the end of the sample period STy is called a G sensor frame period SFg. In the G sensor frame period SFg, image signals corresponding to G are taken into the area sensor. Note that in the G sensor frame period SFg, the pixels of R and B do not emit light. In other words, in the G sensor frame period SFg, the object reflects a part of green light which is delivered to the object and the photosensor captures the reflected light.

Then, while the organic light-emitting elements in the pixels of B emit light, the sample period ST1 through the sample period STy finish. In the period in which the organic light-emitting elements in the pixels of B emit light, a period of time from the start of the sample period ST1 through the end of the sample period STy is called a B sensor frame period SFb. In the B sensor frame period SFb, image signals corresponding to B are taken into the area sensor. Note that in the B sensor frame period SFb, the pixels of R and G do not emit light. In other words, in the B sensor frame period SFb, the object reflects a part of blue light which is delivered to the object and the photosensor captures the reflected light.

The period of time which includes all the R sensor frame period SFr, the G sensor frame periods SFg, and the B sensor frame period SFb is called the sensor frame period SF. The area sensor captures one color image as an image signal in the sensor frame period SF.

Further, during each of the sample periods, organic light-emitting elements of the pixels of the respective colors are kept to emit light. It is important that, for example, in the sample period ST1 of the B sensor frame period SFb, the organic light-emitting element of the pixels of B among the pixels in the first line keep emitting light. Similarly, in each of the R, G, and B sensor frame periods (SFr, SFg, and SFb), the pixels of R, G, and B respectively keep emitting light.

The intensity of light reflected by the object which is converted into an electrical signal by the photodiode 252 is reflected on the gate potential of the amplifying TFT 152 when the reset TFT 153 is in an Off state and the selection TFT 151 is in an On state as in Embodiment 1. In the amplifying TFT 152, the gate potential is reflected on a potential of the source region. Thus, the intensity of light which the photodiode 252 receives is output to the sensor output wiring SS1. Therefore, the transistors for amplification of the photodiodes should have uniform characteristics. In the amplifier circuits which are given as an example in this embodiment, uniformity in $I_d$-$V_{GS}$ characteristics of the amplifying TFTs 152 is important. If the $I_d$-$V_{GS}$ characteristics vary, it is difficult to properly output intensity distribution of light received by the photodiodes 252 arranged in a matrix to the output wirings.

According to the above method, the photodiodes 252 can detect distribution of intensity of red light, green light, and blue light which are reflected by the object, in the respective sensor frame periods. That is, the image of the object can be color-separated using the emission colors of the light-emitting elements. Thus, if the light-emitting elements which emit red light, the light-emitting elements which emit green light, and the light-emitting elements which emit blue light successively light up the object; it is not required to prepare three kinds of photodiodes of R, G, and B. Accordingly, a step of forming a color filter on a light-receiving plane of the photodiode can be omitted.

Figure 11:
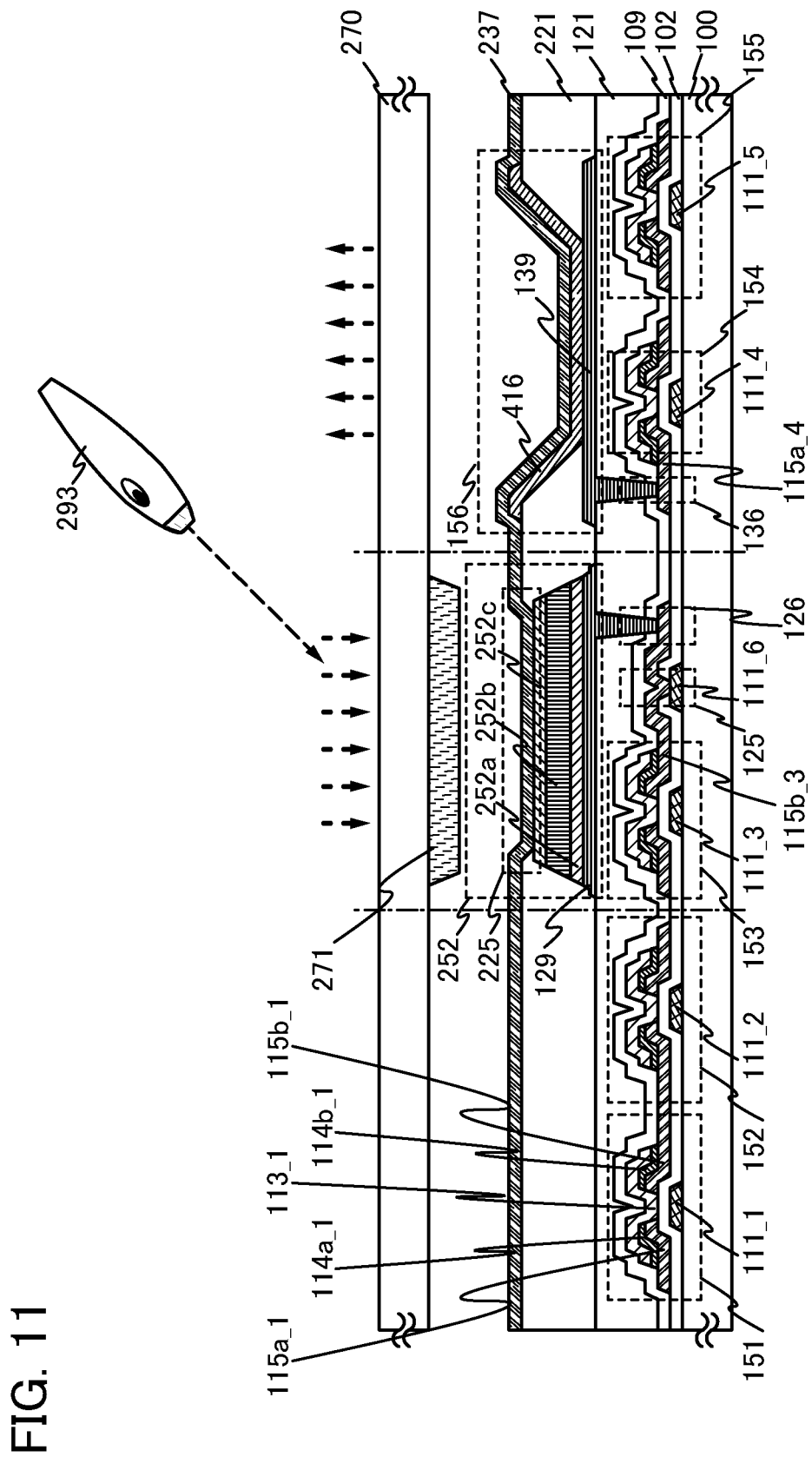
FIG. 11 is a cross-sectional view of a display device provided with an area sensor.

FIG. 11 is a cross-sectional view showing an example of a display device provided with an area sensor. Specifically, FIG. 11 is a cross-sectional view of a photodiode, an organic light-emitting element, an amplifier circuit, and a driver circuit of a display element. The amplifier circuit and the driver circuit of the display element include a thin film transistor including an oxide semiconductor containing indium, gallium, and zinc. A structural example of the area sensor is described with reference to FIG. 11. Note that an example of a thin film transistor including an oxide semiconductor containing indium, gallium, and zinc which has a different structure from that in Embodiment 1 is given here.

First, structures of the selection TFT 151, the amplifying TFT 152, the reset TFT 153, the EL-driving TFT 154, and the switching TFT 155 are described. Since main parts of the selection TFT 151, the amplifying TFT 152, the reset TFT 153, the EL-driving TFT 154, and the switching TFT 155 have the same structure, the selection TFT 151 is mainly described below.

The selection TFT 151, the amplifying TFT 152, the reset TFT 153, the EL-driving TFT 154, and the switching TFT 155 respectively include the gate electrode layer 111_1, the gate electrode layer 111_2, the gate electrode layer 111_3, a gate electrode layer 111_4, and a gate electrode layer 111_5 which are formed from the same layer as the reset gate signal line RG, the sensor gate signal line SG, and the gate signal line G. The gate electrode layer 111_1, the gate electrode layer 111_2, and the gate electrode layer 111_3 are formed over the substrate 100. The gate insulating film 102 is formed over the gate electrode layer 111_1, the gate electrode layer 1112, the gate electrode layer 111_3, the gate electrode layer 111_4, and the gate electrode layer 111_5.

The source electrode layer and the drain electrode layer (115a_1 and 115b_1) which are formed from the same layer as the sensor output wiring SS, the sensor power supply line VB, the source signal line S, and the power supply line V are formed over the gate insulating film 102. End portions of the source electrode layer and the drain electrode layer (115a_1 and 115b_1) overlap with the gate electrode layer 111_1.

The source electrode layer 115b_3 of the reset TFT 153 is directly connected to the wiring layer 111_6 through the contact hole 125 provided in the gate insulating film 102. By reducing the number of connections, not only the number of connection interfaces which may increase electric resistance, but an area occupied by the contact holes is reduced. Note that although not shown, the wiring layer 111_6 is connected to the gate electrode layer 111_2 of the amplifying TFT 152.

The first oxide semiconductor layer 113_1 is provided over the source electrode layer and the drain electrode layer (115a_1 and 115b_1) facing each other and overlaps with the gate electrode layer 111_1. In other words, the first oxide semiconductor layer 113_1 is provided so as to overlap with the gate electrode 111_1 and to be in contact with the upper surface portion of the gate insulating film 102, upper surface portions of the buffer layers 114a_1 and 114b_1, and side surface portions of the source electrode layer and the drain electrode layer (115a_1 and 115b_1).

The first oxide semiconductor layer is formed from the InGa—Zn—O-based non-single-crystal film which is described in Embodiment 1. The buffer layers (114a_1 and 114b_1) are also similar to the second oxide semiconductor layer which is described in Embodiment 1. The buffer layers are in contact with and provided between the source electrode layer and the drain electrode layer (115a_1 and 115b_1), and the first oxide semiconductor layer 113_1. The buffer layers have higher electrical conductivity than the first oxide semiconductor layer 113_1. Therefore, the buffer layers serve as a source region and a drain region in the selection TFT 151, the amplifying TFT 152, and the reset TFT 153, the EL-driving TFT 154, and the switching TFT 155. With such a structure, the selection TFT 151, the amplifying TFT 152, the reset TFT 153, the EL-driving TFT 154, and the switching TFT 155 can have improved thermal stability and can be operated stably. Accordingly, the function of the amplifier circuit can be improved and the operation can be stabilized. In addition, the amount of junction leakage is reduced and the characteristics of the selection TFT 151, the amplifying TFT 152, the reset TFT 153, the EL-driving TFT 154, and the switching TFT 155 can be improved.

In the selection TFT 151, the first interlayer insulating film 109 and the second interlayer insulating film 121 are provided in that order over the first oxide semiconductor layer 113_1 and the source electrode layer and the drain electrode layer (115a_1 and 115b_1). As for the amplifying TFT 152 and the reset TFT 153, the first interlayer insulating film 109 and the second interlayer insulating film 121 are also provided as in the selection TFT 151.

The contact hole 126 and a contact hole 136 are formed in the first interlayer insulating film 109 and the second interlayer insulating film 121. Through the contact hole 126, the lower electrode layer 129 of the photodiode connects the amplifier circuit to the photodiode 252. Through the contact hole 136, a pixel electrode layer 139 of the organic light-emitting element connects an EL-driving element to the organic light-emitting element 156.

As the photoelectric conversion element, the photodiode 252 is formed over the second interlayer insulating film 121 as in Embodiment 3. The photodiode 252 over the second interlayer insulating film 121 includes the lower electrode layer 129 formed from the third conductive layer and an upper electrode layer 237 formed from the fourth conductive layer. Between the lower electrode layer 129 and the upper electrode layer 237, a first semiconductor layer 252a, a second semiconductor layer 252b, and a third semiconductor layer 252c are stacked in that order over the second interlayer insulating film 121.

The lower electrode layer 129 of the photodiode 252 is connected to the source electrode layer 115b_3 of the reset TFT 153 through the contact hole 126 and is further connected to the wiring layer 111_6 through the contact hole 125. Although not shown, the wiring layer 111_6 is connected to the gate electrode layer 111_2 of the amplifying TFT 152.

The third interlayer insulating film 221 is formed over the second interlayer insulating film 121 and the photodiode 252. The contact hole 225 is formed in the third interlayer insulating film 221. Through the contact hole 225, the third semiconductor layer 252c and the upper electrode layer 237 are connected. The upper electrode layer 237 is also connected to the common wiring.

Here, an nip photodiode is given as an example, in which an n-type amorphous silicon layer, an amorphous silicon layer having high resistance, and a p-type amorphous silicon layer are stacked as the first semiconductor layer 252a, the second semiconductor layer 252b, and the third semiconductor layer 252c, respectively. In addition, since the mobility of holes generated by the photoelectric effect is lower than that of electrons, an nip photodiode has better characteristics when a surface on the p-type semiconductor layer side is used as a light-receiving plane. Here, light approaching a plane of the substrate on which the amplifier circuit and the nip photodiode are formed is received by the photodiode 252 and is converted into electrical signals. Further, light approaching the semiconductor layer having a conductivity type opposite from that of the semiconductor layer on the light-receiving plane is disturbance light; therefore, the lower electrode layer 129 is preferably formed from a light-blocking conductive film.

In the case of a pin photodiode in which a p-type amorphous silicon layer, an amorphous silicon layer having high resistance, and an n-type amorphous silicon layer are stacked as the first semiconductor layer 252a, the second semiconductor layer 252b, and the third semiconductor layer 252c, respectively, the lower electrode layer 129 of the photodiode 252 is connected to the common wiring, and the upper electrode layer 237 of the photodiode 252 is connected to the source electrode layer 115b_3 of the reset TFT 153 and further to the wiring layer 111_6 through the contact hole 125, as in Embodiment 1.

Further, the pixel electrode layer 139 of the display element is formed over the second interlayer insulating film 121. In this embodiment, the case where the organic light-emitting element 156 is given as the display element is described.

The third interlayer insulating film 221 is formed over end portions of the pixel electrode layer 139, the second interlayer insulating film 121, and the photodiode 252. The third interlayer insulating film 222 which covers the end portions of the pixel electrode layer 139 of the organic light-emitting element is called a bank and isolates the layers 416 containing a light-emitting material in neighboring organic light-emitting elements. Note that in this embodiment, an example in which the bank is formed from the same material as the third interlayer insulating film 221 which covers the photodiode 252 is described. However, the bank can be formed from a different material from the third interlayer insulating film 221. Alternatively, the pixel electrode layer 139 may be formed over the third interlayer insulating film 221 and the display element may be formed thereover.

In the organic light-emitting element 156 over the second interlayer insulating film 121, the layers 416 containing a light-emitting material is provided between the pixel electrode layer 139 formed from the third conductive layer and the upper electrode layer 237 formed from the fourth conductive layer.

The pixel electrode layer 139 of the organic light-emitting element 156 is connected to the source electrode layer 115a_4 of the EL-driving TFT 154 through the contact hole 136. Further, in this embodiment, the upper electrode layer 237 of the photodiode also serves as the upper electrode of the organic light-emitting element 156 and is connected to the common wiring. A counter substrate 270, which is a light-transmitting substrate on which color filters 271 are provided in a matrix, is attached so that the color filters 271 overlap with the corresponding photodiodes 252.

Thus, the display device provided with an area sensor which includes an nip photodiode as a photoelectric conversion element, an organic light-emitting element as a display element, an amplifier circuit, and a driver circuit of the display element is formed. The amplifier circuit and the driver circuit of the display element include a thin film transistor including an oxide semiconductor typified by an oxide semiconductor containing indium, gallium, and zinc. The display device provided with an area sensor given as an example in this embodiment can not only display images but also convert image information into electrical signals and output the electrical signals.

In the above embodiment, a structure is described where the light-emitting element of the display device provided with an area sensor over the substrate 100 lights an object on the counter substrate 270 side and light reflected by the object passes through the counter substrate 270 to be detected by the area sensor. Note that one embodiment of the present invention also includes a structure where the light-emitting element of the display device provided with an area sensor over one surface of the substrate 100 lights an object on the substrate 100 side opposite from the display device provided with an area sensor and light reflected by the object passes through the substrate 100 to be detected by the area sensor.

For example, if the lower electrode layer 129 having a light-transmitting property is formed by using a light-transmitting conductive film as the third conductive film, an area sensor whose light-receiving plane is on the first semiconductor layer 251a side can be formed. Further, if the gate electrodes, the source electrodes, and the drain electrodes of the selection TFT 151, the amplifying TFT 152, the reset TFT 153, the EL-driving TFT 154, and the switching TFT 155 are formed from a light-transmitting conductive film, the area sensor and the light-emitting element can be formed over those TFTs without reducing an aperture rate.

Note that light directly approaching the third semiconductor layer 251c without passing through the substrate is disturbance light; therefore, the upper electrode layer 237 is formed using a light-blocking conductive film to block the disturbance light approaching the third semiconductor layer 251c.

The amplifier circuits and the driver circuits of display elements include thin film transistors including an oxide semiconductor containing indium, gallium, and zinc with high field-effect mobility and small characteristic variations and therefore have small characteristic variations and occupy a small area.

In the display device provided with an area sensor which is given as an example of this embodiment, an amplifier circuit and a driver circuit of a display element are provided in each pixel together with a photodiode and the display element. Therefore, the display device provided with an area sensor can uniformly light the object with the mounted display elements, and intensity distribution of light received by the photodiodes arranged in a matrix can be output as electrical signals with high reproducibility. Further, images without unevenness can be displayed with the display elements arranged in a matrix. Further, since thin film transistors including an oxide semiconductor containing indium, gallium, and zinc can be easily arranged in a matrix over a large substrate, a large display device provided with an area sensor can be provided.

Further, the display device provided with an area sensor in this embodiment includes photoelectric conversion elements arranged in a matrix in a display surface; therefore, coordinate information can be input by pointing the display surface by an optical pointing device such as a laser pointer 293. For example, if the display device provided with an area sensor is used as a display device and also as an input device of a device capable of two-way communication, such as a computer or a cable television; coordinate information input to the photoelectric conversion element and coordinate information output to the display element can be associated. Additionally, since the laser pointer 293 is a wireless device and does not have to be put on a table or a flat place, it can allow higher degree of freedom of posture or position of its user. Besides, an effective presentation is possible by using an optical pointing device because a presenter can directly indicate the display and a pointer can immediately follow the presenter's movement. Further, if a plurality of laser pointers 293 emitting light of different wavelengths are used, a plurality of operations are possible with one display device provided with an area sensor.

Embodiment 5

In this embodiment, an example of a manufacturing process for the display device provided with an area sensor which is shown in FIG. 11 and described in Embodiment 4 is described with reference to FIGS. 12A to 12D, FIGS. 13A to 13D, and FIGS. 14A and 14B. Note that since main parts of the selection TFT 151, the amplifying TFT 152, the reset TFT 153, the EL-driving TFT 154, and the switching TFT 155, the manufacturing process of which is described with reference to FIGS. 12A to 12D, FIGS. 13A to 13D, and FIGS. 14A and 14B, have the same structure, a process for forming the selection TFT 151 is mainly described below.

A substrate similar to the substrate in Embodiment 2 can be used as the substrate 100 in this embodiment. An insulating film may be formed as a base film. Note that in this embodiment, a structure is mainly described where the light-emitting element of the display device provided with an area sensor over the substrate lights an object on the counter substrate 270 side and light reflected by the object passes through the counter substrate 270 to be detected by the area sensor.

A conductive film which is to be the gate electrode layer 111, the sensor output wiring SS, which is not shown, a gate wiring including the sensor power supply line VB, a capacitor wiring, and a terminal of a terminal portion is formed entirely over the substrate 100 by a method similar to that in Embodiment 2. Here, the conductive film which is to be the gate electrode layer 111 includes a film containing aluminum as its first component and a titanium film which are stacked by a sputtering method. Next, with use of a resist mask formed using a first photomask in this embodiment, an unnecessary portion of the conductive film formed over the substrate 100 is removed by etching; thus, a wiring and an electrode (a gate wiring including the gate electrode layer 111, a capacitor wiring, and a terminal) are formed. At this point, etching is performed so that at least an end portion of the gate electrode layer 111 is tapered.

The gate insulating film 102 in this embodiment is formed as in Embodiment 2. Here, a 100-nm-thick silicon oxide film is formed as the gate insulating film 102 by a plasma CVD method or a sputtering method.

Next, the gate insulating film 102 is etched with use of a resist mask formed using a second photomask in this embodiment, so that the contact hole 125 reaching the wiring layer 111_6 is formed. Note that the wiring layer 111_6 is connected to the gate electrode layer 111_2. FIG. 12A shows a cross-sectional view at this step.

Then, the conductive film 105 is formed over the gate insulating film 102 by a sputtering method or a vacuum evaporation method. The conductive film 105 which is to serve as a wiring and an electrode is formed from a conductive material similar to the materials in Embodiment 2. The thickness of the conductive film 105 to be a source electrode layer and a drain electrode layer is preferably 50 nm to 500 nm, inclusive. A thickness of 500 nm or less of the conductive film is effective for preventing break of a semiconductor film and a wiring to be formed later. Here, the conductive film 105 has a three-layer structure in which a Ti film is formed, an aluminum film including Nd, an Al—Nd film, is stacked over the Ti film, and another Ti film is stacked thereover. Note that in formation of the second conductive film 105, the second conductive film 105 is in contact with the wiring layer 111_6 through the contact hole 125.

Then, a buffer layer is formed. The buffer layer is formed using a second oxide semiconductor film 104 which has higher electrical conductivity than the first oxide semiconductor film. The second oxide semiconductor film 104 to be a buffer layer is preferably formed successively after the formation of the conductive film 105 without exposing the conductive film 105 to air. By successive film formation, the interface between the conductive film and the second oxide semiconductor film 104 can be prevented from being contaminated by air. Note that the second oxide semiconductor film 104 can be formed in a method similar to the method employed in Embodiment 2. FIG. 12B shows a cross-sectional view at this step.

Then, the resist mask 131 is formed over the second oxide semiconductor film 104 using a third photomask in this embodiment. An unnecessary portion of the second oxide semiconductor film 104 is etched away to form the buffer layers (114a_1 and 114b_1) using the resist mask 131 (see FIG. 12C). At this time, either dry etching or wet etching can be employed. Here, wet etching is conducted using ITO07N (product of Kanto Chemical Co., Inc.) to form the buffer layers (114a_1 and 114b_1).

Then, with the resist mask 131 which is used for forming the buffer layers (114a_1, 114b_1), an unnecessary portion of the conductive film 105 is etched away to form the first electrode layer, and the source electrode layer and the drain electrode layer (115a_1 and 115b_1). Here, dry etching using a mixed gas of $SiCl_4$, $Cl_2$, and $BCl_3$ as a reactive gas is employed to etch the conductive film in which an Al film and a Ti film are stacked in that order; thus, the source electrode layer and the drain electrode layer (115a_1 and 115b_1) are formed. Note that the etching here may be wet etching, without being limited to dry etching. FIG. 12C shows a cross-sectional view at this step.

After the resist mask 131 is removed, plasma treatment may be performed on the buffer layers (114a_1 and 114b_1) and the gate insulating film 102 prior to formation of the oxide semiconductor film 103. Here, reverse sputtering where plasma is generated after introduction of an oxygen gas and an argon gas is performed, so that the exposed gate insulating layer is subjected to treatment using oxygen radicals or oxygen. Thus, dust or impurities attaching to the surface are removed.

Following the plasma treatment, the oxide semiconductor film 103 containing indium, gallium, and zinc is formed without exposure to air. Formation of the oxide semiconductor film 103 without exposure to air is effective because it can prevent dust or impurities from attaching to the interface between the buffer layers (114a_1 and 114b_1) and the oxide semiconductor film 103, or the interface between the gate insulating film 102 and the oxide semiconductor film 103. Note that the oxide semiconductor film 103 may be formed in the chamber where the reverse sputtering is performed previously or in a different chamber, as long as the film formation can be performed without exposure to air.

Here, the first oxide semiconductor film 103 is formed using an oxide semiconductor target having a diameter of 8 inch and including In, Ga, and Zn (composition ratio is $In_2O_3:Ga_2O_3:ZnO=1:1:1$), in a manner similar to the manner in Embodiment 2. FIG. 12D shows a cross-sectional view at this step.

Next, with use of a resist mask 132 formed using a fourth photomask, unnecessary portions of the first oxide semiconductor film 103 and the buffer layers (114a_1 and 114b_1) are etched away. Here, wet etching is performed using ITO07N (product of Kanto Chemical Co., Inc.) to remove the unnecessary portion. The etching of the first oxide semiconductor film 103 and the buffer layers (114a_1 and 114b_1) may be dry etching, without being limited to wet etching. FIG. 13A shows a cross-sectional view at this step.

Then, after the resist mask 132 is removed, plasma treatment is performed on the first oxide semiconductor layer 113 as in Embodiment 2. By the plasma treatment, damage of the first oxide semiconductor layer 113 can be repaired.

Next, as in Embodiment 1, heat treatment at 200° C. to 600° C., typically 300° C. to 500° C., is preferably performed. Note that there is no particular limitation on when to perform the heat treatment as long as it is performed after the formation of the oxide semiconductor film; for example, it may be performed after the formation of the pixel electrode layer 139, which is formed later.

Through the above steps, the selection TFT 151 in which the first oxide semiconductor layer 113_1 is a channel formation region is formed. Note that while the selection TFT 151 is formed, the thin film transistors (152, 153, 154, and 155) are also formed in a similar manner.

Then, the first interlayer insulating film 109 covering the thin film transistors (152, 153, 154, and 155) and the second interlayer insulating film 121 over the first interlayer insulating film 109 are formed as in Embodiment 2. Further, if the oxide semiconductor layer is also subjected to the heat treatment (at 300° C. to 400° C.) in a step of baking the second interlayer insulating film 121, an area sensor can be manufactured efficiently.

Then, with use of a resist mask formed using a fifth photomask in this embodiment, the contact holes 126 and 136 are formed in the first interlayer insulating film and the second interlayer insulating film. The contact hole 126 reaches the source electrode layer 115b_3 of the reset TFT 153 and the contact hole 136 reaches the source electrode layer 115b_4 of the EL-driving TFT 154. FIG. 13B shows a cross-sectional view at this step.

Then, the third conductive film which is to be the lower electrode layer 129 of the photodiode and the pixel electrode layer 139 of the display element is formed. The third conductive film can be formed from a material similar to the material of the gate electrode layer 111 described in Embodiment 2. In the case where the pixel electrode layer 139 of the display element is used as an anode of the organic light-emitting element, a conductive film having a high work function is preferable as the third conductive film. In the case where the pixel electrode layer 139 is used as a cathode of the organic light-emitting element, a conductive film having a low work function is preferable as the third conductive film. The lower electrode layer 129 of the photodiode is connected to the amplifier circuit through the contact hole 126. The pixel electrode layer 139 of the display element is connected to the source electrode layer 115a_4 of the EL-driving TFT 154 through the contact hole 136.

After the third conductive film is formed, a resist mask is formed using a sixth photomask in this embodiment and an unnecessary portion of the third conductive film is etched away; thus, the lower electrode layer 129 of the photodiode and the pixel electrode layer 139 of the display element are formed. Here, a single layer of titanium is formed as the third conductive film, and then dry etching is conducted using a mixed gas of $BCl_3$ and $Cl_2$.

Then, the first semiconductor film, the second semiconductor film, and the third semiconductor film are stacked in that order over the lower electrode layer 129 of the photodiode. As in Embodiment 3, the first semiconductor film is an n-type semiconductor layer and is formed from an amorphous silicon film containing an impurity element imparting n-type conductivity, the second semiconductor film is an i-type semiconductor layer (intrinsic semiconductor layer) and is formed from an amorphous silicon film, and the third semiconductor film is a p-type semiconductor layer and is formed by an amorphous silicon film containing an impurity element imparting p-type conductivity.

Further, as in Embodiment 2, the first semiconductor film, the second semiconductor film, and the third semiconductor film may be formed using a polycrystalline semiconductor or a semiamorphous semiconductor (hereinafter, referred to as an SAS) as an alternative to an amorphous semiconductor.

Then, a seventh photolithography process is conducted to form a resist mask. Unnecessary portions of the first semiconductor film, the second semiconductor film, and the third semiconductor film are etched away, so that the first semiconductor layer 252a, the second semiconductor layer 252b, and the third semiconductor layer 252c are formed. Here, dry etching is conducted using a mixed gas of $CF_4$ and $Cl_2$, a mixed gas of $CF_4$ and $O_2$, or a mixed gas of $CHF_3$ and He, so that etching residue is not left over a tapered portion. FIG. 13C shows a cross-sectional view at this step.

Then, the third interlayer insulating film 221 is formed. The third interlayer insulating film 221 is formed from an insulating material. If the third interlayer insulating film 221 also serves as a bank which isolates the layers 416 containing a light-emitting material in neighboring organic light-emitting elements, an opening is formed so that the third interlayer insulating film 221 has a tapered end portion at the opening. Here, the third interlayer insulating film 221 is formed using an eighth photomask and a photosensitive polyimide resin or a positive photosensitive acrylic resin. Note that the reliability of the organic light-emitting element is significantly affected by moisture, oxygen, and other impurities remaining in a space in the element or a component such as the third interlayer insulating film 221. For example, in the case where the third interlayer insulating film 221 is formed from high molecular compounds, it is necessary to perform heat treatment at high temperatures to completely harden the third interlayer insulating film 221 so that impurities are not precipitated while the light-emitting element is used. Further, it is also necessary to perform heat treatment on the substrate before formation of the layer 416 containing a light-emitting material to remove as many impurities as possible. FIG. 13D shows a cross-sectional view at this step.

Then, the organic light-emitting element 156 is formed. The layer 416 containing a light-emitting material is formed over the pixel electrode layer 139, and a conductive film which is to be the upper electrode layer 237 is formed over the layer 416 containing a light-emitting material.

The layer 416 containing a light-emitting material may be either a single layer or a stack of plural layers. When the layer 416 containing a light-emitting material is a stack of plural layers, an anode layer, a hole-injecting layer, a hole-transporting layer, a light-emitting layer, an electron-transporting layer, an electron-injecting layer, and a cathode layer are stacked in that order to be in contact with each other. Note that it is not necessary to form all of these layers. Here, the pixel electrode layer 139 serves as an anode, and a hole-injecting layer, a hole-transporting layer, a light-emitting layer, an electron-transporting layer, an electron-injecting layer, and a cathode layer are stacked in that order.

The hole-injecting layer is a layer that has a function of assisting injection of holes from an electrode serving as an anode to the hole-transporting layer. Note that the hole-injecting layer is not always necessary. There are no particular limitations on a substance forming the hole-injecting layer and metal oxide such as vanadium oxide, niobium oxide, tantalum oxide, chromium oxide, molybdenum oxide, tungsten oxide, manganese oxide, rhenium oxide, or ruthenium oxide can be used. Alternatively, phthalocyanine ($H_2Pc$) or a phthalocyanine compound such as copper phthalocyanine (CuPc), or the like can be used. Alternatively, any of those substances for forming the hole-transport layer as mentioned above can also be used. Further alternatively, a high molecular compound such as a mixture of poly(ethylenedioxythiophene) and poly(styrene sulfonate) (PEDOT/PSS) can be used.

Still alternatively, for the hole-injecting layer, a composite material formed by combining an organic compound and an electron acceptor may be used. Such a composite material is superior in a hole-injecting property and a hole-transporting property, since holes are generated in the organic compound by the electron acceptor. In this case, the organic compound is preferably a material excellent in transporting the generated holes. Specifically, the foregoing substances for forming the hole-transporting layer (e.g., an aromatic amine-based compound) can be used for example. As the electron acceptor, a substance having an electron-accepting property to the organic compound may be used. Specifically, a transition metal oxide is preferable and examples thereof include vanadium oxide, niobium oxide, tantalum oxide, chromium oxide, molybdenum oxide, tungsten oxide, manganese oxide, rhenium oxide, and ruthenium oxide. Lewis acid such as iron chloride(III) or aluminum chloride(III) can also be used. Alternatively, an organic compound such as 7,7,8,8-tetracyano-2,3,5,6-tetrafluoroquinodimethane ($F_4$-TCNQ) can also be used. Note that the hole-injecting layer may have a multilayer structure in which two or more layers are stacked. In addition, the hole-injecting layer may also be formed by mixing two or more types of substances.

The hole-transporting layer is a layer that has a function of transporting holes injected from an anode to a light-emitting layer. The hole-transporting layer is provided to keep the anode away from the light-emitting layer; thus, quenching of light due to a metal can be prevented. Note that the hole-transporting layer is not always necessary.

Although there is no particular limitation on a substance forming the hole-transporting layer, any of the following substances can be typically used: an aromatic amine compound such as 4,4'-bis[N-(1-naphthyl)-N-phenylamino]biphenyl (NPB), 4,4'-bis[N-(3-methylphenyl)-N-phenylamino]biphenyl (TPD), 4,4'-bis[N-(9,9-dimethylfluoren-2-yl)-N-phenylamino]biphenyl (DFLDPBi), 4,4',4''-tris(N,N-diphenylamino)triphenylamine (TDATA), 4,4',4''-tris[N-(3-methylphenyl)-N-phenylamino]triphenylamine (m-MTDATA), and a high molecular compound such as poly(4-vinyl triphenylamine) (PVTPA).

Note that the hole-transporting layer may have a multilayer structure in which two or more layers are stacked. In addition, the hole-transporting layer may also be formed by mixing two or more types of substances.

The light-emitting layer contains a light-emitting substance. The light-emitting layer is preferably a mixed layer in which a substance having a higher excitation energy than the light-emitting substance is used as a dispersion medium (i.e., host) and the light-emitting substance is used as a dispersoied (i.e., guest). Here, an organic compound which emits fluorescence or phosphorescence is used as the light-emitting substance and a mixed material of a hole-transporting organic compound and an electron-transporting organic compound is used as a host.

The electron-transporting layer is a layer that has a function of transporting electrons injected from a cathode to a light-emitting layer. The electron-transporting layer is provided to keep the cathode away from the light-emitting layer; thus, quenching of light due to a metal can be prevented. Note that the electron-transporting layer is not always necessary.

Although there is no particular limitation on a substance forming the electron-transporting layer, any of the following substances can be typically used: metal complexes such as tris(8-quinolinolato)aluminum ($Alq_3$), tris(4-methyl-8-quinolinolato)aluminum ($Almq_3$), bis(10-hydroxybenzo[h]quinolinato)beryllium ($BeBq_2$), bis(2-methyl-8-quinolinolato)(4-phenylphenolato)aluminum (BAlq), bis[2-(2-hydroxyphenyl)benzoxazolato]zinc (ZnBOX), and bis[2-(2-hydroxyphenyl)benzothiazolato]zinc ($Zn(BTZ)_2$). Further, a heteroaromatic compound such as 2-(4-biphenylyl)-5-(4-tert-butylphenyl)-1,3,4-oxadiazole (PBD), 1,3-bis[5-(p-tert-butylphenyl)-1,3,4-oxadiazol-2-yl]benzene (OXD-7), 3-(4-tert-butylphenyl)-4-phenyl-5-(4-biphenylyl)-1,2,4-triazole (TAZ), 3-(4-tert-butylphenyl)-4-(4-ethylphenyl)-5-(4-biphenylyl)-1,2,4-triazole (p-EtTAZ), bathophenanthroline (BPhen), bathocuproine (BCP), or 4,4'-bis(5-methylbenzoxazol-2-yl)stilbene (BzOs) can also be used. Further, a high molecular compound such as poly(2,5-pyridine-diyl) (PPy) can also be used. Note that the electron-transporting layer may have a multilayer structure in which two or more layers are stacked. In addition, the electron-transporting layer may also be formed by mixing two or more types of substances.

The electron-injecting layer is a layer that has a function of assisting injection of electrons from an electrode serving as a cathode to the electron-transporting layer. Note that the electron-injecting layer is not always necessary.

There is no particular limitation on a substance forming the electron-injecting layer and an alkali metal compound or an alkaline-earth metal compound, such as lithium fluoride (LiF), cesium fluoride (CsF), calcium fluoride ($CaF_2$), or lithium oxide can be used. Alternatively, a rare earth metal compound such as erbium fluoride ($ErF_3$) can be used. Further, any of the above substances which can form the electron-transporting layer can be used.

Alternatively, for the electron-injecting layer, a composite material formed by combining an organic compound and an electron donor may be used. The composite material is superior in an electron-injecting property and an electron-transporting property, since electrons are generated in the organic compound by the electron donor. In this case, the organic compound is preferably a material excellent in transporting the generated electrons. Specifically, the foregoing materials for forming the electron-transporting layer (e.g., a metal complex or a heteroaromatic compound) can be used for example. As the electron donor, a substance exhibiting an electron donating property to the organic compound may be used. Specifically, an alkali metal, an alkaline-earth metal, and a rare earth metal are preferable. For example, lithium, cesium, magnesium, calcium, erbium, and ytterbium are given. Further, an alkali metal oxide or an alkaline-earth metal oxide is preferable and there are lithium oxide, calcium oxide, barium oxide, and the like are given. Alternatively, Lewis acid such as magnesium oxide can also be used. Further alternatively, an organic compound such as tetrathiafulvalene (TTF) can be used.

The layer 416 containing a light-emitting material of the organic light-emitting element includes one or more of the above layers and is formed by a method such as a vapor deposition method, an inkjet method, or an application method. Here, a shadow mask method is employed so that three kinds of layers 416 containing a light-emitting material are formed. The three kinds of organic light-emitting elements emitting light of RGB are arranged in a matrix.

Then, the fourth conductive film which is to be the upper electrode layer 237 of the photodiode and the organic light-emitting element is formed. Here, the photodiode 252 receives light from the upper electrode side and the organic light-emitting element 156 emit light to the upper electrode layer side; therefore, a light-transmitting conductive film is formed as the fourth conductive film. As a light-transmitting conductive film, for example, a film of indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added can be given.

A resist mask is formed using a ninth photomask and an unnecessary portion of the fourth conductive film is etched away; thus, the upper electrode layer 237 of the photodiode 251 and the organic light-emitting element 156 is formed. Here, as the fourth conductive film, an indium tin oxide film is formed by a sputtering method. Note that the upper electrode layer 237 is connected to the common wiring. FIG. 14A shows a cross-sectional view at this step.

Then, the counter substrate 270, which is a light-transmitting substrate on which color filters 271 are provided in a matrix, is prepared. The counter substrate 270 and the substrate provided with the TFTs, the photodiodes 252, and the organic light-emitting elements 156 are positioned so that color filters 271 overlap with the corresponding photodiodes 252, then, the substrates are attached to each other with a sealant. FIG. 14B shows a cross-sectional view at this step.

Thus, the display device provided with an area sensor which includes an nip photodiode as a photoelectric conversion element, an organic light-emitting element as a display element, an amplifier circuit, and a driver circuit of the display element can be obtained. The amplifier circuit and the driver circuit of the display element include a thin film transistor including an oxide semiconductor containing indium, gallium, and zinc.

In the area sensor in this embodiment, the organic light-emitting element 156 emits light to the upper electrode layer 237 side. Since an interlayer insulating film or the like is not stacked over the upper electrode layer 237, the amount of scattering of display light at the interface between the layers is small; therefore, the intensity of light is not changed. Thus, display light from the organic light-emitting element 156 can be effectively taken out.

The amplifier circuits and driver circuits of display elements include thin film transistors which include an oxide semiconductor containing indium, gallium, and zinc with high field-effect mobility and small characteristic variations and therefore have small characteristic variations and occupy a small area. An area sensor including such amplifier circuits for photodiodes can convert intensity distribution of light received by the photodiodes into electrical signals with high reproducibility and output the electrical signals. Further, a display device in which such a driver circuit is used for a light-emitting element can display images at high quality without display unevenness and can uniformly light up the object.

Embodiment 6

In this embodiment, an example, different from that in Embodiment 4, of an active matrix display device provided with an area sensor is described with reference to FIG. 15. In the active matrix display device provided with an area sensor, pixels are arranged in a matrix. Each of the pixels has a photoelectric conversion element, a display element, an amplifier circuit, and a driver circuit of the display element. The amplifier circuit and the driver circuit of the display element include a thin film transistor including an oxide semiconductor typified by an oxide semiconductor containing indium, gallium, and zinc. Note that in this embodiment, a display device which can display and capture full color images is given as an example.

The display device provided with an area sensor in this embodiment can be used as a display device in which display elements are arranged in a matrix. Further, the display device provided with an area sensor can also be used as a contact area sensor which can detect surface roughness of an object such as a finger touching the display device provided with an area sensor by utilizing scattered light. Note that an example in which a transmissive liquid crystal element is employed as the display element is given here without limitation.

Figure 15:
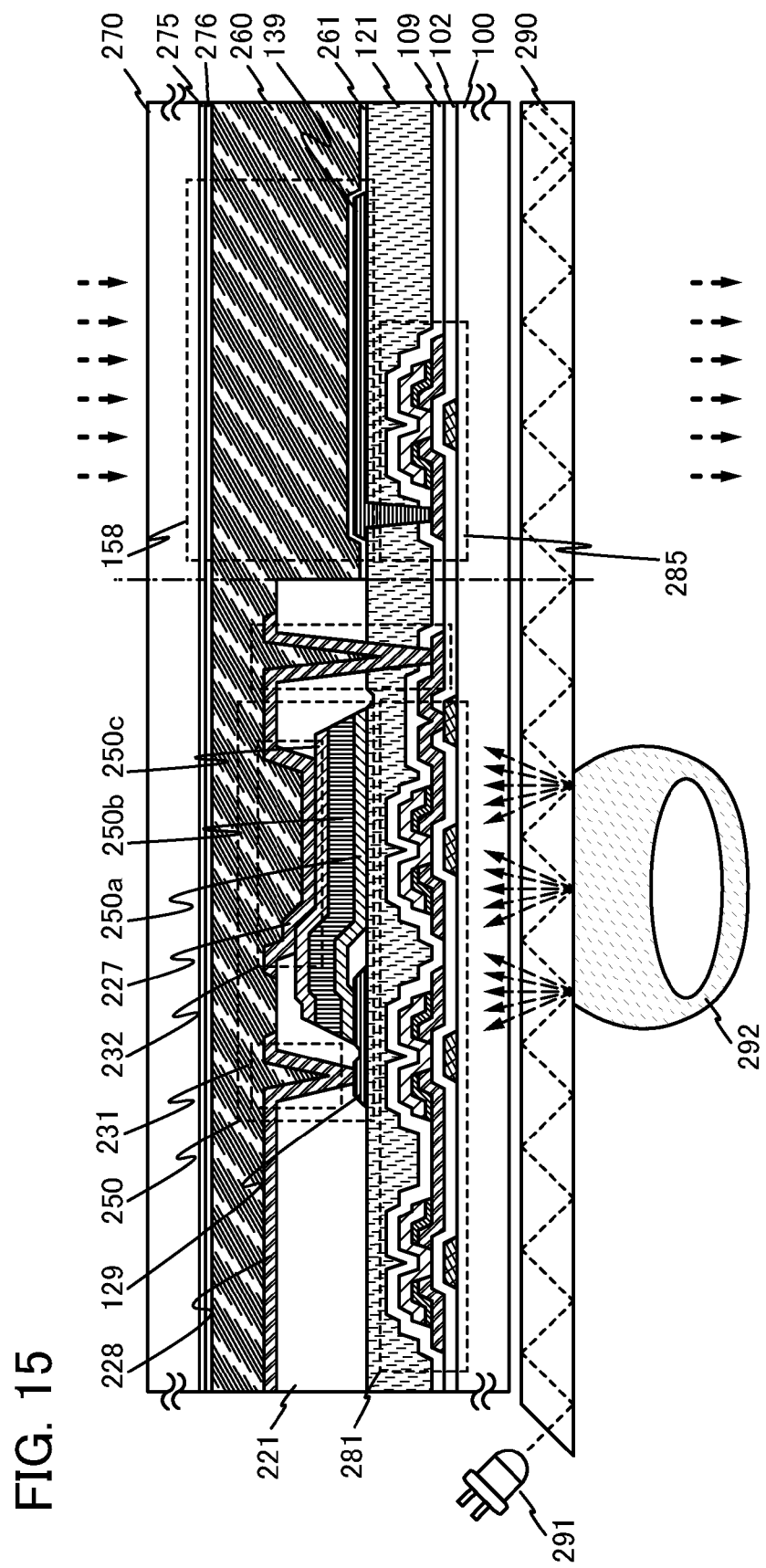
FIG. 15 is a cross-sectional view of a display device provided with an area sensor.

FIG. 15 is a cross-sectional view showing an example of the display device provided with an area sensor. Specifically, FIG. 15 is a cross-sectional view of the photodiode 250, a transmissive liquid crystal element 158, an amplifier circuit 281, and a driver circuit 285 of the liquid crystal element. The amplifier circuit 281 and the driver circuit 285 of the liquid crystal element include a thin film transistor including an oxide semiconductor containing indium, gallium, and zinc. Note that the amplifier circuit 281 and the driver circuit 285 of the liquid crystal element include the thin film transistor including an oxide semiconductor containing indium, gallium, and zinc whose structure is same as the structure described in Embodiment 4. Further, the photodiode 250 is a pin photodiode whose structure is same as the structure described in Embodiment 1.

The thin film transistor given as an example in this embodiment has the same structure as the thin film transistor in Embodiment 4. The steps up to the formation of the first interlayer insulating film 109 are similar to those described in Embodiment 5. Here, the second interlayer insulating film 121 also serves as a color filter.

The pixel electrode layer 139 of the liquid crystal element 158 and the lower electrode layer 129 of the pin photodiode 250 are formed from a light-transmitting conductive film over the second interlayer insulating film 121. As the light-transmitting conductive film material, an indium tin oxide alloy ($In_2O_3$—$SnO_2$, abbreviated as ITO), indium tin oxide containing silicon or silicon oxide, indium zinc oxide, zinc oxide, or the like can be used. The liquid crystal element 158 includes the pixel electrode layer 139, an alignment film 261, a layer containing a liquid crystal, an alignment film 276, and a counter electrode layer 275.

Further, the pin photodiode 250 is formed over the lower electrode layer 129 as in Embodiment 1. Here, a pin photodiode is given as an example, in which a p-type amorphous silicon layer, an amorphous silicon layer having high resistance, and an n-type amorphous silicon layer are stacked as the first semiconductor layer 250a, the second semiconductor layer 250b, and the third semiconductor layer 250c, respectively. In addition, since the mobility of holes generated by the photoelectric effect is lower than that of electrons, a pin photodiode has better characteristics when a plane on the p-type semiconductor layer side is used as a light-receiving plane. Here, a structure in which an area sensor formed over one surface of a light-transmitting substrate detects light which enters the light-transmitting substrate from the opposite surface and passes through the substrate is mainly described. Further, light approaching the semiconductor layer having a conductivity type opposite from that of the semiconductor layer on the light-receiving plane is disturbance light; therefore, the electrode layer on the semiconductor layer having the opposite conductivity type is preferably formed from a light-blocking conductive film. Note that a surface on the n-type semiconductor layer side can alternatively be used as the light-receiving plane.

In this embodiment, on a display surface of the display device provided with an area sensor, a light-guide plate 290 and a light source 291 such as an LED are provided. Light entering the light-guide plate from its end portion propagates in the light-guide plate through repeated total reflection at the interface between air and the light-guide plate. When an object 292 such as a finger touches a surface of the light-guide plate, light is irregularly reflected at that portion and leaked to the area sensor side. The area sensor receives the scattered light and positional information of the contacted portion and the surface feature of the object can be output as electrical signals.

Thus, the display device provided with an area sensor which includes a pin photodiode as a photoelectric conversion element, a transmissive liquid crystal element as a display element, an amplifier circuit, and a switching circuit of the display element can be obtained. The amplifier circuit and the switching circuit of the display element include a thin film transistor including an oxide semiconductor containing indium, gallium, and zinc. The display device provided with an area sensor can convert image information into electrical signals and output the electrical signals.

The amplifier circuits and driver circuits of display elements include thin film transistors which include an oxide semiconductor containing indium, gallium, and zinc with high field-effect mobility and small characteristic variations and therefore have small characteristic variations and occupy a small area. A display device provided with an area sensor in which such amplifier circuits, photodiodes, driver circuits of display elements, and the display elements are arranged in a matrix, can not only convert intensity distribution of light received by the photodiodes into electrical signals with high reproducibility and output the electrical signals but also serve as an optical touch screen with less malfunction. Additionally, the display device provided with an area sensor can be used as a display device which can display images without unevenness. Further, since the thin film transistors including an oxide semiconductor containing indium, gallium, and zinc can be easily arranged over a large substrate, a large display device provided with an area sensor can be provided.

Embodiment 7

A display device provided with an area sensor according to the present invention can be applied to an electronic paper. An electronic paper can be used for any electronic appliances of a variety of fields which display information. For example, an electronic paper can be used for electronic book readers (e-book readers), digital notepads, and the like. An example of such electronic appliances is illustrated in FIG. 16.

Figure 16:
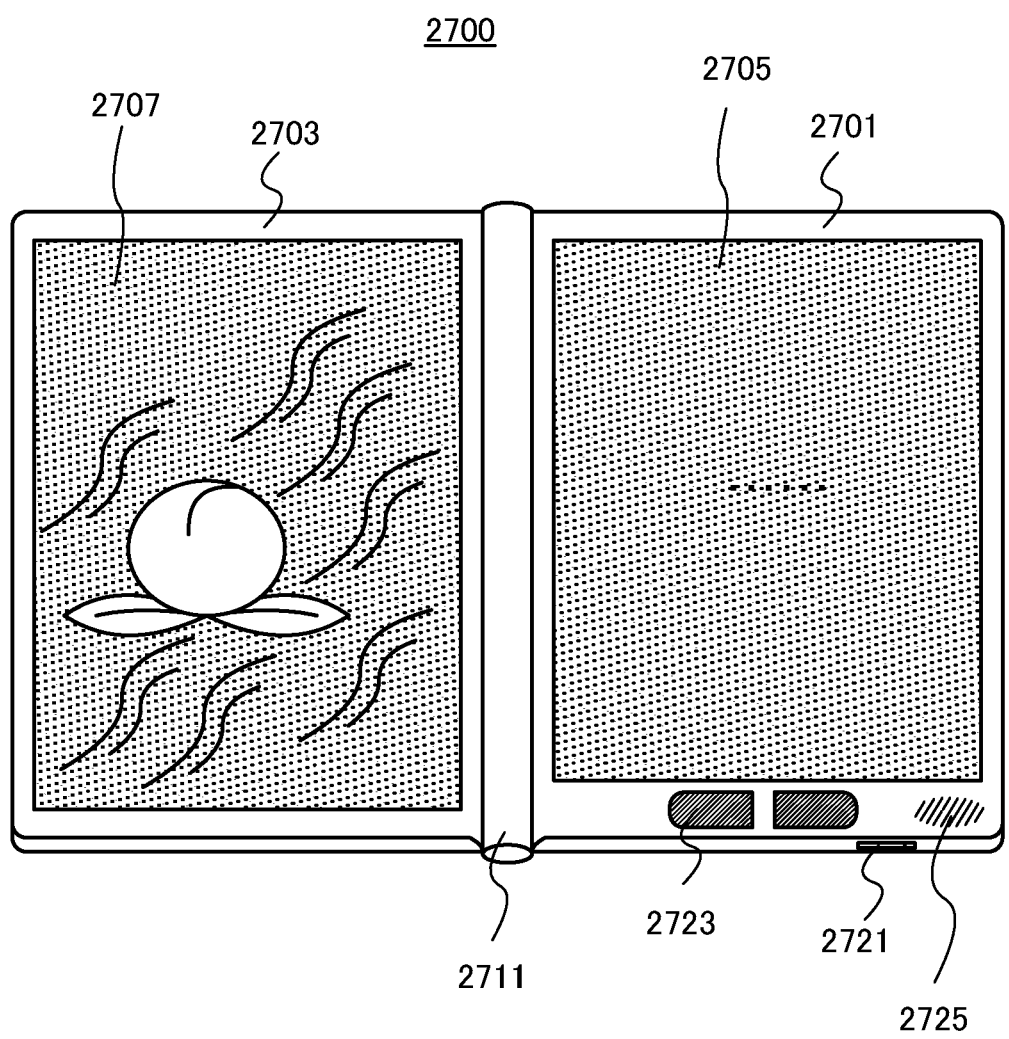
FIG. 16 is an external view of an example of an e-book reader.

FIG. 16 illustrates an example of an electronic book reader 2700. For example, the electronic book reader 2700 includes two housings 2701 and 2703. The housings 2701 and 2703 are combined with a hinge 2711 so that the electronic book reader 2700 can be opened and closed along the hinge 2711. With such a structure, the electronic book reader 2700 can be handled like a paper book.

A display portion 2705 is incorporated in the housing 2701 and a display portion 2707 is incorporated in the housing 2703. The display portion 2705 and the display portion 2707 may display one image, or may display different images. In the structure where different images are displayed on the display portion 2705 and the display portion 2707, for example, the right display portion (the display portion 2705 in FIG. 16) can display text and the left display portion (the display portion 2707 in FIG. 16) can display images.

FIG. 16 illustrates an example in which the housing 2701 is provided with an operation portion and the like. For example, the housing 2701 is provided with a power supply switch 2721, an operation key 2723, a speaker 2725, and the like. The page can be turned with the operation key 2723. Note that a keyboard, a pointing device, and the like may be provided on the same plane as the display portion of the housing. Further, a rear surface or a side surface of the housing may be provided with an external connection terminal (an earphone terminal, a USB terminal, a terminal which can be connected with a variety of cables such as an AC adapter or a USB cable, and the like), a storage medium inserting portion, or the like. Moreover, the electronic book reader 2700 may have a function of an electronic dictionary.

Further, the electronic book reader 2700 may send and receive information wirelessly. Desired book data or the like can be purchased and downloaded from an electronic book server wirelessly.

The electronic book reader having the display device provided with an area sensor can not only display images at high quality without unevenness, but also be used for taking notes by utilizing an area sensor. By touching the display device provided with an area sensor with a finger or a pointer such as a pen or a stylus with a light source on its tip, data can be input by handwriting.

Embodiment 8

A semiconductor device according to the present invention can be applied to a variety of electronic appliances (including game machines). Examples of electronic appliances are a television set (also referred to as a television or a television receiver), a monitor of a computer or the like, a camera such as a digital camera or a digital video camera, a digital photo frame, a cellular phone (also referred to as a mobile phone or a mobile phone set), a portable game console, a portable information terminal, an audio playback device, a large-sized game machine such as a pachinko machine, and the like.

Figure 17A:
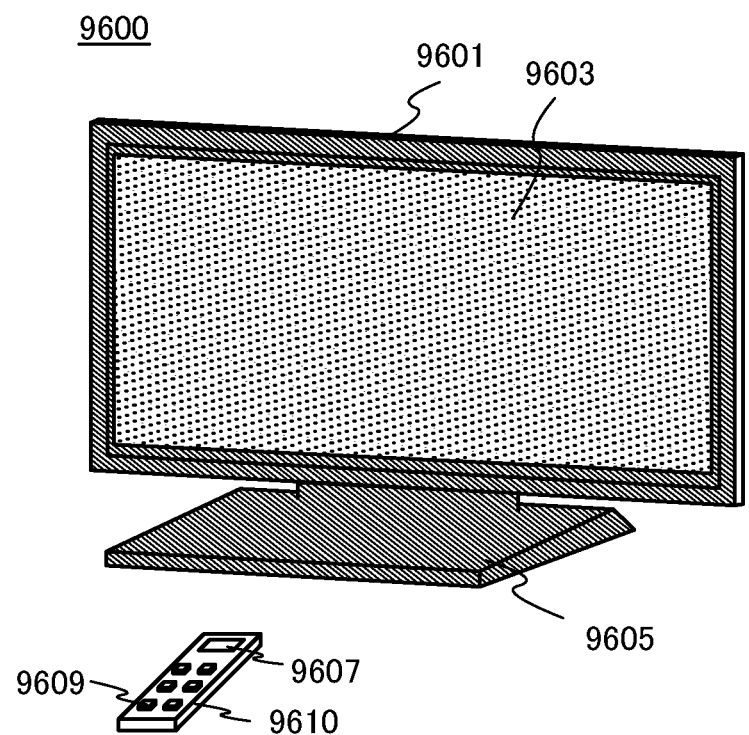
FIG. 17A is an external view of an example of a television device and FIG. 17B is an external view of an example of a digital photo frame.

FIG. 17A illustrates an example of a television device 9600. A display portion 9603 is incorporated in a housing 9601 of the television device 9600. The display portion 9603 can display images. Here, the housing 9601 is supported by a stand 9605.

The television device 9600 can be operated with an operation switch of the housing 9601 or a separate remote control 9610. The channel and volume can be controlled with operation keys 9609 of the remote control 9610 and images displayed on the display portion 9603 can be controlled. Moreover, the remote control 9610 may have a display portion 9607 on which the information outgoing from the remote control 9610 is displayed.

Note that the television device 9600 is provided with a receiver, a modem, and the like. With the receiver, general television broadcasting can be received. Moreover, when the display device is connected to a communication network with or without wires via the modem, one-way (from a sender to a receiver) or two-way (e.g., between a sender and a receiver or between receivers) information communication can be performed.

The television device having the display device provided with an area sensor can not only display images at high quality without unevenness, but also be used for two-way communication by utilizing an area sensor. By pointing to the display device provided with an area sensor with a laser pointer or the like which is mounted on the remote control and selecting displayed images, data can be input from a distance.

Figure 17B:
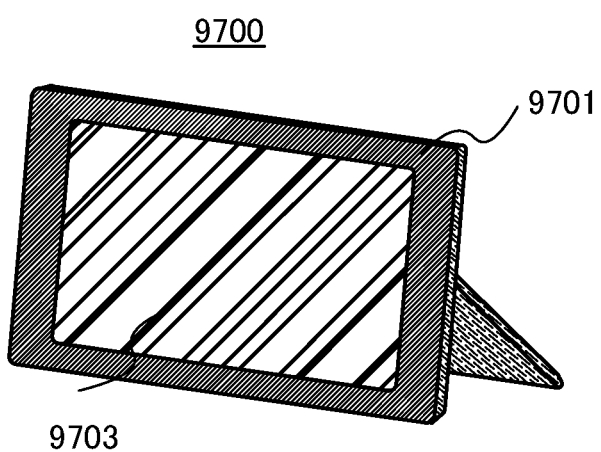

FIG. 17B illustrates an example of a digital photo frame 9700. For example, a display portion 9703 is incorporated in a housing 9701 of the digital photo frame 9700. The display portion 9703 can display a variety of images. For example, the display portion 9703 displays image data taken with a digital camera or the like, so that the digital photo frame can function in a manner similar to a general picture frame.

Note that the digital photo frame 9700 is provided with an operation portion, an external connection terminal (such as a USB terminal or a terminal which can be connected to a variety of cables including a USB cable), a storage medium inserting portion, and the like. They may be incorporated on the same plane as the display portion; however, they are preferably provided on a side surface or the rear surface of the display portion to improve the design. For example, a memory including image data taken with a digital camera is inserted into the storage medium inserting portion of the digital photo frame and the image data is imported. Then, the imported image data can be displayed on the display portion 9703.

The digital photo frame 9700 may send and receive information wirelessly. Via wireless communication, desired image data can be wirelessly imported into the digital photo frame 9700 and displayed.

The digital photo frame having the display device provided with an area sensor can display images at high quality without unevenness. In addition, it is possible to select a part of a displayed image by utilizing an area sensor. For example, a part of an image displayed on the display device provided with an area sensor can be selected by enclosing the part with a laser pointer or the like so that the selected part can be enlarged or cut out. In such a manner, the image can be controlled and processed variously.

Figure 18A:
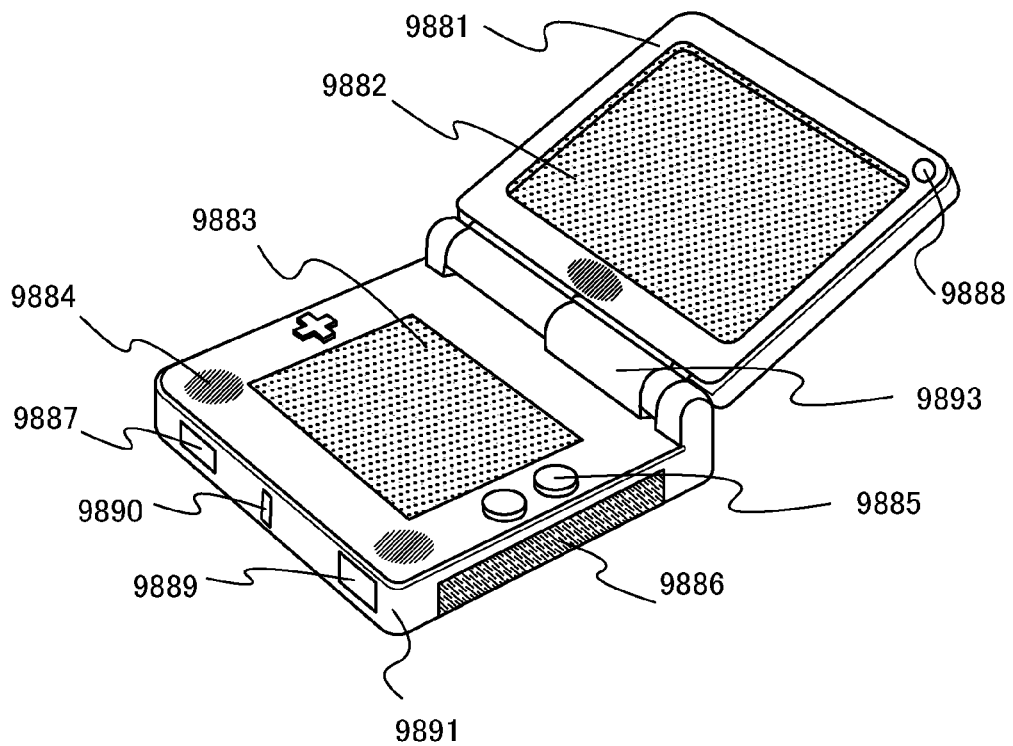
FIGS. 18A and 18B are external views of examples of an amusement machine.

FIG. 18A illustrates a portable game console including a housing 9881 and a housing 9891 which are jointed with a connector 9893 so as to be opened and closed. A display portion 9882 and a display portion 9883 are incorporated in the housing 9881 and the housing 9891, respectively. The portable game console illustrated in FIG. 18A additionally includes a speaker portion 9884, a storage medium inserting portion 9886, an LED lamp 9890, an input means (operation keys 9885, a connection terminal 9887, a sensor 9888 (having a function of measuring force, displacement, position, speed, acceleration, angular speed, rotational frequency, distance, light, liquid, magnetism, temperature, chemical substance, sound, time, hardness, electric field, current, voltage, electric power, radiation, flow rate, humidity, gradient, vibration, smell, or infrared ray), and a microphone 9889), and the like. Needless to say, the structure of the portable game console is not limited to the above, and may be any structure which is provided with at least a semiconductor device according to an embodiment of the present invention. Moreover, another accessory may be provided as appropriate. The portable game console illustrated in FIG. 18A has a function of reading a program or data stored in a storage medium to display it on the display portion, and a function of sharing information with another portable game console via wireless communication. The portable game console of FIG. 18A can have a variety of functions other than those above.

Figure 18B:
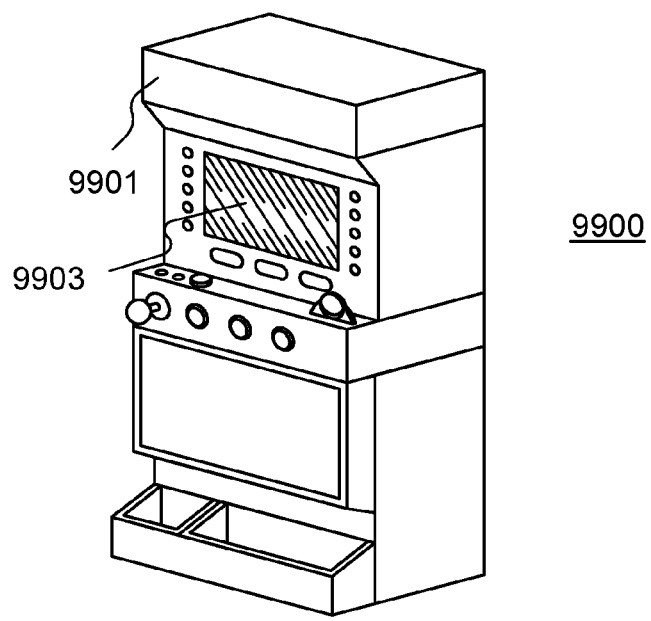

FIG. 18B illustrates an example of a slot machine 9900, which is a large game machine. A display portion 9903 is incorporated in a housing 9901 of the slot machine 9900. The slot machine 9900 additionally includes an operation means such as a start lever or a stop switch, a coin slot, a speaker, and the like. Needless to say, the structure of the slot machine 9900 is not limited to the above and may be any structure which is provided with at least a semiconductor device according to an embodiment of the present invention. Moreover, another accessory may be provided as appropriate.

Figure 19:
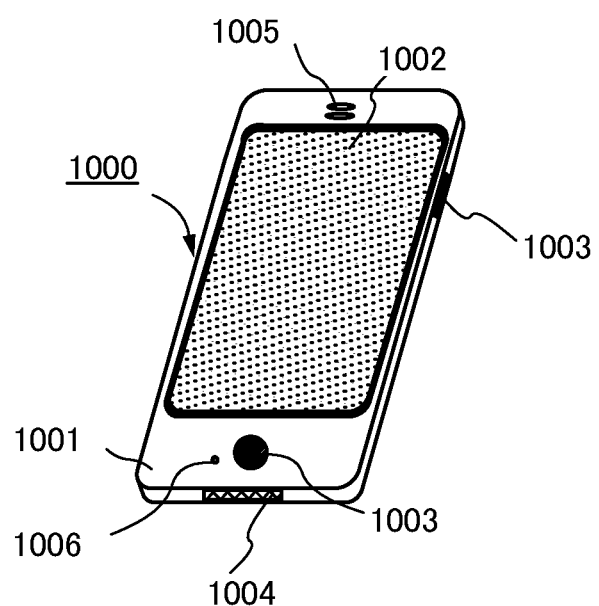
FIG. 19 is an external view of an example of a cellular phone.

FIG. 19 illustrates an example of a cellular phone 1000. The cellular phone 1000 includes a housing 1001 in which a display portion 1002 is incorporated, and moreover includes an operation button 1003, an external connection port 1004, a speaker 1005, a microphone 1006, and the like.

Information can be input to the cellular phone 1000 illustrated in FIG. 19 by touching the display portion 1002 with a finger or the like. Moreover, calling or text messaging can be performed by touching the display portion 1002 with a finger or the like.

There are mainly three screen modes of the display portion 1002. The first mode is a display mode mainly for displaying images. The second mode is an input mode mainly for inputting information such as text. The third mode is a display-and-input mode in which two modes of the display mode and the input mode are mixed.

For example, in the case of calling or text messaging, the display portion 1002 is set to a text input mode mainly for inputting text, and text input operation can be performed on a screen. In this case, it is preferable to display a keyboard or number buttons on almost the entire screen of the display portion 1002.

When a detection device including a sensor for detecting inclination, such as a gyroscope or an acceleration sensor, is provided inside the cellular phone 1000, display on the screen of the display portion 1002 can be automatically switched by judging the direction of the cellular phone 1000 (whether the cellular phone 1000 is placed horizontally or vertically for a landscape mode or a portrait mode).

Further, the screen modes are switched by touching the display portion 1002 or operating the operation button 1003 of the housing 1001. Alternatively, the screen modes can be switched depending on kinds of images displayed on the display portion 1002. For example, when a signal for an image displayed on the display portion is data of moving images, the screen mode is switched to the display mode. When the signal is text data, the screen mode is switched to the input mode.

Further, in the input mode, a signal is detected by an optical sensor in the display portion 1002 and if input by touching the display portion 1002 is not performed for a certain period, the screen mode may be controlled so as to be switched from the input mode to the display mode.

The display portion 1002 can also function as an image sensor. For example, an image of a palm print, a fingerprint, or the like is taken by touching the display portion 1002 with the palm or the finger, whereby personal authentication can be performed. Moreover, when a backlight or sensing light source which emits near-infrared light is provided in the display portion, an image of finger veins, palm veins, or the like can be taken. Further, by using at least one of the photosensors in the display portion 1002, the brightness of the display screen of the cellular phone can be adjusted depending on the brightness of the place where the cellular phone is used.

This application is based on Japanese Patent Application serial no. 2008-303487 filed with Japan Patent Office on Nov. 28, 2008, the entire contents of which are hereby incorporated by reference.

What is claimed is:

1. A photosensor comprising:
    a photoelectric conversion element including a photoelectric conversion layer, the photoelectric conversion layer including silicon; and
    an amplifier circuit including a thin film transistor, the thin film transistor comprising:
        an oxide semiconductor layer;
        buffer layers; and
        a source electrode and a drain electrode electrically connected to the oxide semiconductor layer with the buffer layers therebetween,
    wherein the oxide semiconductor layer and the buffer layers comprise indium, gallium, and zinc,
    wherein a ratio of indium, gallium, and zinc in the oxide semiconductor layer is the same as that in the buffer layers,
    wherein the oxide semiconductor layer is richer in oxygen than the buffer layers, and
    wherein the buffer layers consist of non-single crystalline oxide semiconductor including nanocrystal structure.

2. The photosensor according to claim 1,
wherein the buffer layers have higher electrical conductivity than the oxide semiconductor layer.

3. The photosensor according to claim 1,
wherein the oxide semiconductor layer and the buffer layers are formed by a sputtering method using oxygen gas and rare gas, and
wherein a ratio of oxygen gas to rare gas for the oxide semiconductor layer is higher than a ratio of oxygen gas to rare gas for the buffer layers.

4. A photosensor comprising:
a photoelectric conversion element including a photoelectric conversion layer, the photoelectric conversion layer comprising:
  a first semiconductor layer including an impurity element having one conductivity type;
  a second semiconductor layer in contact with the first semiconductor layer; and
  a third semiconductor layer in contact with the second semiconductor layer, wherein the third semiconductor layer includes an impurity element having a conductivity type opposite to the conductivity type of the first semiconductor layer; and
an amplifier circuit including at least a selection thin film transistor, an amplifying thin film transistor, and a reset thin film transistor, each thin film transistor comprising:
  an oxide semiconductor layer;
  buffer layers; and
  a source electrode and a drain electrode electrically connected to the oxide semiconductor layer with the buffer layers therebetween,
wherein the oxide semiconductor layer and the buffer layers comprise indium, gallium, and zinc,
wherein a ratio of indium, gallium, and zinc in the oxide semiconductor layer is the same as that in the buffer layers,
wherein the oxide semiconductor layer is richer in oxygen than the buffer layers,
wherein a gate electrode of the reset thin film transistor is electrically connectable to a reset gate signal line,
wherein one of the source electrode and the drain electrode of the reset thin film transistor is electrically connectable to a sensor power supply line,
wherein the other one of the source electrode and the drain electrode of the reset thin film transistor is electrically connectable to a gate electrode of the amplifying thin film transistor and one of an anode and a cathode of the photoelectric conversion element,
wherein one of the source electrode and the drain electrode of the amplifying thin film transistor is electrically connectable to the sensor power supply line,
wherein one of the source electrode and the drain electrode of the selection thin film transistor is electrically connectable to a sensor output wiring,
wherein the other one of the source electrode and the drain electrode of the selection thin film transistor is electrically connectable to the other one of the source electrode and the drain electrode of the amplifying thin film transistor,
wherein a gate electrode of the selection thin film transistor is electrically connectable to a sensor gate signal line, and
wherein the buffer layers consist of non-single crystalline oxide semiconductor including nanocrystal structure.

5. The photosensor according to claim 4,
wherein the reset thin film transistor and the selection thin film transistor are turned on or off according to signals input to the reset gate signal line and the sensor gate signal line.

6. The photosensor according to claim 4,
wherein the buffer layers have higher electrical conductivity than the oxide semiconductor layer.

7. The photosensor according to claim 4,
wherein the oxide semiconductor layer and the buffer layers are formed by a sputtering method using oxygen gas and rare gas, and
wherein a ratio of oxygen gas to rare gas for the oxide semiconductor layer is higher than a ratio of oxygen gas to rare gas for the buffer layers.

8. An area sensor comprising:
a plurality of pixels, each of the plurality of pixels comprising:
  a photoelectric conversion element including a photoelectric conversion layer, the photoelectric conversion layer comprising:
    a first semiconductor layer including an impurity element having one conductivity type;
    a second semiconductor layer in contact with the first semiconductor layer; and
    a third semiconductor layer in contact with the second semiconductor layer, wherein the third semiconductor layer includes an impurity element having a conductivity type opposite to the conductivity type of the first semiconductor layer; and
  an amplifier circuit including at least a selection thin film transistor, an amplifying thin film transistor, and a reset thin film transistor, each thin film transistor comprising:
    an oxide semiconductor layer;
    buffer layers; and
    a source electrode and a drain electrode electrically connected to the oxide semiconductor layer with the buffer layers therebetween,
  wherein the oxide semiconductor layer and the buffer layers comprise indium, gallium, and zinc,
  wherein a ratio of indium, gallium, and zinc in the oxide semiconductor layer is the same as that in the buffer layers,
  wherein the oxide semiconductor layer is richer in oxygen than the buffer layers,
  wherein a gate electrode of the reset thin film transistor is electrically connectable to a reset gate signal line,
  wherein one of the source electrode and the drain electrode of the reset thin film transistor is electrically connectable to a sensor power supply line,
  wherein the other one of the source electrode and the drain electrode of the reset thin film transistor is electrically connectable to a gate electrode of the amplifying thin film transistor and one of an anode and a cathode of the photoelectric conversion element,
  wherein one of the source electrode and the drain electrode of the amplifying thin film transistor is electrically connectable to the sensor power supply line,
  wherein one of the source electrode and the drain electrode of the selection thin film transistor is electrically connectable to a sensor output wiring,
  wherein the other one of the source electrode and the drain electrode of the selection thin film transistor is electrically connectable to the other one of the source electrode and the drain electrode of the amplifying thin film transistor, wherein a gate electrode of the selection thin film transistor is electrically connectable to a sensor gate signal line, and wherein the buffer layers consist of non-single crystalline oxide semiconductor including nanocrystal structure.

9. The area sensor according to claim 8,
wherein the reset thin film transistor and the selection thin film transistor are turned on or off according to signals input to the reset gate signal line and the sensor gate signal line.

10. The area sensor according to claim 8,
wherein the buffer layers have higher electrical conductivity than the oxide semiconductor layer.

11. The area sensor according to claim 8,
wherein the oxide semiconductor layer and the buffer layers are formed by a sputtering method using oxygen gas and rare gas, and
wherein a ratio of oxygen gas to rare gas for the oxide semiconductor layer is higher than a ratio of oxygen gas to rare gas for the buffer layers.

12. A display device comprising:
a plurality of pixels, each of the plurality of pixels comprising:
an electrode layer;
a photoelectric conversion element including a photoelectric conversion layer being in contact with the electrode layer, the photoelectric conversion layer including silicon;
an amplifier circuit;
a display element; and
a driver circuit of the display element,
wherein the amplifier circuit and the driver circuit each include a thin film transistor, each thin film transistor comprising:
an oxide semiconductor layer;
buffer layers; and
a source electrode and a drain electrode electrically connected to the oxide semiconductor layer with the buffer layers therebetween,
wherein the oxide semiconductor layer and the buffer layers comprise indium, gallium, and zinc,
wherein a ratio of indium, gallium, and zinc in the oxide semiconductor layer is the same as that in the buffer layers,
wherein the oxide semiconductor layer is richer in oxygen than the buffer layers, and
wherein the buffer layers consist of non-single crystalline oxide semiconductor including nanocrystal structure.

13. The display device according to claim 12,
wherein the display element includes a layer containing a light-emitting substance, and
wherein the layer containing the light-emitting substance is in contact with the electrode layer.

14. The display device according to claim 12,
further comprising a pixel electrode, a counter electrode, and a layer containing liquid crystal between the pixel electrode and the counter electrode.

15. A method for operating the display device according to claim 12 with a laser pointer.

16. The display device according to claim 12,
wherein the buffer layers have higher electrical conductivity than the oxide semiconductor layer.

17. The display device according to claim 12,
wherein the oxide semiconductor layer and the buffer layers are formed by a sputtering method using oxygen gas and rare gas, and wherein a ratio of oxygen gas to rare gas for the oxide semiconductor layer is higher than a ratio of oxygen gas to rare gas for the buffer layers.

18. A display device comprising:
an electrode layer; and
a plurality of pixels, each of the plurality of pixels comprising:
a photoelectric conversion element including a photoelectric conversion layer, the photoelectric conversion layer comprising:
a first semiconductor layer including an impurity element having one conductivity type;
a second semiconductor layer in contact with the first semiconductor layer; and
a third semiconductor layer in contact with the second semiconductor layer and in contact with the electrode layer, wherein the third semiconductor layer includes an impurity element having a conductivity type opposite to the conductivity type of the first semiconductor layer;
an amplifier circuit including at least a selection thin film transistor, an amplifying thin film transistor, and a reset thin film transistor, each thin film transistor comprising:
a first oxide semiconductor layer;
buffer layers; and
a source electrode and a drain electrode electrically connected to the first oxide semiconductor layer with the buffer layers therebetween,
a display element; and
a driver circuit of the display element including at least a switching thin film transistor including a second oxide semiconductor layer,
wherein the first oxide semiconductor layer, the second oxide semiconductor layer and the buffer layers comprise indium, gallium, and zinc,
wherein a ratio of indium, gallium, and zinc in the first oxide semiconductor layer is the same as that in the buffer layers,
wherein the first oxide semiconductor layer and the second oxide semiconductor layer are richer in oxygen than the buffer layers,
wherein a gate electrode of the reset thin film transistor is electrically connectable to a reset gate signal line,
wherein one of the source electrode and the drain electrode of the reset thin film transistor is electrically connectable to a sensor power supply line,
wherein the other one of the source electrode and the drain electrode of the reset thin film transistor is electrically connectable to a gate electrode of the amplifying thin film transistor and one of an anode and a cathode of the photoelectric conversion element,
wherein one of the source electrode and the drain electrode of the amplifying thin film transistor is electrically connectable to the sensor power supply line,
wherein one of the source electrode and the drain electrode of the selection thin film transistor is electrically connectable to a sensor output wiring,
wherein the other one of the source electrode and the drain electrode of the selection thin film transistor is electrically connectable to the other one of the source electrode and the drain electrode of the amplifying thin film transistor, and
wherein a gate electrode of the selection thin film transistor is electrically connectable to a sensor gate signal line, wherein a gate electrode of the switching thin film transistor is electrically connectable to a gate signal line, and wherein one of the source electrode and the drain electrode of the switching thin film transistor is electrically connectable to a source signal line, and wherein the buffer layers consist of non-single crystalline oxide semiconductor including nanocrystal structure.

19. The display device according to claim 18, wherein the display element includes a layer containing a light-emitting substance, and wherein the layer containing the light-emitting substance is in contact with the electrode layer.

20. The display device according to claim 18, further comprising a pixel electrode, a counter electrode, and a layer containing liquid crystal between the pixel electrode and the counter electrode.

21. A method for operating the display device according to claim 18 with a laser pointer.

22. The display device according to claim 18, wherein the buffer layers have higher electrical conductivity than the first oxide semiconductor layer.

23. The display device according to claim 18, wherein the first oxide semiconductor layer and the buffer layers are formed by a sputtering method using oxygen gas and rare gas, and wherein a ratio of oxygen gas to rare gas for the first oxide semiconductor layer is higher than a ratio of oxygen gas to rare gas for the buffer layers.

* * * * *